(12) United States Patent
Yu

(10) Patent No.: US 6,376,312 B1
(45) Date of Patent: Apr. 23, 2002

(54) FORMATION OF NON-VOLATILE MEMORY DEVICE COMPRISED OF AN ARRAY OF VERTICAL FIELD EFFECT TRANSISTOR STRUCTURES

(75) Inventor: Allen S. Yu, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/817,628

(22) Filed: Mar. 26, 2001

(51) Int. Cl.$^7$ ............................................. H01L 21/336
(52) U.S. Cl. ........................................ 438/268; 257/220
(58) Field of Search .................................. 438/268, 269, 438/270, 283, 300; 257/192, 220

(56) References Cited

U.S. PATENT DOCUMENTS 6,033,957 A * 3/2000 Burns, Jr. et al. ............ 438/270

OTHER PUBLICATIONS

Hon–Sum Philip Wong et al., *Nanoscale CMOS*, Proceedings of the IEEE, vol. 87, No. 4, Apr. 1999.

* cited by examiner

Primary Examiner—David Nelms
Assistant Examiner—Quoc Hoang
(74) Attorney, Agent, or Firm—Monica H. Choi

(57) ABSTRACT

For fabrication of a vertical field effect transistor structure for each of an array of flash memory cells for a non-volatile memory device, an opening is etched though top and bottom layers of doped insulating material and a layer of dummy material formed between the bottom and top layers of doped insulating material. The opening is filled with a semiconductor material to form a semiconductor fill. The layer of dummy material is etched away such that a channel region of the semiconductor fill is exposed. A tunnel gate dielectric is formed on the channel region of the vertical field effect transistor. A floating gate electrode material is deposited to abut the tunnel gate dielectric. The tunnel gate dielectric and the floating gate electrode material are disposed on a plurality of planes of the channel region of the vertical field effect transistor. Dopant diffuses from the top and bottom layers of doped insulating material into the semiconductor fill to form drain and source extension junctions. A control gate dielectric material and a control gate electrode material are deposited on any exposed surfaces of the floating gate electrode material. The control gate electrode material is patterned to be continuous for a row of the array of flash memory cells such that the control gate electrode of each vertical field effect transistor of the row of flash memory cells is coupled together to form a word line of the non-volatile memory device. Furthermore, one of the semiconductor fill or a drain or source contact structure below the semiconductor fill is patterned to be continuous for a column of the array of flash memory cells to form a bit line of the non-volatile memory device. Such a vertical field effect transistor structure may occupy a smaller area of the semiconductor substrate such that a compact array of flash memory cells is formed for the non-volatile memory device.

62 Claims, 27 Drawing Sheets

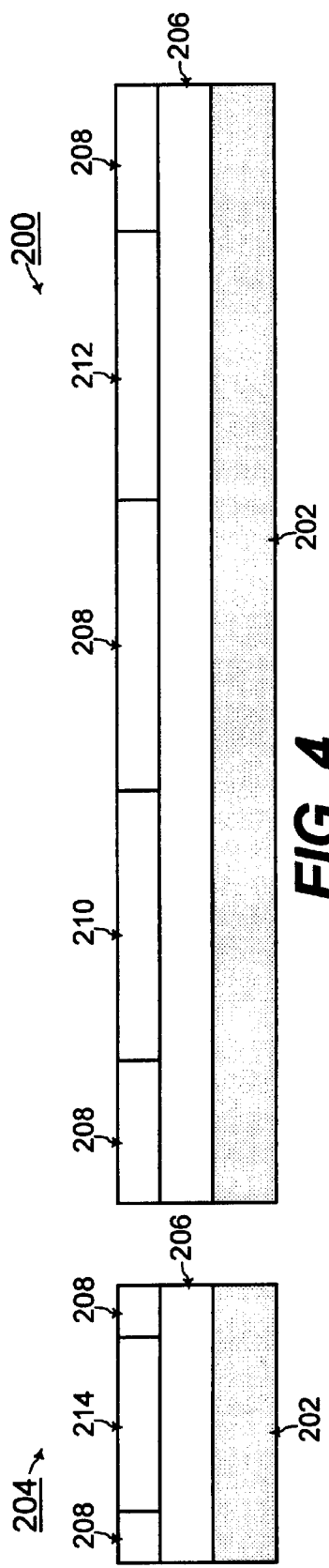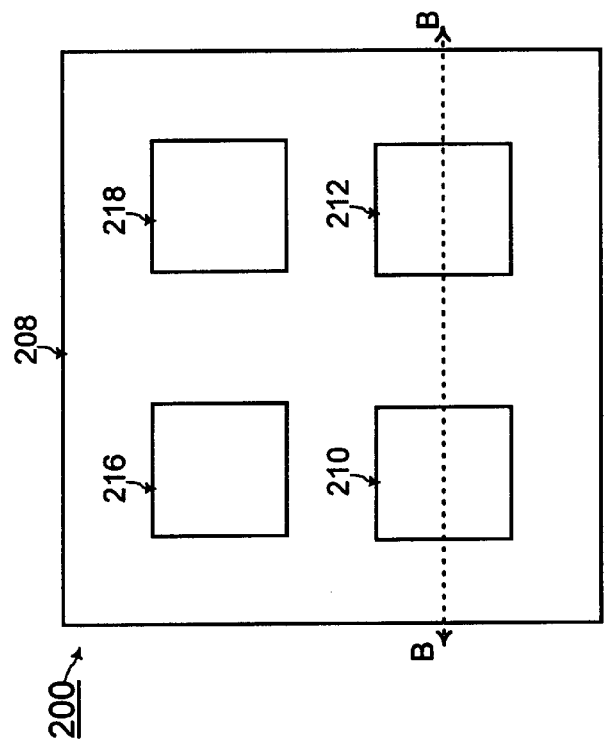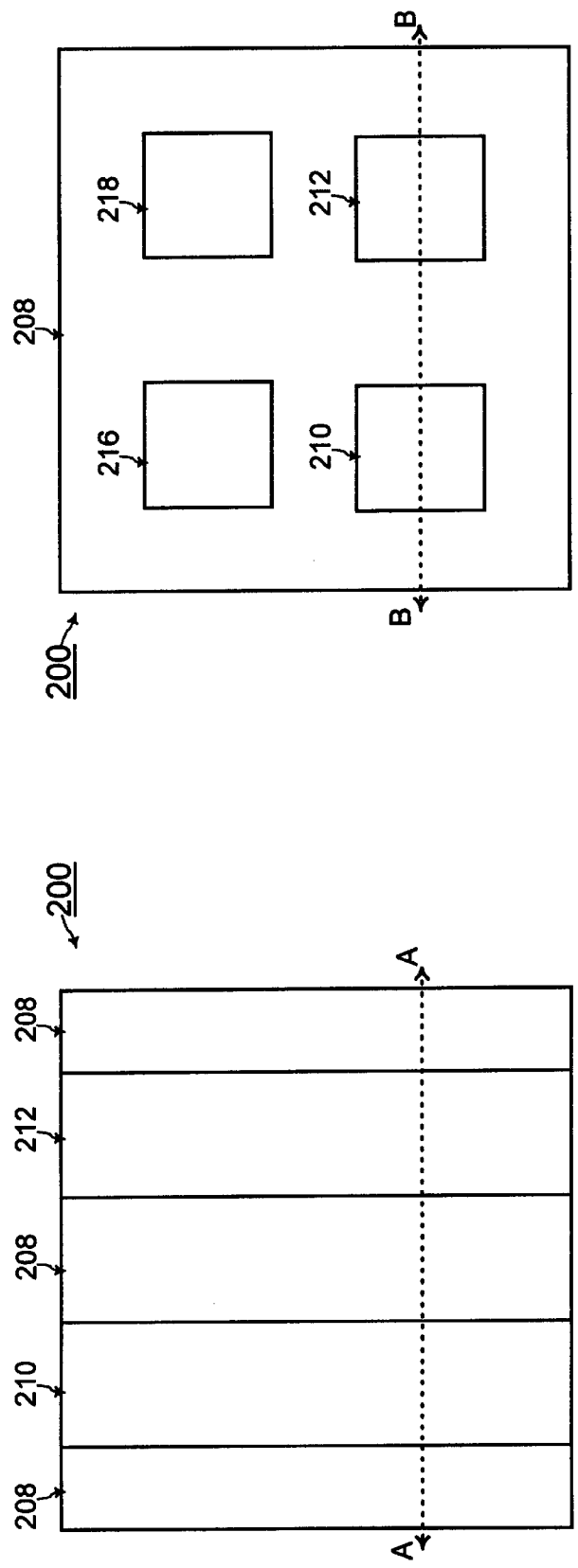

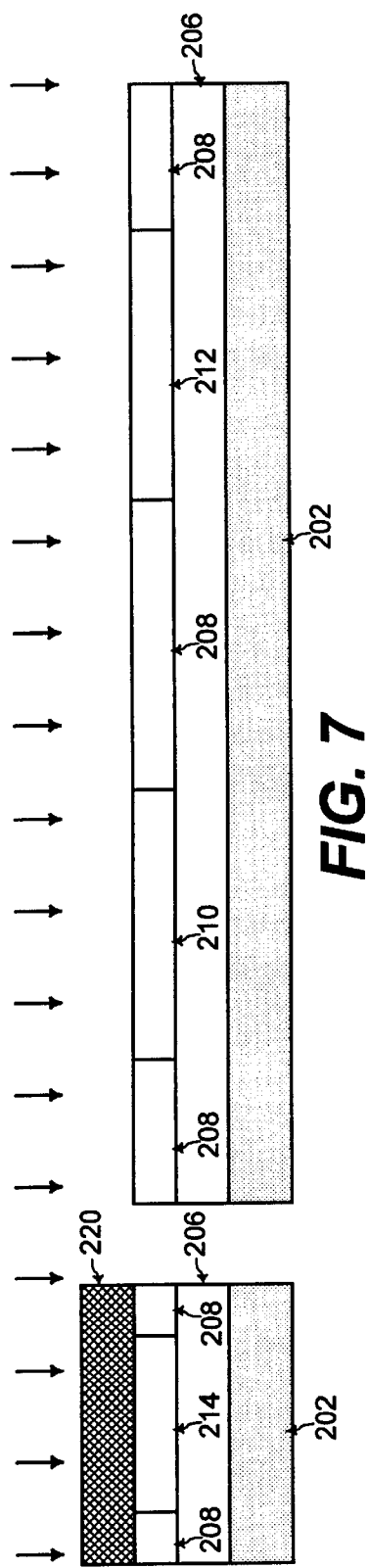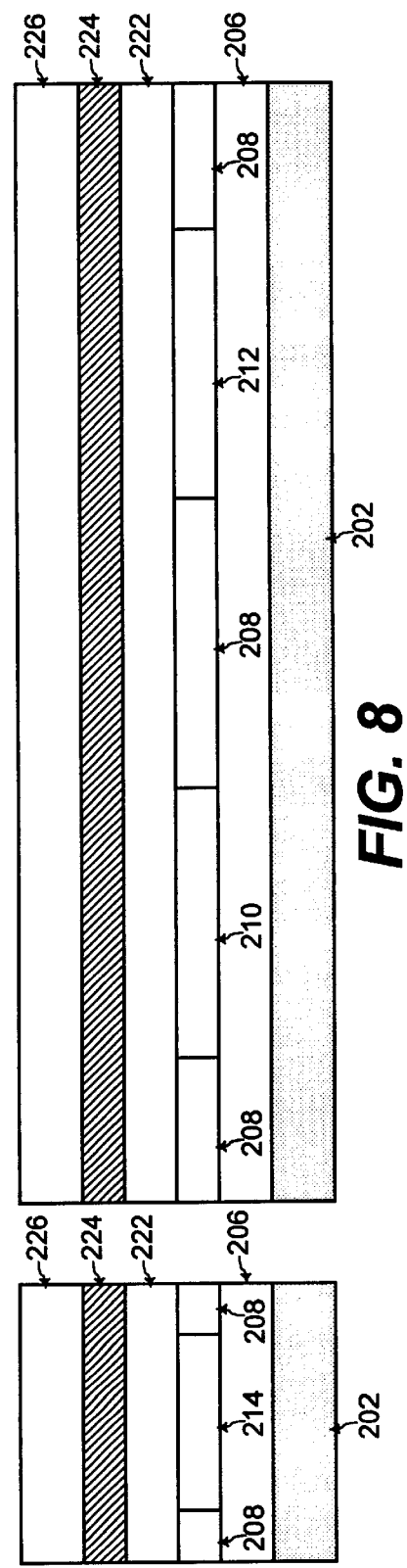

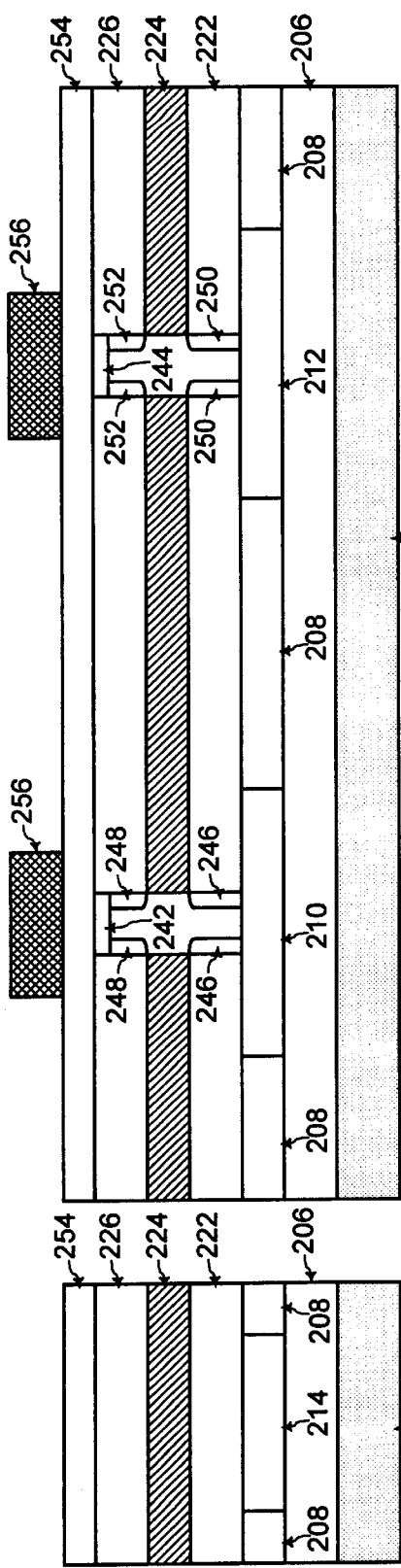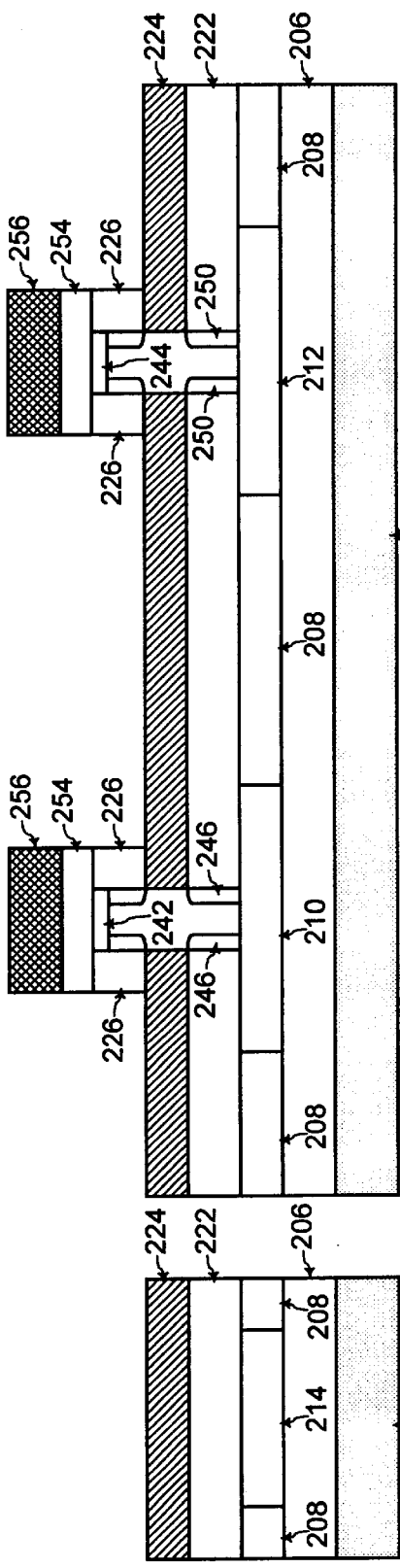

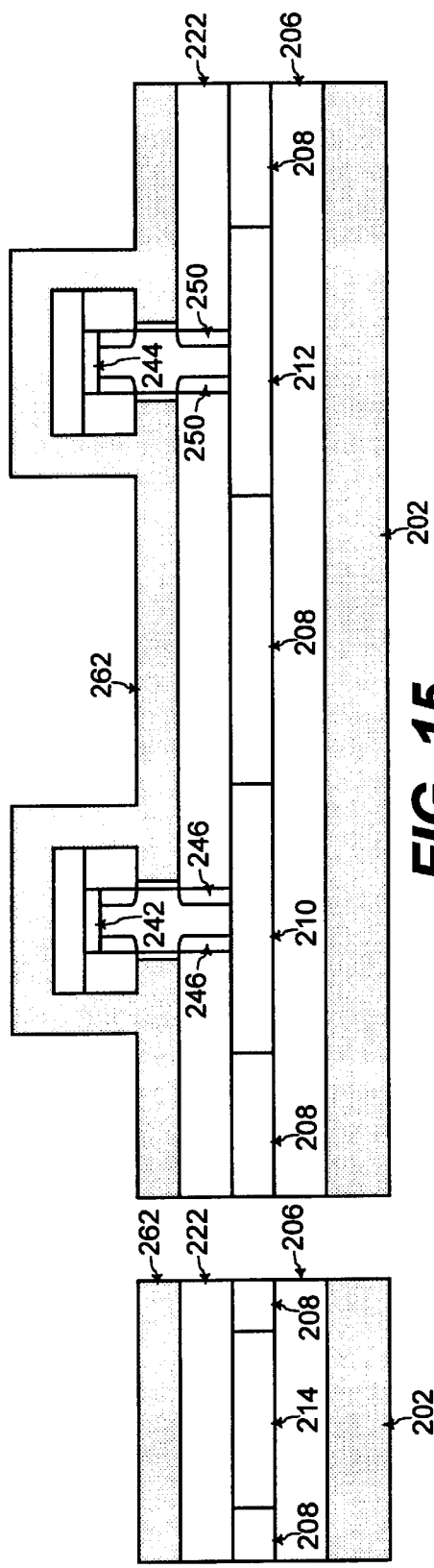
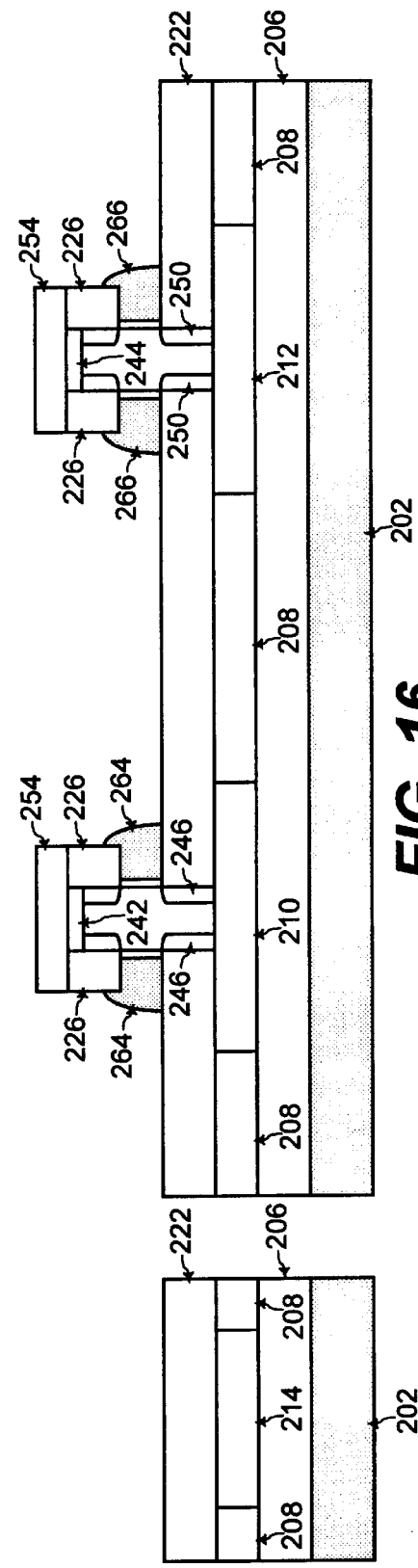

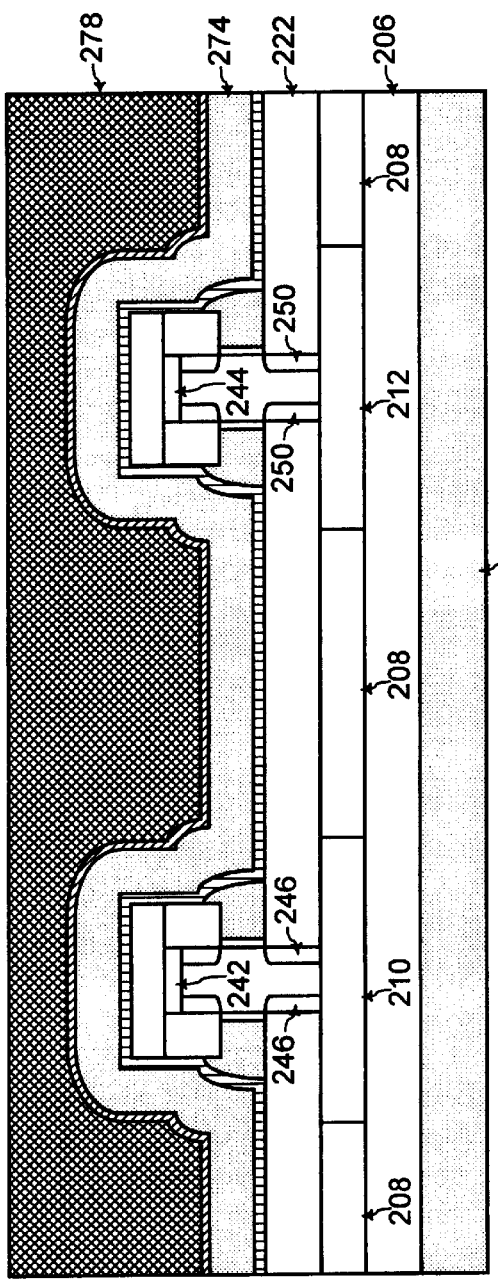
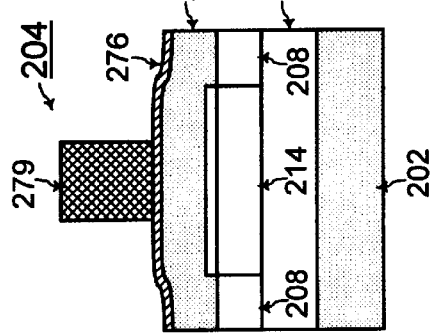
FIG. 21
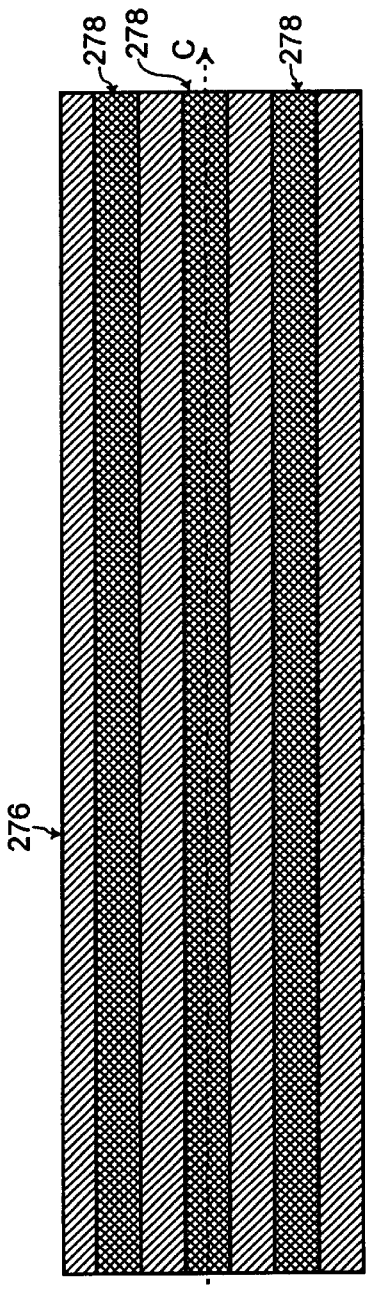
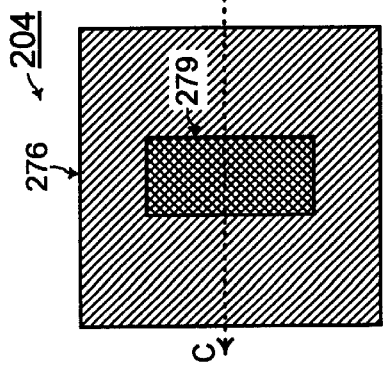
FIG. 22

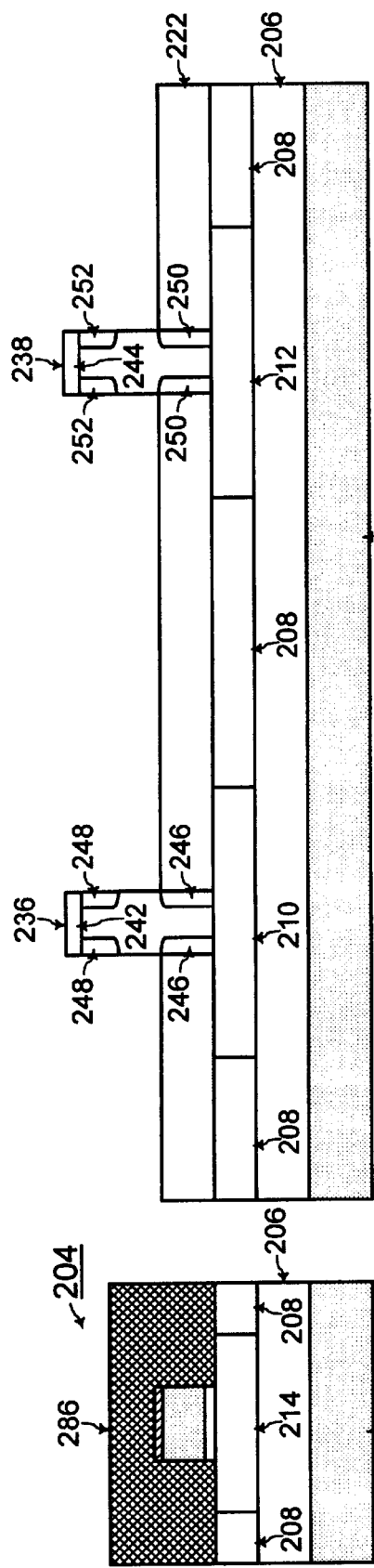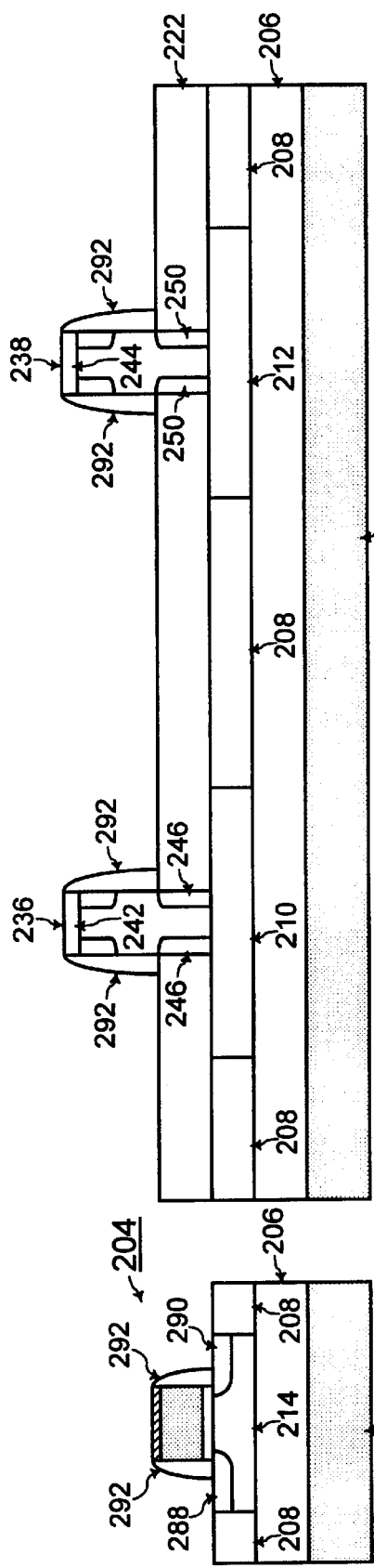
FIG. 29
FIG. 30

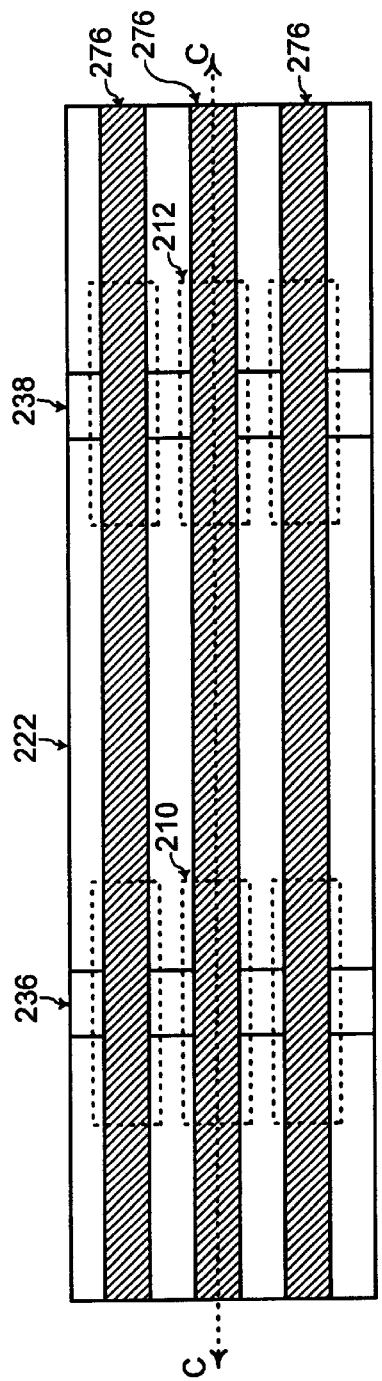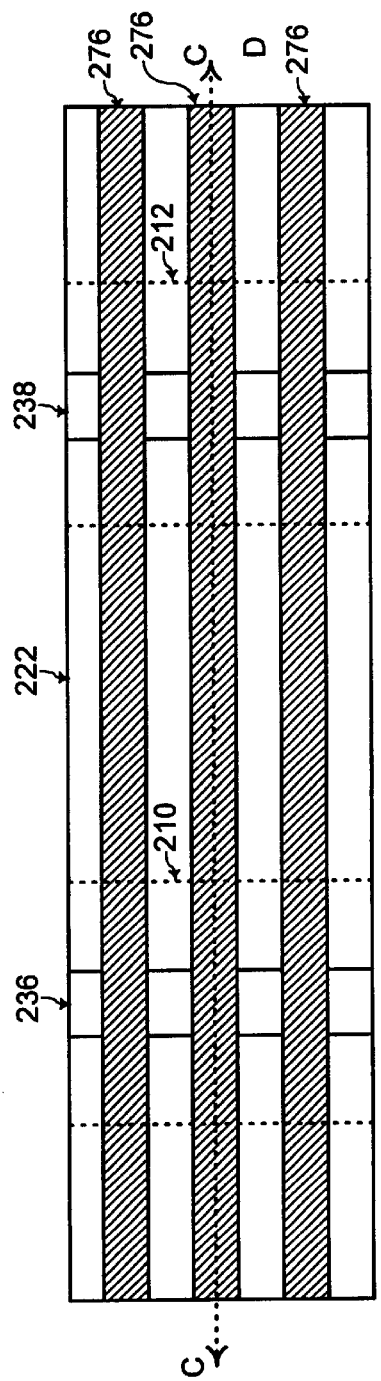

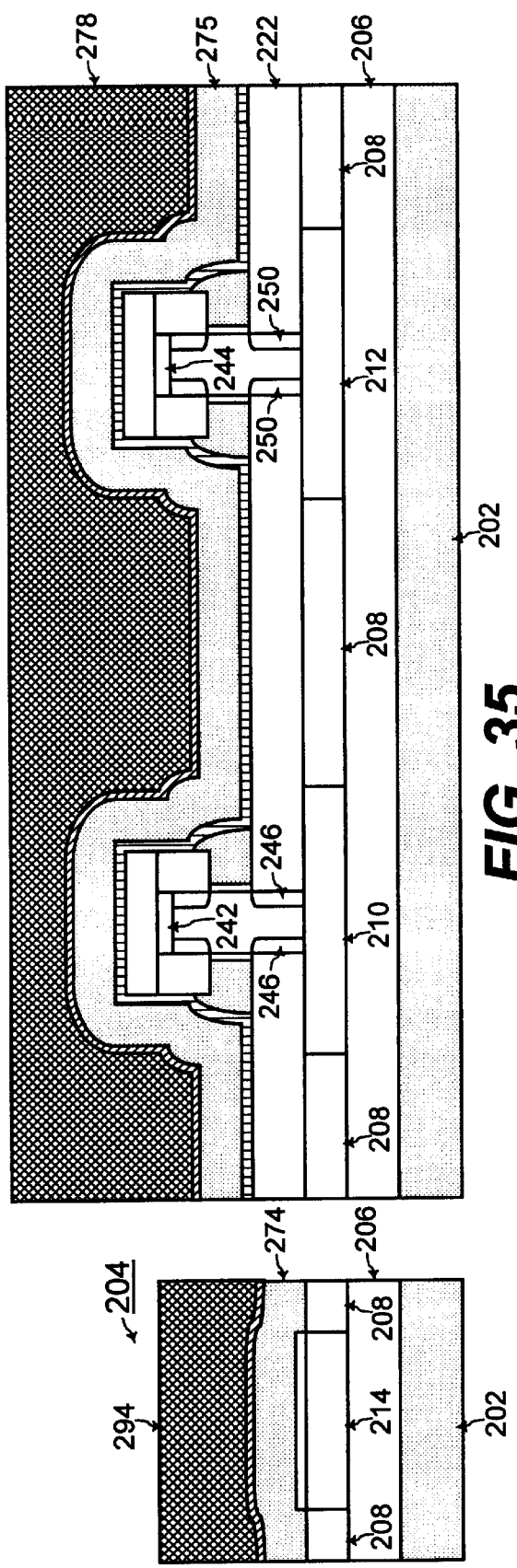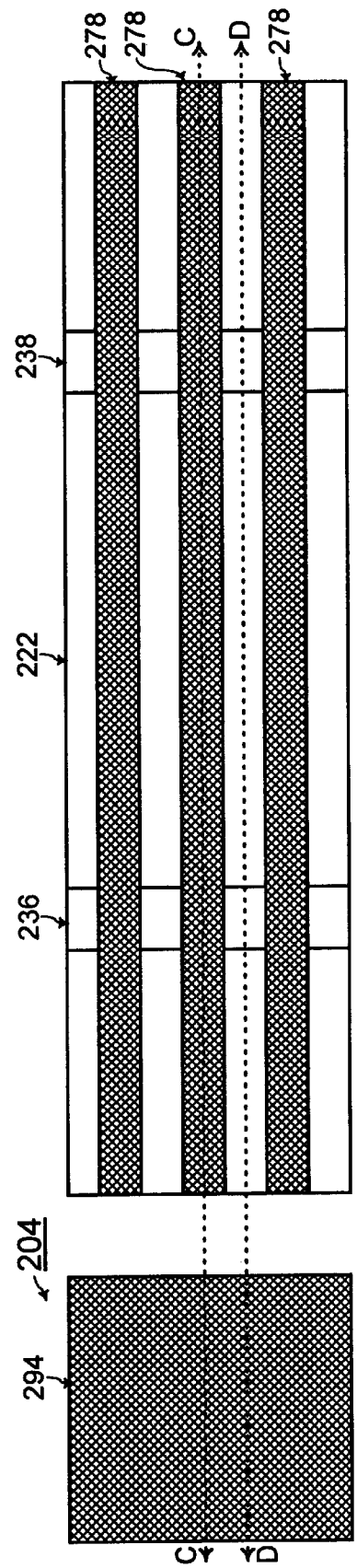
FIG. 35
FIG. 36

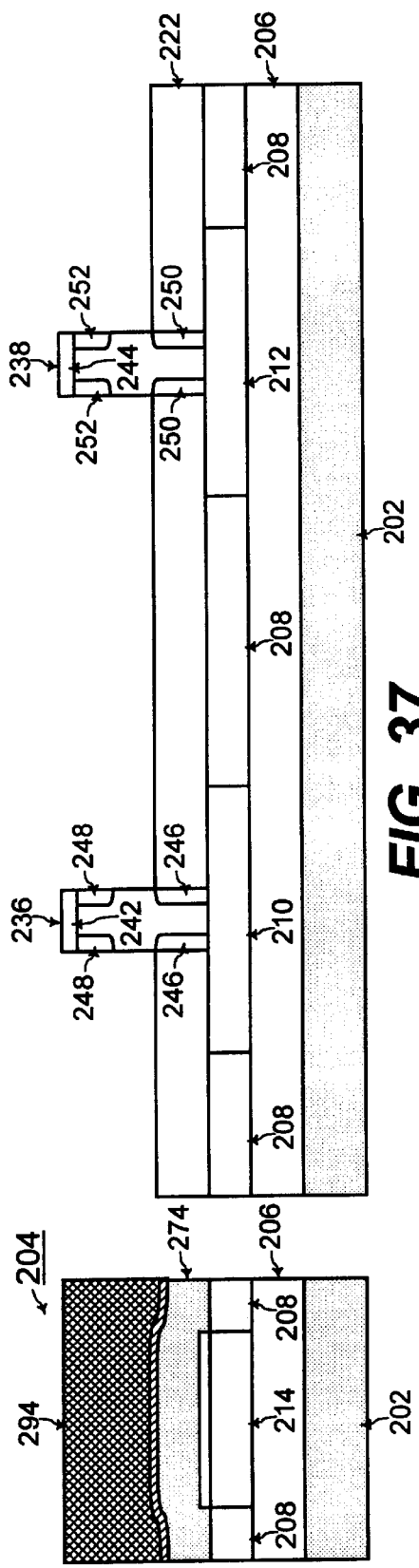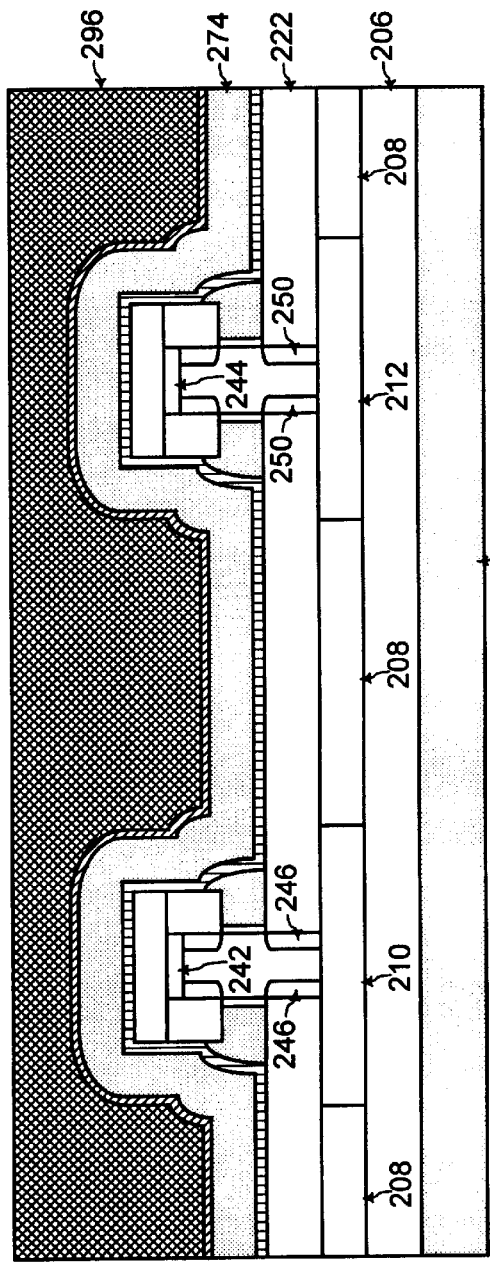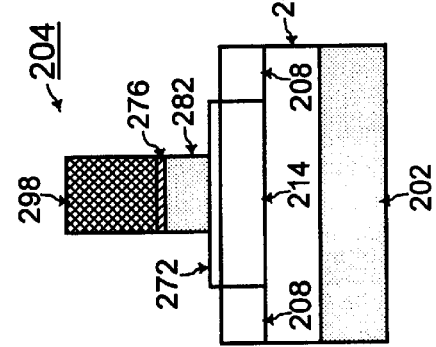
FIG. 37
FIG. 38

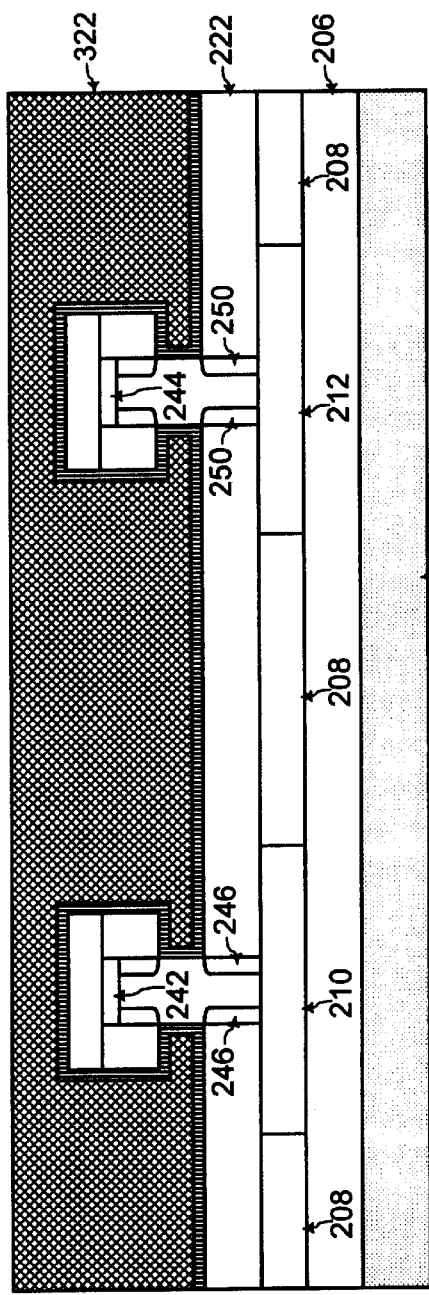
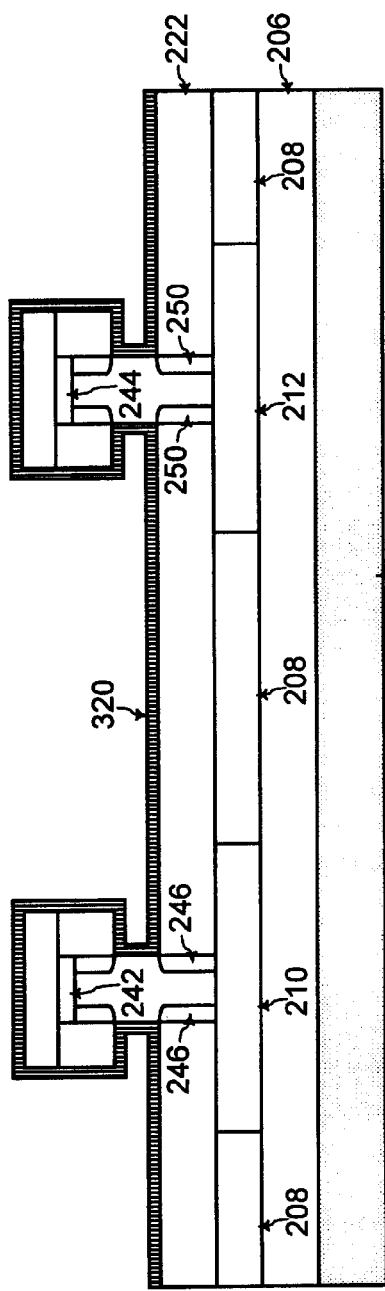
FIG. 43
FIG. 44

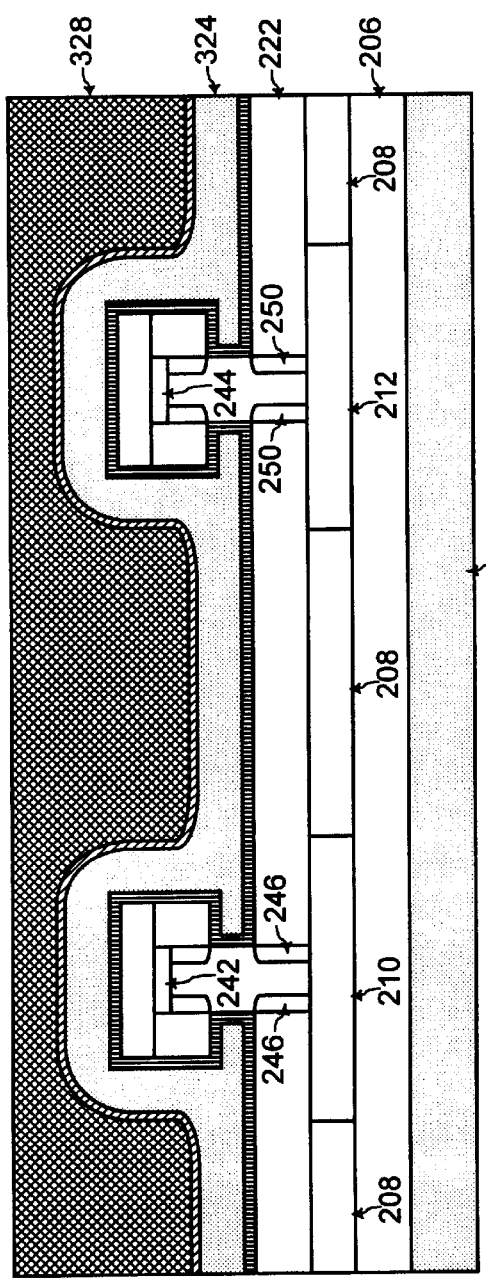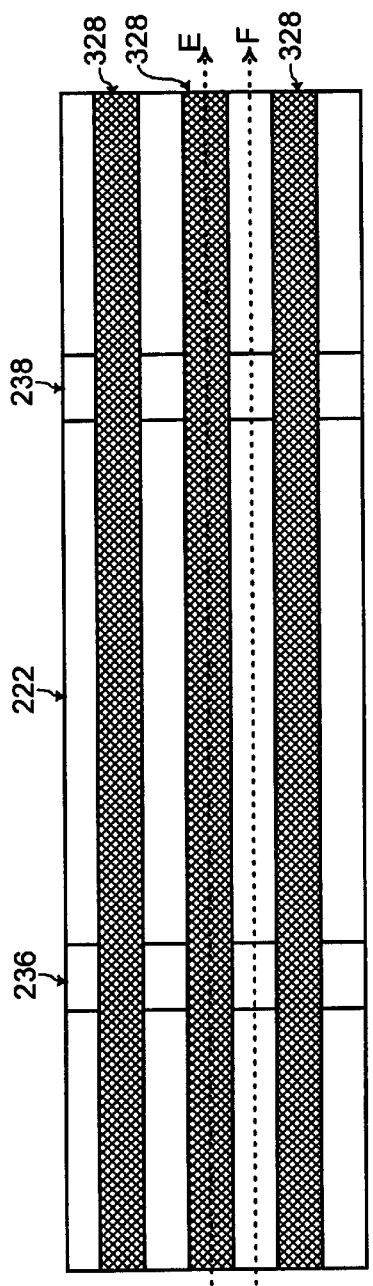
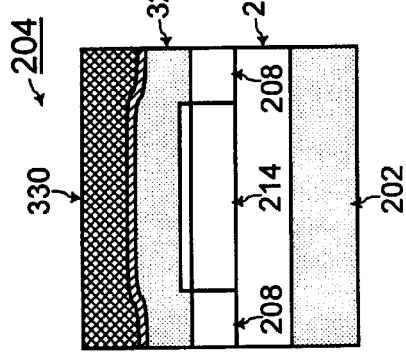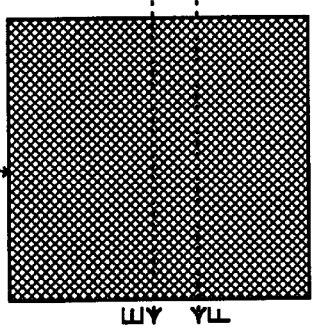
FIG. 47
FIG. 48

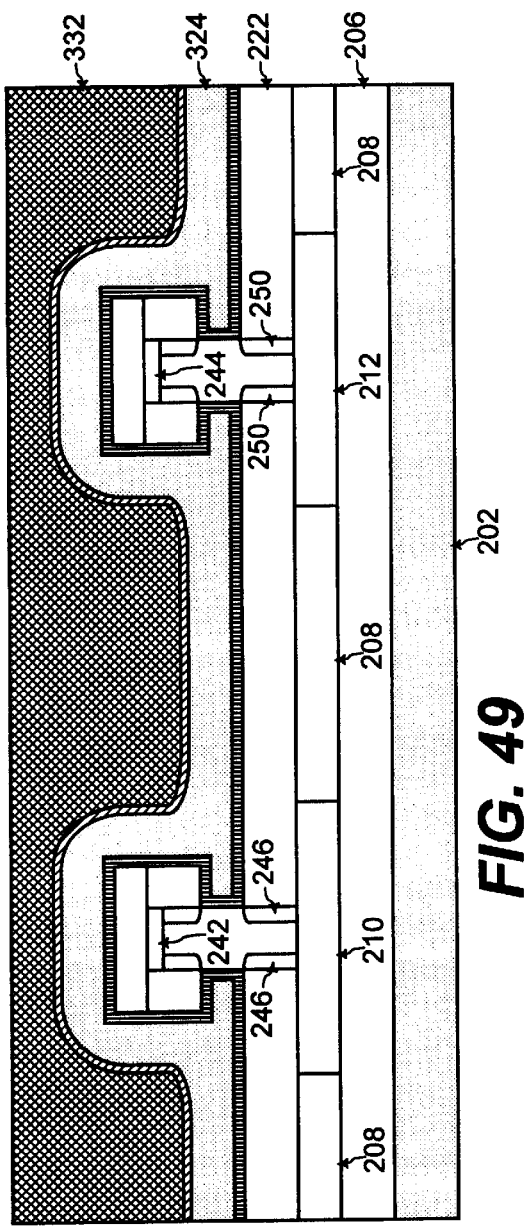
FIG. 49
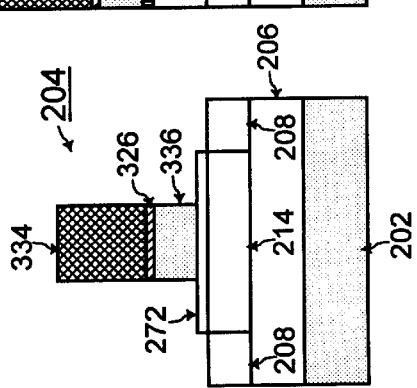
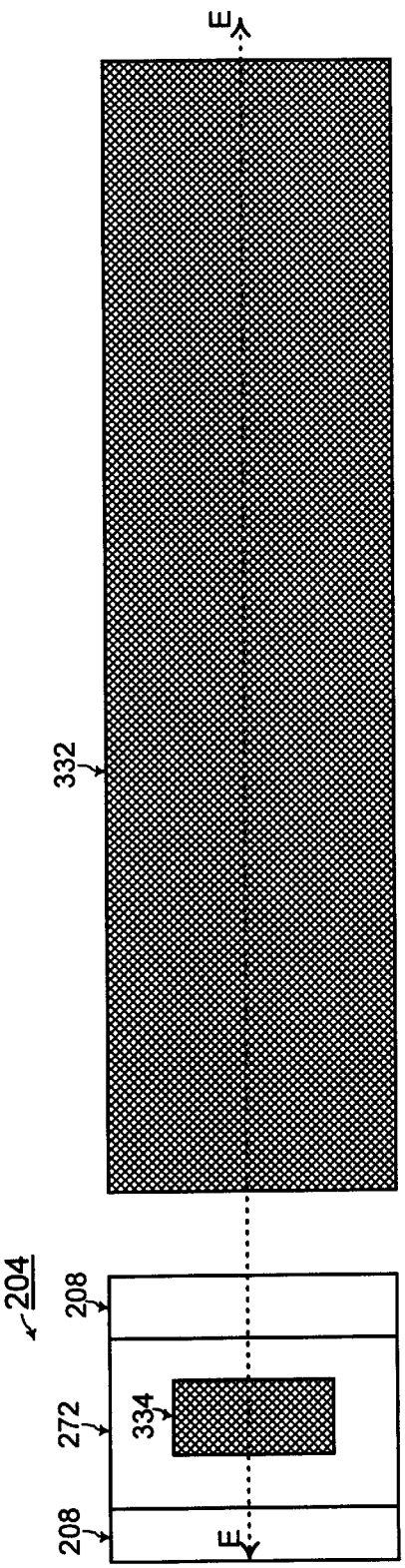
FIG. 50

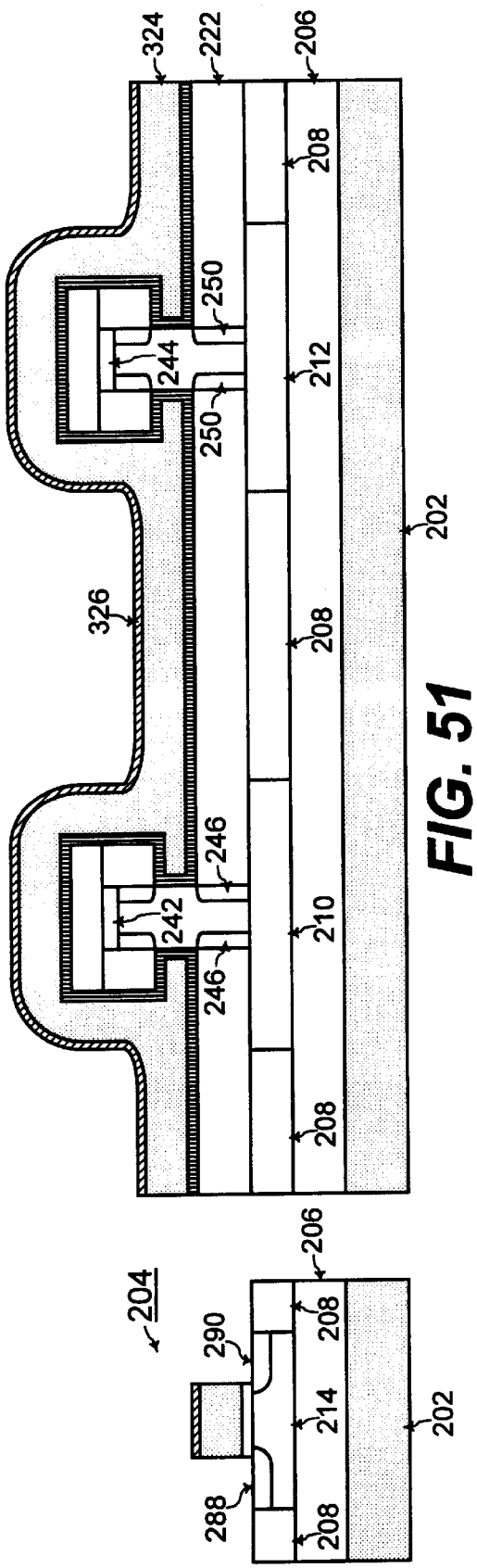
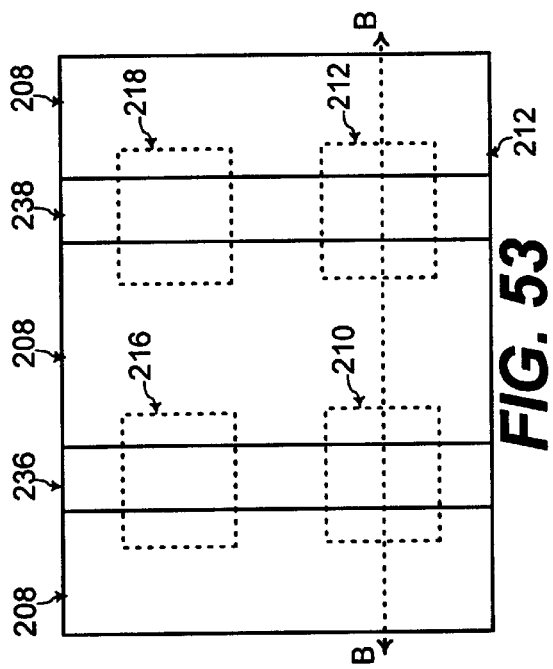
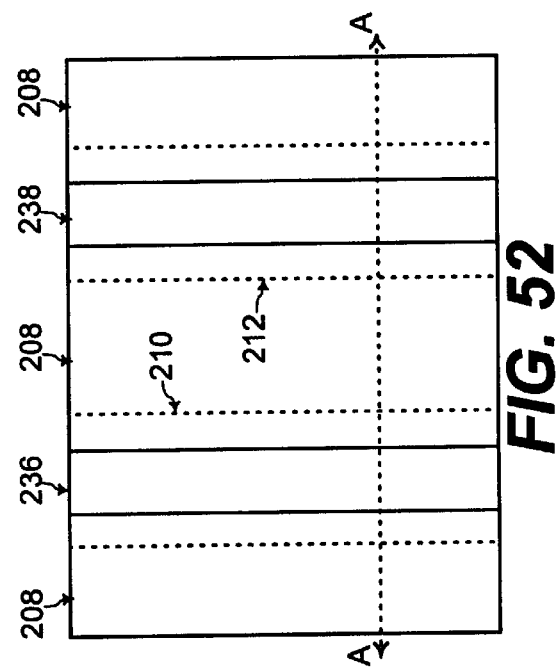
FIG. 51
FIG. 52
FIG. 53

US 6,376,312 B1

FORMATION OF NON-VOLATILE MEMORY DEVICE COMPRISED OF AN ARRAY OF VERTICAL FIELD EFFECT TRANSISTOR STRUCTURES

TECHNICAL FIELD

This invention relates generally to non-volatile memory devices, and more particularly to a non-volatile memory device comprised of an array of vertical field effect transistor structures as flash memory cells with each vertical field effect transistor fabricated by growing a semiconductor material within an opening formed through doped insulating materials for defining the drain and source extension junctions of the vertical field effect transistor and through a layer of dummy material deposited between the doped insulating materials for defining the channel region of the vertical field effect transistor.

BACKGROUND OF THE INVENTION

A non-volatile memory device is comprised of an array of flash memory cells with each flash memory cell storing 1-bit of digital information, as known to one of ordinary skill in the art of electronics. Referring to FIG. 1, a flash memory cell 100 of a prior art non-volatile memory device includes a tunnel gate dielectric 102 comprised of silicon dioxide (SiO$_2$) for example as known to one of ordinary skill in the art of integrated circuit fabrication. The tunnel gate dielectric 102 is disposed on a semiconductor substrate 103. In addition, a floating gate electrode 104, comprised of a conductive material such as polysilicon for example, is disposed over the tunnel gate dielectric 102. A control gate dielectric 106, comprised of silicon dioxide (SiO$_2$) for example as known to one of ordinary skill in the art of integrated circuit fabrication, is disposed over the floating gate electrode 104. A control gate electrode 108, comprised of a conductive material such as polysilicon for example, is disposed over the control gate dielectric 106.

A drain junction 110 that is doped with a junction dopant, such as arsenic (As) or phosphorous (P) for example, is formed within an active device area 112 of the semiconductor substrate 103 toward a left sidewall of the floating gate electrode 104 in FIG. 1. A source junction 114 that is doped with the junction dopant is formed within the active device area 112 of the semiconductor substrate 106 toward a right sidewall of the floating gate electrode 104 of FIG. 1. The active device area 112 of the semiconductor substrate 103 is defined by shallow trench isolation structures 116 that electrically isolate the flash memory cell 100 from other integrated circuit devices within the semiconductor substrate 103.

During the program or erase operations of the flash memory cell 100 of FIG. 1, charge carriers are injected into or injected out of the floating gate electrode 104 through the tunnel gate dielectric 102. Such variation of the amount of charge carriers within the floating gate electrode 104 alters the threshold voltage of the flash memory cell 100, as known to one of ordinary skill in the art of electronics. For example, when electrons are the charge carriers that are injected into the floating gate electrode 104, the threshold voltage increases. Alternatively, when electrons are the charge carriers that are injected out of the floating gate electrode 104, the threshold voltage decreases. These two conditions are used as the two states for storing digital information within the flash memory cell 100, as known to one of ordinary skill in the art of electronics.

During programming of the flash memory cell 100 for example, a voltage of +9 Volts is applied on the control gate electrode 108, a voltage of +5 Volts is applied on the drain junction 110, and a voltage of 0 Volts (or a small bias of 0.25 Volts for example) is applied on the source junction 114 and on the semiconductor substrate 103. Alternatively, during erasing of the flash memory cell 100, referring to FIG. 2, a voltage of −9.5 Volts is applied on the control gate electrode 108, a voltage of 0 Volts is applied on the drain junction 110, and a voltage of +4.5 Volts is applied on the source junction 114 and on the semiconductor substrate 103. Elements having the same reference number in FIGS. 1 and 2 refer to elements having similar structure and function.

Referring to FIG. 3, an alternative flash memory cell 150 is comprised of a charge storing gate dielectric stack 120 between the control gate electrode 108 and the semiconductor substrate 103. Elements having the same reference number in FIGS. 1, 2, and 3 refer to elements having similar structure and function. The charge storing gate dielectric stack 120 is comprised of a tunnel gate dielectric 120 formed on the semiconductor substrate 103, a charge storing dielectric 122 formed on the tunnel gate dielectric 120, and a control gate dielectric 124 formed on the charge storing dielectric 122.

In one example of the charge storing gate dielectric stack 120, the tunnel gate dielectric 120 is comprise of silicon dioxide (SiO$_2$) having a thickness of about 100 angstroms, the charge storing dielectric 122 is comprised of silicon nitride (Si$_3$N$_4$) having a thickness of about 85 angstroms, and the control gate dielectric 124 is comprised of silicon dioxide (SiO$_2$) having a thickness of about 100 angstroms, formed in an ONO (oxide-nitride-oxide) deposition process as known to one of ordinary skill in the art of integrated circuit fabrication. During the program or erase operations of the flash memory cell 150 of FIG. 3, charge carriers are injected into or injected out of the charge storing dielectric 122 through the tunnel gate dielectric 120. Such variation of the amount of charge carriers within the charge storing dielectric 122 alters the threshold voltage of the flash memory cell 150, as known to one of ordinary skill in the art of electronics.

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

In the flash memory cell 100 or 150 of FIGS. 1, 2, and 3, as the dimensions including the length of the channel region between the drain 110 and the source 114 of the flash memory cell 100 or 150 are further scaled down to tens of nanometers, short-channel effects degrade the performance of the flash memory cell 100 or 150. Short-channel effects that result due to the short length of the channel region between the drain junction 104 and the source junction 106 of the flash memory cell 100 or 150 are known to one of ordinary skill in the art of integrated circuit fabrication. The electrical characteristics of the flash memory cell 100 or 150 become difficult to control with short-channel effects which may severely degrade the performance of the flash memory cell 100 or 150.

In the conventional planar flash memory cell 100 or 150 of FIGS. 1, 2 and 3, the gate stack (comprised of the tunnel gate dielectric 102, the floating gate electrode 104, the control gate dielectric 106, and the control gate electrode 108 for the flash memory cell 100, or comprised of the charge storing gate dielectric stack 120, 122, and 124 and the control gate electrode 108 for the flash memory cell 150) is disposed over one plane of the channel region between the drain and source junctions 110 and 114. However, as the dimensions of the flash memory cell 100 or 150 are further scaled down to tens of nanometers, control of charge accumulation within the channel region of the flash memory cell 100 or 150 from a plurality of planes of the channel region is desired to minimize short channel effects.

SUMMARY OF THE INVENTION

Accordingly, the present invention is directed to fabrication of an array of flash memory cells for a non-volatile memory device with each flash memory cell of the array being comprised of a vertical field effect transistor structure having a gate stack formed at each of a plurality of planes of the channel region of the vertical field effect transistor to minimize undesired short channel effects.

In a general aspect of the present invention, for fabricating each vertical field effect transistor as a flash memory cell of the non-volatile memory device, a first drain or source contact structure comprised of a semiconductor material is formed to be surrounded by shallow trench isolation structures. The first drain or source contact structure is doped with a first dopant. A bottom layer of doped insulating material is deposited on the first drain or source contact structure, and the bottom layer of doped insulating material is doped with a second dopant. A layer of dummy material is deposited on the bottom layer of doped insulating material. A top layer of doped insulating material is deposited on the layer of dummy material, and the top layer of doped insulating material is doped with a third dopant.

An opening is etched through the top layer of doped insulating material, the layer of dummy material, and the bottom layer of doped insulating material. The opening is disposed over the first drain or source contact structure such that the opening has a bottom wall of the semiconductor material of the first drain or source contact structure. The opening is filled with a semiconductor material to form a semiconductor fill contained within the opening. The semiconductor fill has at least one side wall with a top portion of the at least one sidewall abutting the top layer of doped insulating material, and with a middle portion of the at least one sidewall abutting the layer of dummy material, and with a bottom portion of the at least one sidewall abutting the bottom layer of doped insulating material.

A fourth dopant is implanted into a top surface of the semiconductor fill to form a second drain or source contact junction of the vertical field effect transistor. The layer of dummy material is etched away such that the middle portion of the at least one sidewall of the semiconductor fill is exposed. A gate electrode opening disposed between the top and bottom layers of doped insulating material is formed when the layer of dummy material is etched away. A tunnel gate dielectric of the vertical field effect transistor is formed on the exposed middle portion of the at least one side wall of the semiconductor fill. The middle portion of the semiconductor fill abutting the tunnel gate dielectric forms a channel region of the vertical field effect transistor.

The gate electrode opening between the top and bottom layers of doped insulating material is filled with a floating gate electrode material, and the floating gate electrode material abuts the tunnel gate dielectric to form a floating gate electrode of the vertical field effect transistor. The tunnel gate dielectric and the floating gate electrode formed at the at least one side wall of the semiconductor fill are disposed on a plurality of planes of the channel region of the vertical field effect transistor. A thermal anneal is performed such that the second dopant diffuses from the bottom layer of doped insulating material into the bottom portion of the semiconductor fill to form a first drain or source extension junction of the vertical field effect transistor, and such that the third dopant diffuses from the top layer of doped insulating material into the top portion of the semiconductor fill to form a second drain or source extension junction of the vertical field effect transistor.

A control gate dielectric material is deposited on any exposed surfaces of the floating gate electrode of the vertical field effect transistor to form a control gate dielectric on the floating gate electrode. In addition, a control gate electrode material is deposited on the control gate dielectric material to form a control gate electrode on the control gate dielectric. The control gate electrode material is patterned to be continuous for a row of the array of flash memory cells such that the control gate electrode of each vertical field effect transistor of the row of flash memory cells is coupled together to form a word line of the non-volatile memory device.

Furthermore, the semiconductor fill is patterned to be continuous for a column of the array of flash memory cells such that the second drain or source contact junction of each vertical field effect transistor of the column of flash memory cells is coupled together to form a bit line of the non-volatile memory device when the first drain or source contact structure of each vertical field effect transistor of the column of flash memory cells is electrically isolated. Alternatively, the first drain or source contact structure is patterned to be continuous for a column of flash memory cells such that the first drain or source contact structure of each vertical field effect transistor of the column of flash memory cells is coupled together to form a bit line of the non-volatile memory device when the second drain or source contact junction of the semiconductor fill of each vertical field effect transistor of the column of flash memory cells is electrically isolated.

In one embodiment of the present invention, the bottom and top layers of the doped insulating material are comprised of PSG (phospho-silicate glass) such that the second and third dopants are comprised of phosphorous for formation of a vertical NMOSFET (N-channel Metal Oxide Semiconductor Field Effect Transistor) for each flash memory cell. In an alternative embodiment of the present invention, the bottom and top layers of the doped insulating material are comprised of BSG (boro-silicate glass) such that the second and third dopants are comprised of boron for formation of a vertical PMOSFET (P-channel Metal Oxide Semiconductor Field Effect Transistor) for each flash memory cell.

In another embodiment of the present invention, the vertical field effect transistor for each flash memory cell is formed with a charge storing gate dielectric stack on the exposed middle portion of the at least one sidewall of the semiconductor fill and with the control gate electrode material on the charge storing gate dielectric stack. In that case the floating gate electrode is not formed.

In a further embodiment of the present invention, a logic field effect transistor is fabricated on a peripheral region of the semiconductor substrate simultaneously with fabrication of the vertical field effect transistor for each flash memory cell of the non-volatile memory device. The gate electrode of the logic field effect transistor in the peripheral region is formed from the control gate electrode material comprising the control gate electrode of the vertical field effect transistor for the flash memory cell.

In this manner, a vertical field effect transistor structure is formed for each flash memory cell of the non-volatile memory device to have a tunnel gate dielectric and a floating gate electrode on each of a plurality of planes of the channel region formed within the semiconductor fill for better control of charge accumulation within the channel region such that undesired short channel effects are minimized. In addition, with application of bias voltage on the control gate electrode at each of a plurality of planes of the channel region, higher drive current is achieved for enhanced speed performance of the vertical field effect transistor. Furthermore, the length of the channel region is determined by the thickness of the layer of dummy material deposited between the top and bottom layers of doped insulating material. Thus, the length of the channel region of the vertical field effect transistor may be scaled down beyond those possible from photolithography limitations. Additionally, because the drain, source, and the channel region extends upward from the semiconductor substrate for the vertical field effect transistor, such a vertical field effect transistor may occupy a smaller area of the semiconductor substrate such that a compact array of flash memory cells is formed for the non-volatile memory device.

These and other features and advantages of the present invention will be better understood by considering the following detailed description of the invention which is presented with the attached drawings.

BRIEF DESCRIPTION OF THE DRAWINGS

FIGS. 4, 5, 6, 7, 8, 9, 10, 11, 12, 13, 14, 15, 16, 17, 18, 19, 20, 21, 22, 23, 24, 25, 26, 27, 28, 29, and 30 show cross sectional views and top views for fabricating a non-volatile memory device having an array of flash memory cells with each flash memory cell having a vertical MOSFET (metal oxide semiconductor field effect transistor) structure fabricated by forming a semiconductor fill within an opening formed through layers of doped insulating material and a layer of dummy material such that a tunnel gate dielectric and a floating gate electrode are formed at each of a plurality of planes of the channel region, to minimize undesired short channel effects according to an embodiment of the present invention;

FIG. 31 shows a top view of the array of flash memory cells of the non-volatile memory device with the first drain or source contact structure of a column of the array of flash memory cells being electrically isolated, according to an embodiment of the present invention;

FIG. 32 shows a top view of the array of flash memory cells of the non-volatile memory device with the first drain or source contact structure of a column of the array of flash memory cells being coupled together, according to another embodiment of the present invention;

FIGS. 35, 36, 37, 38, and 39 show top views and cross sectional views for patterning a gate dielectric and a gate electrode of a logic field effect transistor in a peripheral region after patterning the word lines of the array of flash memory cells of the non-volatile memory device, according to an alternative embodiment of the present invention;

FIGS. 42, 43, 44, 45, 46, 47, 48, 49, 50, and 51 show cross sectional views and top views for fabricating each vertical MOSFET of the flash memory cell to have a charge storing gate dielectric stack and a control gate electrode at each of a plurality of planes of the channel region, without the floating gate electrode, according to another embodiment of the present invention;

FIG. 52 shows a top view of the array of flash memory cells of the non-volatile memory device with the first drain or source contact structure of a column of the array of flash memory cells being continuous and with the semiconductor fill for a column of the array of flash memory cells being continuous, according to an embodiment of the present invention;

FIG. 53 shows a top view of the array of flash memory cells of the non-volatile memory device with the first drain or source contact structure of a column of the array of flash memory cells being electrically isolated and with the semiconductor fill for a column of the array of flash memory cells being continuous, according to another embodiment of the present invention;

Figure 1:
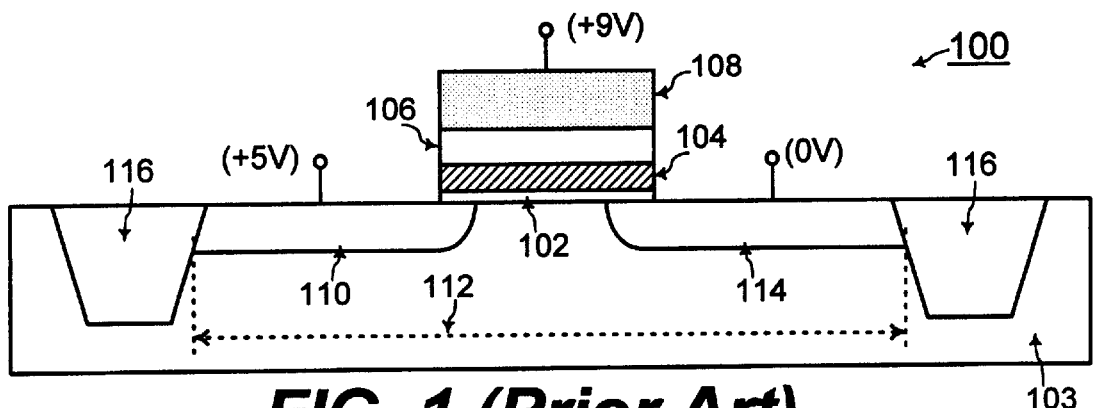
FIG. 1 shows a cross-sectional view of a flash memory cell comprising a conventional planar MOSFET (metal oxide semiconductor field effect transistor) structure according to the prior art, with voltage biases during programming of the flash memory cell.
Figure 2:
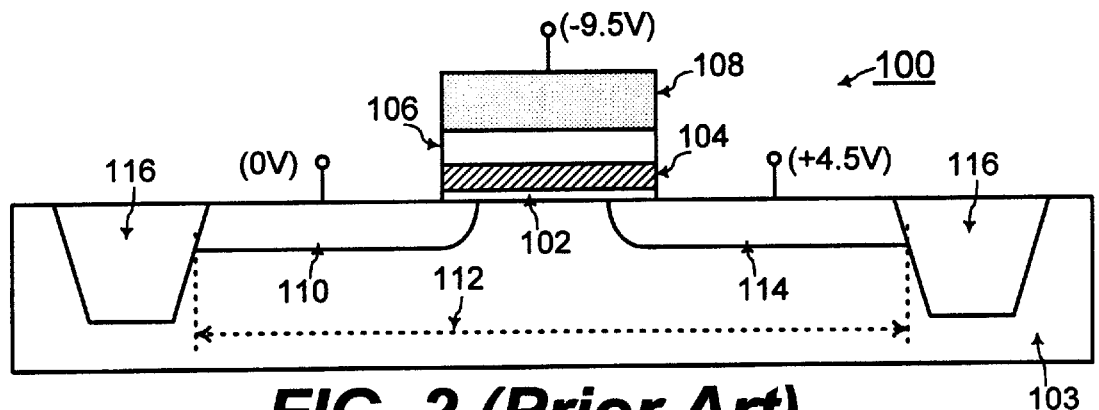
FIG. 2 shows alternative voltage biases on the flash memory cell of FIG. 1 during erasing of the flash memory cell of the prior art.

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, and 57 refer to elements having similar structure and function.

DETAILED DESCRIPTION

Example embodiments of the present invention are illustrated and described for forming a vertical MOSFET (metal oxide semiconductor field effect transistor) structure for each flash memory cell of a non-volatile memory device on an active device area of a semiconductor film formed on a buried insulating layer in SOI (semiconductor on insulator) technology. However, the present invention may also be applied for forming a vertical MOSFET structure for each flash memory cell of a non-volatile memory device within an active device area of a bulk semiconductor substrate, as would be apparent to one of ordinary skill in the art of integrated circuit fabrication from the description herein.

Referring to FIG. 4, a non-volatile memory device 200 is formed to be comprised of an array of flash memory cells with each flash memory cell having a vertical MOSFET (metal oxide semiconductor field effect transistor) structure. Referring to FIG. 4, a cross sectional view of two such vertical MOSFETs for a row of flash memory cells is illustrated. A non-volatile memory device typically has more numerous flash memory cells in a row of the array of flash memory cells. However, fabrication of two vertical MOSFETs for two flash memory cells in a row of the array of flash memory cells is illustrated for clarity of illustration.

Referring to FIG. 4, the vertical MOSFETs as the flash memory cells are fabricated on a semiconductor film deposited on an buried insulating layer 206. The buried insulating layer 206 is comprised of an insulating material such as silicon dioxide (SiO₂) for example deposited on a semiconductor substrate 202 which is comprised of silicon according to one embodiment of the present invention in SOI (semiconductor on insulator) technology. Processes for formation of such semiconductor film on the buried insulating layer 206 in SOI (semiconductor on insulator) technology are known to one of ordinary skill in the art of integrated circuit fabrication.

For fabricating an array of flash memory cells for a non-volatile memory device, a first drain or source contact structure 210 of a first vertical MOSFET is formed from a first active device area of the semiconductor film formed on the buried insulating layer 206. A first drain or source contact structure 212 of a second vertical MOSFET is formed from a second active device area of the semiconductor film formed on the buried insulating layer 206. The array of flash memory cells of the non-volatile memory device 200 is formed on a core region of the semiconductor substrate 202. The semiconductor film forming the first drain or source contact structures 210 and 212 of the first and second vertical MOSFETs is comprised of one of silicon or silicon doped with germanium as known to one of ordinary skill in the art of integrated circuit fabrication, according to one embodiment of the present invention.

In addition to the array of memory cells of the non-volatile memory device 200, a logic circuit for controlling the non-volatile memory device is formed on a peripheral region of the semiconductor substrate 202. Fabrication of an example logic MOSFET 204 of such a logic circuit of the peripheral region during fabrication of the non-volatile memory device 200 is also illustrated in FIG. 4. Referring to FIG. 4, the logic MOSFET is fabricated within a third active device area 214 of the semiconductor film formed on the buried insulating layer 206.

The first drain or source contact structures 210 and 212 of the first and second vertical MOSFETs and the third active device area 214 for the logic MOSFET 204 are electrically isolated by shallow trench isolation structures 208 formed on the buried insulating layer 206. The shallow trench isolation structures 208 are comprised of a dielectric material for electrically isolating the first drain or source contact structures 210 and 212 of the first and second vertical MOSFETs and the third active device area 214 for the logic MOSFET 204. Processes for formation of such shallow trench isolation structures 208 are known to one of ordinary skill in the art of integrated circuit fabrication.

Referring to FIG. 5, a top view is shown for the first drain or source contact structures 210 and 212 of the first and second vertical MOSFETs. Referring to FIG. 5, the first drain and source contact structures 210 and 212 of the first and second vertical MOSFETs are formed as continuous lines through the shallow trench isolation structures 208, and the cross sectional view of FIG. 4 is through dashed line A—A in FIG. 5. Alternatively, referring to the top view of FIG. 6, the first drain and source contact structures 210 and 212 of the first and second vertical MOSFETs are electrically isolated islands having a square shape for example. In that case, the first drain and source contact structures 210 and 212 of the first and second vertical MOSFETs are electrically isolated islands for a row of flash memory cells, and the cross sectional view of FIG. 4 is through dashed line B—B in FIG. 6. FIG. 6 also shows first drain and source contact structures 216 and 218 of third and fourth vertical MOSFETs of another row of flash memory cells. The present invention may be practiced for either shapes of the first drain or source contact structures 210 and 212, as would be apparent to one of ordinary skill in the art of integrated circuit fabrication from the description herein.

Referring to FIG. 7, a first dopant is implanted into the first drain or source contact structures 210 and 212 of the first and second vertical MOSFETs. The first dopant is an N-type dopant such as phosphorous for example for fabrication of vertical NMOSFETs (N-channel metal oxide semiconductor field effect transistors) for the array of flash memory cells. Alternatively, the first dopant is a P-type dopant such as boron for example for fabrication of vertical PMOSFETs (P-channel metal oxide semiconductor field effect transistors) for the array of flash memory cells.

Further referring to FIG. 7, a peripheral region mask 220 comprised of photoresist material for example is deposited over the third active device area 214 of the peripheral region. The peripheral region mask 220 blocks the first dopant from being implanted into the third active device area 214 of the peripheral region. Processes for formation of the peripheral region mask 220 and for implantation of the first dopant into the first drain or source contact structures 210 and 212 of the first and second vertical MOSFETs are known to one of ordinary skill in the art of integrated circuit fabrication.

Referring to FIGS. 7 and 8, the peripheral region mask 220 is etched away after implantation of the first dopant into the first drain or source contact structures 210 and 212 of the first and second vertical MOSFETs. Processes for etching away the peripheral region mask 220 comprised of photoresist material for example are known to one of ordinary skill in the art of integrated circuit fabrication. Further referring to FIG. 8, a bottom layer of doped insulating material 222 is deposited on any exposed surface including on the first drain or source contact structures 210 and 212 of the first and second vertical MOSFETs and on the third active device area 214 of the peripheral region. The bottom layer of doped insulating material 222 is doped with a second dopant. In addition, a layer of dummy material 224 is deposited on the bottom layer of doped insulating material 222. The layer of dummy material 224 is comprised of silicon nitride ($Si_3N_4$) according to one embodiment of the present invention. Furthermore, a top layer of doped insulating material 226 is deposited on the layer of dummy material 224. The top layer of doped insulating material 226 is doped with a third dopant.

The layer of dummy material 224 may be comprised of other suitable materials such as silicon oxynitride (SiON) or a silicon rich nitride film as known to one of ordinary skill in the art of integrated circuit fabrication. Generally, the present invention may be practiced when the layer of dummy material 224 is comprised of a material having a different etch rate than that of the top and bottom layers of doped insulating material 222 and 226. According to one embodiment of the present invention, the bottom layer of doped insulating material 222 and the top layer of doped insulating material 226 are comprised of PSG (phosphosilicate glass). In that case, the first dopant within the first drain or source contact structures 210 and 212, the second dopant within the bottom layer of doped insulating material 222, and the third dopant within the top layer of doped insulating material 226 are comprised of phosphorous for fabrication of vertical NMOSFETs (N-channel metal oxide semiconductor field effect transistors) for the array of flash memory cells.

In another embodiment of the present invention, the bottom layer of doped insulating material 222 and the top layer of doped insulating material 226 are comprised of BSG (boro-silicate glass). In that case, the first dopant within the first drain or source contact structures 210 and 212, the second dopant within the bottom layer of doped insulating material 222, and the third dopant within the top layer of doped insulating material 226 are comprised of boron for fabrication of vertical PMOSFETs (P-channel metal oxide semiconductor field effect transistors). Processes for deposition of such a bottom layer of doped insulating material 222, such a layer of dummy material 224, and such a top layer of doped insulating material 226 are known to one of ordinary skill in the art of integrated circuit fabrication.

Figure 9:
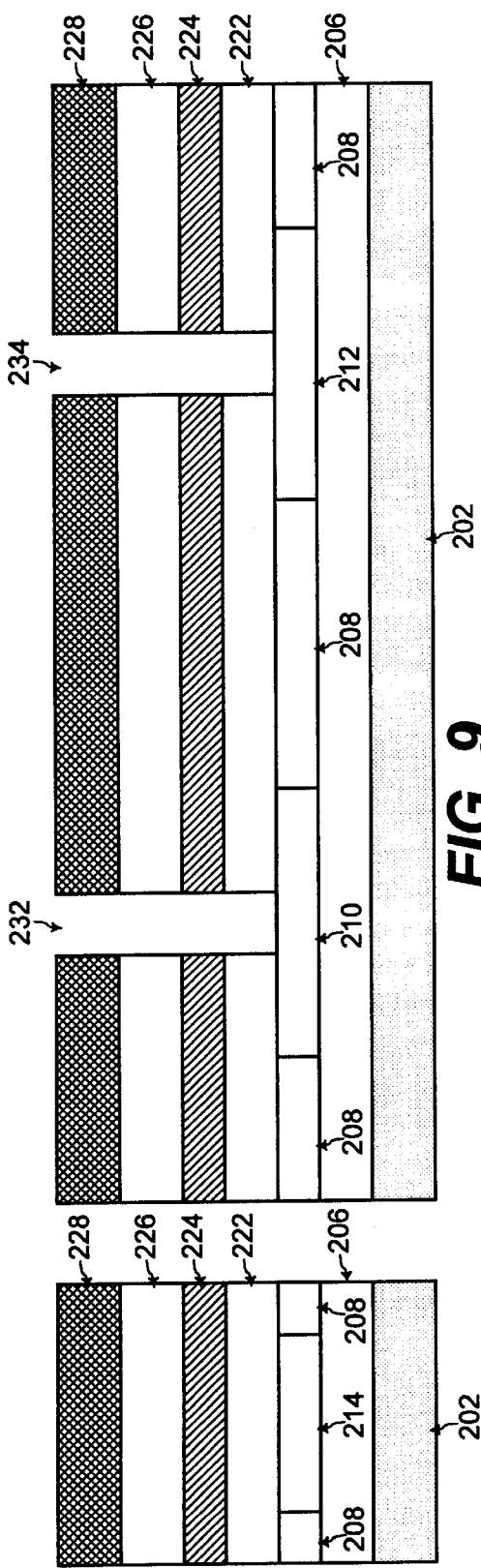

Referring to FIG. 9, a layer of masking material 228 such as photoresist material for example is patterned to etch a first opening 232 and a second opening 234 through the top layer of doped insulating material 226, the layer of dummy material 224, and the bottom layer of doped insulating material 222. Processes for patterning the layer of masking material 228 to form the first and second openings 232 and 234 are known to one of ordinary skill in the art of integrated circuit fabrication. The first opening 232 is disposed over the first drain and source contact structure 210 of the first vertical MOSFET such that a bottom wall of the first opening 232 is formed by the first drain or source contact structure 210 of the first vertical MOSFET. The second opening 234 is disposed over the first drain and source contact structure 212 of the second vertical MOSFET such that a bottom wall of the second opening 234 is formed by the first drain or source contact structure 212 of the second vertical MOSFET.

Figure 10:
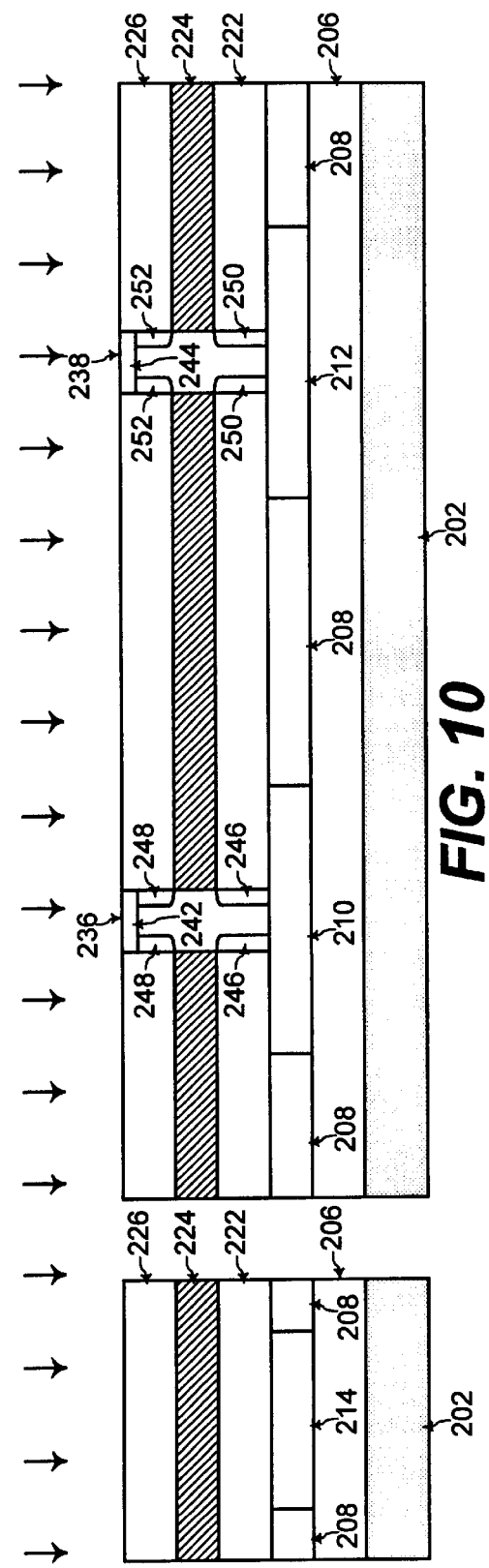

Referring to FIGS. 9 and 10, a first semiconductor fill 236 is formed to fill the first opening 232, and a second semiconductor fill 238 is formed to fill the second opening 234. In one embodiment of the present invention, the first and second semiconductor fills 236 and 238 are comprised of silicon epitaxially grown from the first drain or source contact structures 210 and 212 at the bottom wall of the openings 232 and 234. In that case, the first drain or source contact structures 210 and 212 act as a seed for the epitaxial growth of the first and second semiconductor fills 236 and 238 at the bottom wall of the openings 232 and 234, respectively. Processes for epitaxially growing the first and second semiconductor fills 232 and 234 comprised of silicon for example are known to one of ordinary skill in the art of integrated circuit fabrication.

For epitaxially growing silicon from the semiconductor material at the bottom wall of the openings 232 and 234, one of the following reactants are typically used as the silicon source: silicon tetrachloride ($SiCl_4$), trichlorosilane ($SiHCl_3$), dichlorosilane ($SiH_2Cl_2$), and silane ($SiH_4$). The temperature used for epitaxial growth of silicon from such reactants decreases with a lower number of chlorine atoms and a higher number of hydrogen atoms for such reactants. For example, the temperature for epitaxial growth of silicon from tetrachloride ($SiCl_4$) is in a range of from about 1150° Celsius to about 1250° Celsius. The temperature for epitaxial growth of silicon from trichlorosilane ($SiHCl_3$) is in a range of from about 1100° Celsius to about 1200° Celsius. The temperature for epitaxial growth of silicon from dichlorosilane ($SiH_2Cl_2$) is in a range of from about 1050° Celsius to about 1150° Celsius. The temperature for epitaxial growth of silicon from silane ($SiH_4$) is in a range of from about 950° Celsius to about 1050° Celsius.

In one embodiment of the present invention, silane ($SiH_4$) is used as the reactant for epitaxial growth of silicon for the first and second semiconductor fills 236 and 238 such that a lowest possible temperature may be used for the epitaxial growth of silicon for the first and second semiconductor fills 236 and 238. A lower temperature is advantageous for minimizing transient diffusion of dopant for the first and second vertical MOSFETs having scaled down dimensions of tens of nanometers. In addition, referring to FIG. 10, the first and second semiconductor fills 236 and 238 are preferably contained within the first and second openings 232 and 234. If the first and second semiconductor fills 236 and 238 grow beyond the first and second openings 232 and 234, a CMP (chemical mechanical polish) process may be used to contain the first and second semiconductor fills 236 and 238 within the first and second openings 232 and 234.

Further referring to FIG. 10, after formation of the first and second semiconductor fills 236 and 238, a fourth dopant is implanted through the top surface of the first and second semiconductor fills 236 and 238 to form a second drain or source contact junction 242 of the first vertical MOSFET and a second drain or source contact junction 244 of the second vertical MOSFET. The second drain or source contact junction 242 for the first vertical MOSFET is the top portion of the first semiconductor fill 236 having the fourth dopant implanted therein, and the second drain or source contact junction 244 for the second vertical MOSFET is the top portion of the second semiconductor fill 238 having the fourth dopant implanted therein.

The fourth dopant may be comprised of phosphorous when the first dopant within the first drain or source contact structures 210 and 212, the second dopant within the bottom layer of doped insulating material 222, and the third dopant within the top layer of doped insulating material 226 are comprised of phosphorous for fabrication of vertical NMOSFETs (N-channel metal oxide semiconductor field effect transistors) for the flash memory cells. Alternatively, the fourth dopant may be comprised of boron when the first dopant within the first drain or source contact structures 210 and 212, the second dopant within the bottom layer of doped insulating material 222, and the third dopant within the top layer of doped insulating material 226 are comprised of boron for fabrication of vertical PMOSFETs (P-channel metal oxide semiconductor field effect transistors) for the flash memory cells.

In addition, referring to FIG. 10, the first and second semiconductor fills 236 and 238 have at least one sidewall (including a left sidewall and a right sidewall in FIG. 10). A top portion of the at least one sidewall of the semiconductor fills 236 and 238 abuts the top layer of doped insulating material 226. A middle portion of the at least one sidewall of the semiconductor fills 236 and 238 abuts the layer of dummy material 216. A bottom portion of the at least one sidewall of the semiconductor fills 236 and 238 abuts the bottom layer of doped insulating material 222.

The second dopant from the bottom layer of doped insulating material 222 diffuses into the bottom portion of the first semiconductor fill 236 to form a first drain or source extension junction 246 for the first vertical MOSFET during a thermal anneal process. Similarly, the second dopant from the bottom layer of doped insulating material 222 diffuses into the bottom portion of the second semiconductor fill 238 to form a first drain or source extension junction 250 for the second vertical MOSFET during a thermal anneal process.

In addition, the third dopant from the top layer of doped insulating material 226 diffuses into the top portion of the first semiconductor fill 236 to form a second drain or source extension junction 248 of the first vertical MOSFET during a thermal anneal process. Similarly, the third dopant from the top layer of doped insulating material 226 diffuses into the top portion of the second semiconductor fill 238 to form a second drain or source extension junction 252 of the second vertical MOSFET during a thermal anneal process. Thermal anneal processes are known to one of ordinary skill in the art of integrated circuit fabrication.

Referring to FIG. 11, a capping layer of insulating material 254 is deposited on the top surface of the first and second semiconductor fills 236 and 238 and on the top layer of doped insulating material 226. The capping layer of insulating material 254 is comprised of silicon dioxide ($SiO_2$) for example according to one embodiment of the present invention, and processes for deposition of such a capping layer of insulating material 254 are known to one of ordinary skill in the art of integrated circuit fabrication.

Further referring to FIG. 11, masking structures 256 comprised of photoresist material for example in one embodiment of the present invention are formed over inner portions of the capping layer of insulating material 254 disposed over the first and second semiconductor fills 236 and 238. Photolithography processes for forming the masking structures 256 comprised of photoresist material for example are known to one of ordinary skill in the art of integrated circuit fabrication. Referring to FIGS. 11 and 12, any outer portions of the capping layer of insulating material 254 and of the top layer of doped insulating material 226 not covered by the masking structures 256 are etched away to expose the layer of dummy material 224. Processes for selectively etching away the capping layer of insulating material 254 and the top layer of doped insulating material 226 comprised of silicon dioxide ($SiO_2$) while preserving the layer of dummy material 224 comprised of silicon nitride ($Si_3N_4$) for example are known to one of ordinary skill in the art of integrated circuit fabrication.

Figure 13:
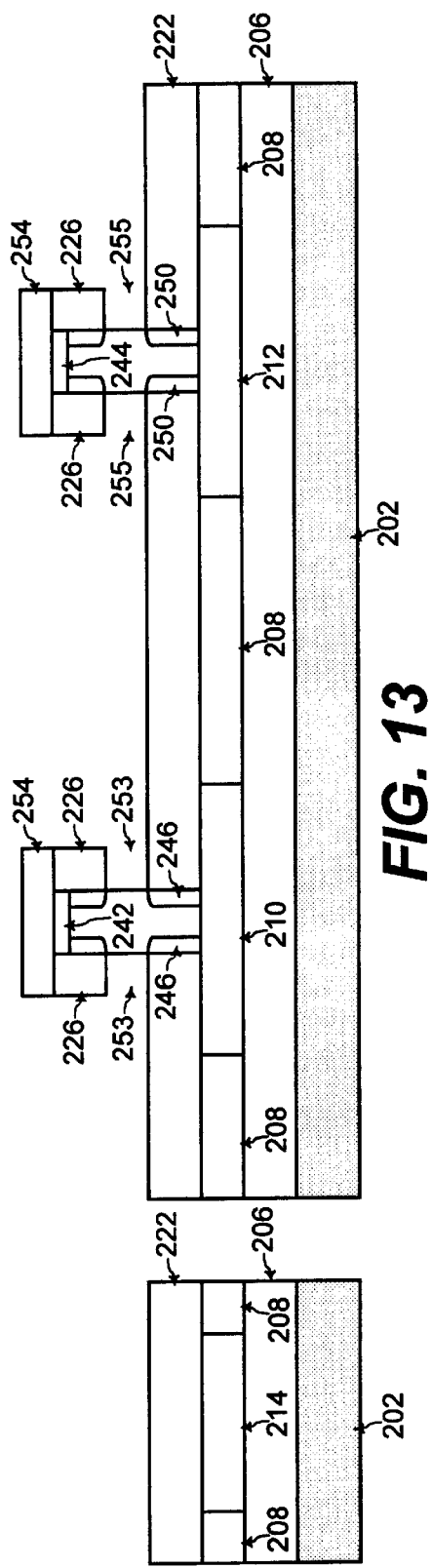

Referring to FIGS. 12 and 13, the masking structures 256 and the layer of dummy material 224 are etched away. Processes for etching away the masking structures 256 which are comprised of photoresist material for example and for etching away the layer of dummy material 224 which is comprised of silicon nitride ($Si_3N_4$) for example, such as an isotropic etch process for example, are known to one of ordinary skill in the art of integrated circuit fabrication. A first gate electrode opening 253 and a second gate electrode opening 255 are formed between the remaining top layer of doped insulating material 226 and the bottom layer of doped insulating material 222 when the layer of dummy material 224 is etched away. In addition, the middle portion of the sidewalls of the first and second semiconductor fills 236 and 238 are exposed when the layer of dummy material 224 is etched away. In an alternative embodiment of the present invention, the layer of dummy material 224 is etched away during the process of etching away the outer portions of the capping layer of insulating material 254 and of the top layer of doped insulating material 226 not covered by the masking structures 256.

Figure 14:
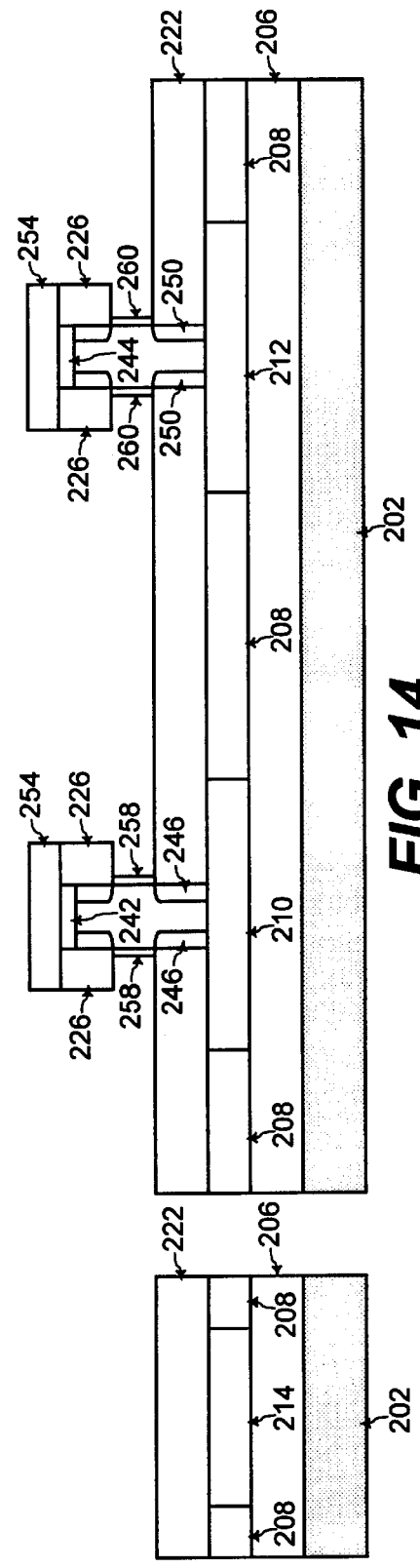

Referring to FIGS. 13 and 14, a first tunnel gate dielectric 258 is formed on the exposed middle portion of the sidewall of the first semiconductor fill 236, and a second tunnel gate dielectric 260 is formed on the exposed middle portion of the sidewall of the second semiconductor fill 238. The tunnel gate dielectrics 258 and 260 may be comprised of silicon dioxide ($SiO_2$) thermally grown from the exposed middle portion of the sidewalls of the first and second semiconductor fills 236 and 238 comprised of silicon according to one embodiment of the present invention. Processes for thermally growing silicon dioxide ($SiO_2$) for the tunnel gate dielectrics 258 and 260 are known to one of ordinary skill in the art of integrated circuit fabrication. The middle portion of the first semiconductor fill 236 abutting the first tunnel gate dielectric 238 and disposed between the drain or source extensions junctions 246 and 248 forms the channel region of the first vertical MOSFET. The middle portion of the second semiconductor fill 238 abutting the second tunnel gate dielectric 238 and disposed between the drain or source extensions junctions 250 and 252 forms the channel region of the second vertical MOSFET.

Referring to FIGS. 14 and 15, after formation of the tunnel gate dielectrics 258 and 260, a floating gate electrode material 262 is conformally deposited to fill the first and second gate electrode openings 253 and 255 between the remaining top layer of doped insulating material 226 and the bottom layer of doped insulating material 222. In addition, the floating gate electrode material 262 is conformally deposited to cover any exposed surfaces of the capping layer of insulating material 254, the top layer of doped insulating material 226, and the bottom layer of doped insulating material 222. The floating gate electrode material 262 is comprised of polysilicon according to one embodiment of the present invention. Processes for conformally depositing such floating gate electrode material 262 to fill the first and second gate electrode openings 253 and 255 between the remaining top layer of doped insulating material 226 and bottom layer of doped insulating material 222 are known to one of ordinary skill in the art of integrated circuit fabrication.

Referring to FIGS. 15 and 16, the floating gate electrode material 262 is anisotropically etched such that the floating gate electrode material 262 remains substantially between the remaining top layer of doped insulating material 226 and the bottom layer of doped insulating material 222 to form a first floating gate electrode 264 comprised of the floating gate electrode material 262 and a second floating gate electrode 266 comprised of the floating gate electrode material 262. Processes for anisotropically etching the floating gate electrode material 262 to form the floating gate electrodes 264 and 266 are known to one of ordinary skill in the art of integrated circuit fabrication.

Figure 17:
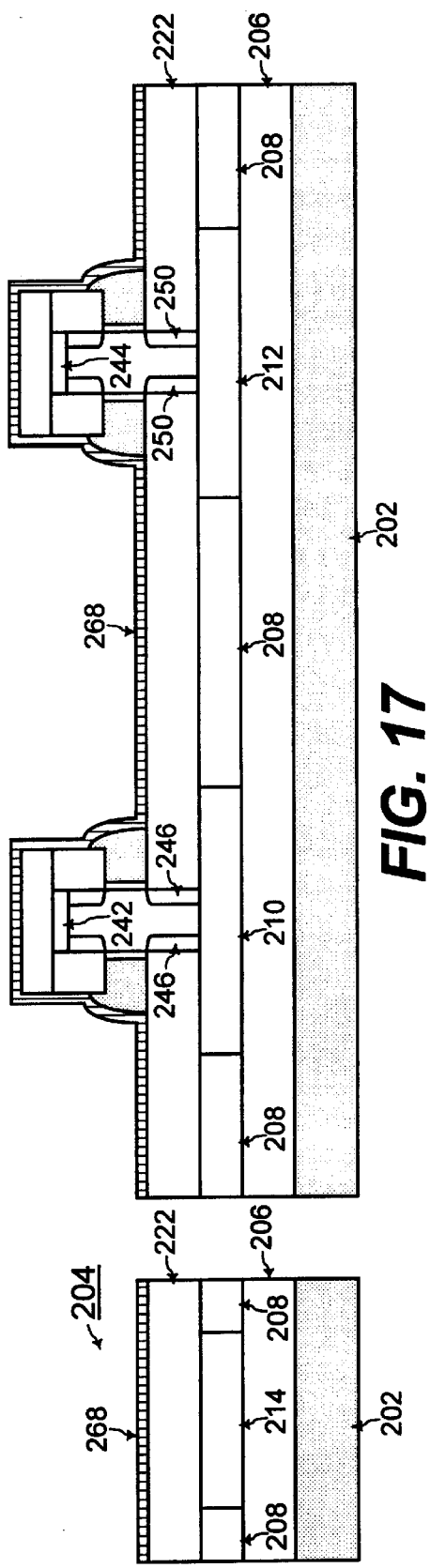

Referring to FIGS. 16 and 17, a control gate dielectric material 268 is conformally deposited on any exposed surfaces including any exposed surfaces of the first and second floating gate electrodes 264 and 266. The control gate dielectric material 268 is comprised of nitrided oxide formed in an ONO (oxide-nitride-oxide) deposition process according to one embodiment of the present invention. ONO (oxide-nitride-oxide) deposition processes for conformal deposition of the control gate dielectric material 268 are known to one of ordinary skill in the art of integrated circuit fabrication.

Figure 18:
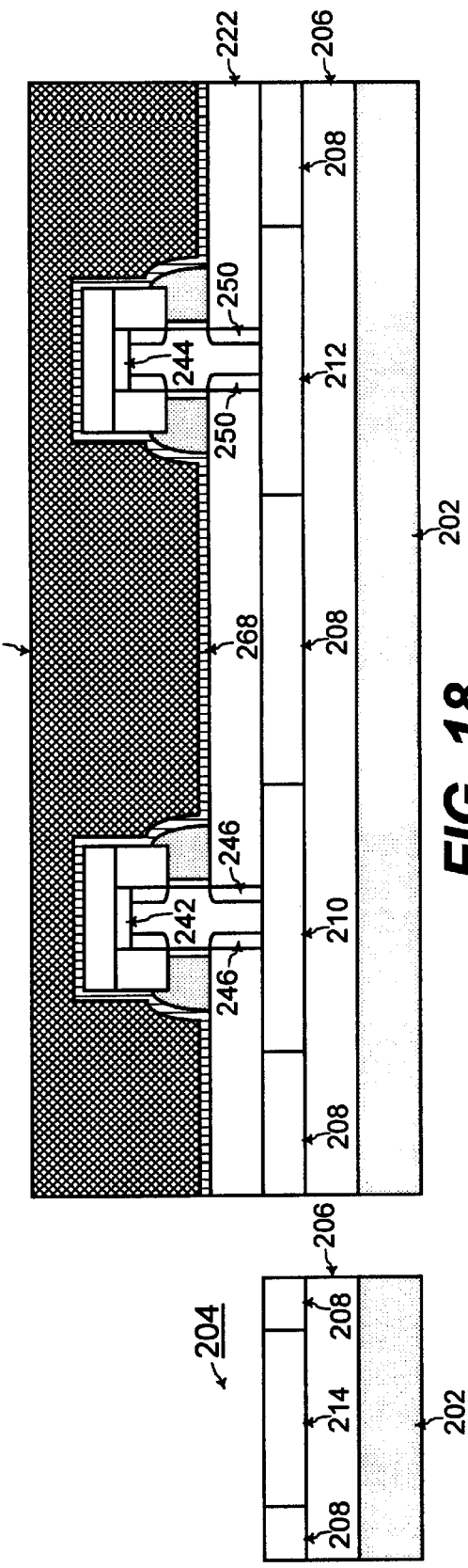

Referring to FIGS. 17 and 18, a core region mask 270 is deposited over the core region having the vertical MOSFETs for the array of flash memory cells. The core region mask 270 is comprised of photoresist material according to one embodiment of the present invention, and processes for deposition of such a core region mask 270 over the core region are known to one of ordinary skill in the art of integrated circuit fabrication. The core region mask 270 is not deposited over the peripheral region having the logic MOSFET 204, and any materials deposited on the peripheral region over the third active device area 214 of the silicon film on the buried insulating layer 206 are etched away. Referring to FIGS. 17 and 18, the control gate dielectric material 268 and the bottom layer of doped insulating material 222 on the peripheral region are etched away. Processes for etching away the control gate dielectric material 268 which is comprised of nitrided oxide for example and the bottom layer of doped insulating material 222 which is comprised of doped silicon dioxide for example are known to one of ordinary skill in the art of integrated circuit fabrication.

Figure 19:
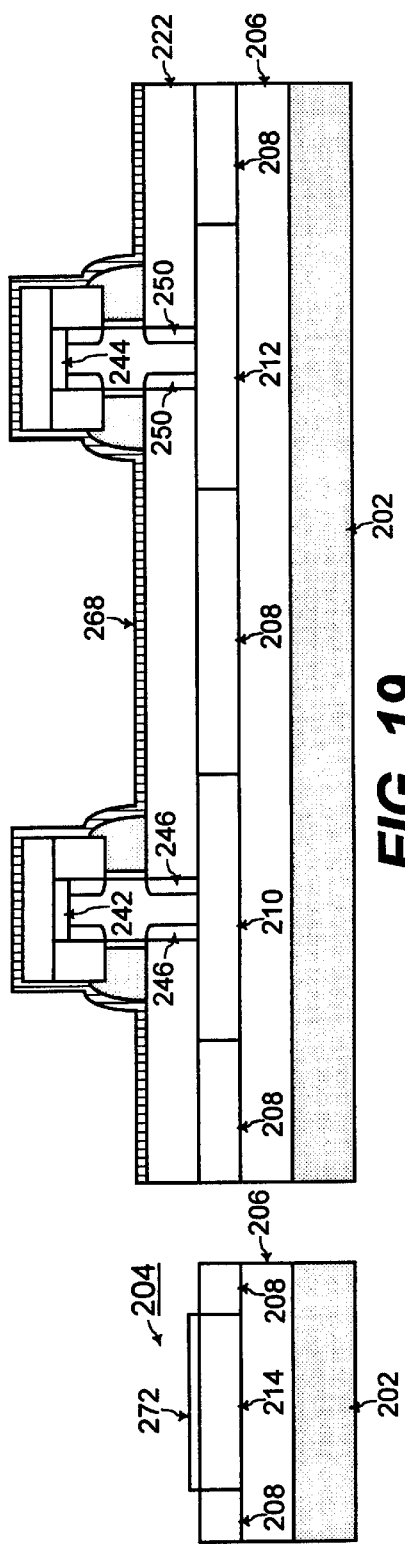

Referring to FIGS. 18 and 19, the core region mask 270 is etched away from the core region having the vertical MOSFETs for the array of flash memory cells. Processes for etching away the core region mask 270 which is comprised of photoresist material for example are known to one of ordinary skill in the art of integrated circuit fabrication. Further referring to FIG. 19, a logic gate dielectric material 272 is formed on the third active device area 214 of the silicon film on the buried insulating layer 206. The logic gate dielectric material 272 is comprised of silicon dioxide (SiO$_2$) thermally grown from the third active device area 214 of the silicon film, according to one embodiment of the present invention. Processes for thermally growing silicon dioxide (SiO$_2$) from an exposed silicon surface are known to one of ordinary skill in the art of integrated circuit fabrication. The control gate dielectric material 268 prevents formation of the logic gate dielectric material 272 in the core region having the vertical MOSFETs for the array of flash memory cells.

Figure 20:
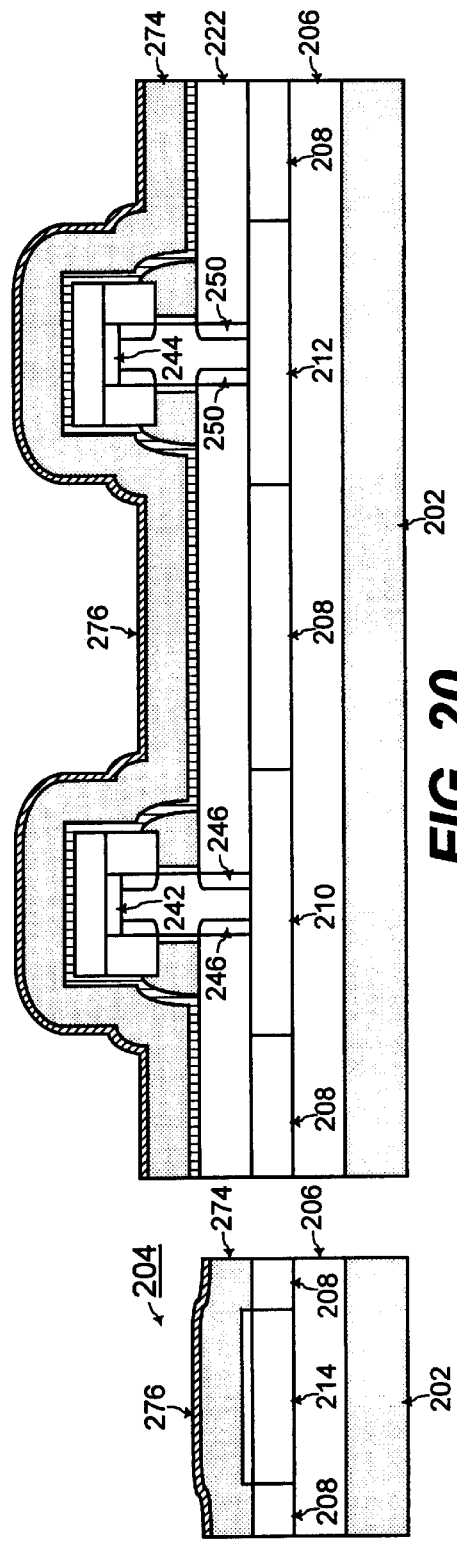

Referring to FIGS. 19 and 20, a control gate electrode material 274 is conformally deposited on any exposed surfaces including the exposed surfaces of the control gate dielectric material 268 and the logic gate dielectric material 272. The control gate electrode material 274 is comprised of polysilicon in one embodiment of the present invention, and processes for conformally depositing such a control gate electrode material 274 are known to one of ordinary skill in the art of integrated circuit fabrication.

In addition, a hardmask material 276 may also be deposited on the control gate electrode material 274 according to one embodiment of the present invention. The hardmask material 276 is comprised of at least one of silicon nitride (Si$_3$N$_4$), silicon oxynitride (SiON), and silicide, and processes for deposition of such hardmask material 276 are known to one of ordinary skill in the art of integrated circuit fabrication. Examples of silicide material include nickel silicide (NiSi), cobalt silicide (CoSi), palladium silicide (PdSi), platinum silicide (PtSi), or any other silicide materials as known to one of ordinary skill in the art of integrated circuit fabrication. Processes for formation of such silicide materials are known to one of ordinary skill in the art of integrated circuit fabrication.

Referring to FIGS. 20 and 21, after deposition of the control gate electrode material 274, word line masking structures 278 are formed on the core region having the vertical MOSFETs for the array of flash memory cells. Referring to the top view of FIG. 22, the word line masking structures 278 are patterned as horizontal lines to form rows of vertical MOSFETs in the array of flash memory cells of the non-volatile memory device. In addition, a logic gate mask 279 is formed on the peripheral region having the logic MOSFET 204. The word line masking structures 278 and the logic gate mask 279 are comprised of photoresist material according to one embodiment of the present invention. The cross sectional view of FIG. 21 is through dashed line C—C of the top view of FIG. 22.

Figure 23:
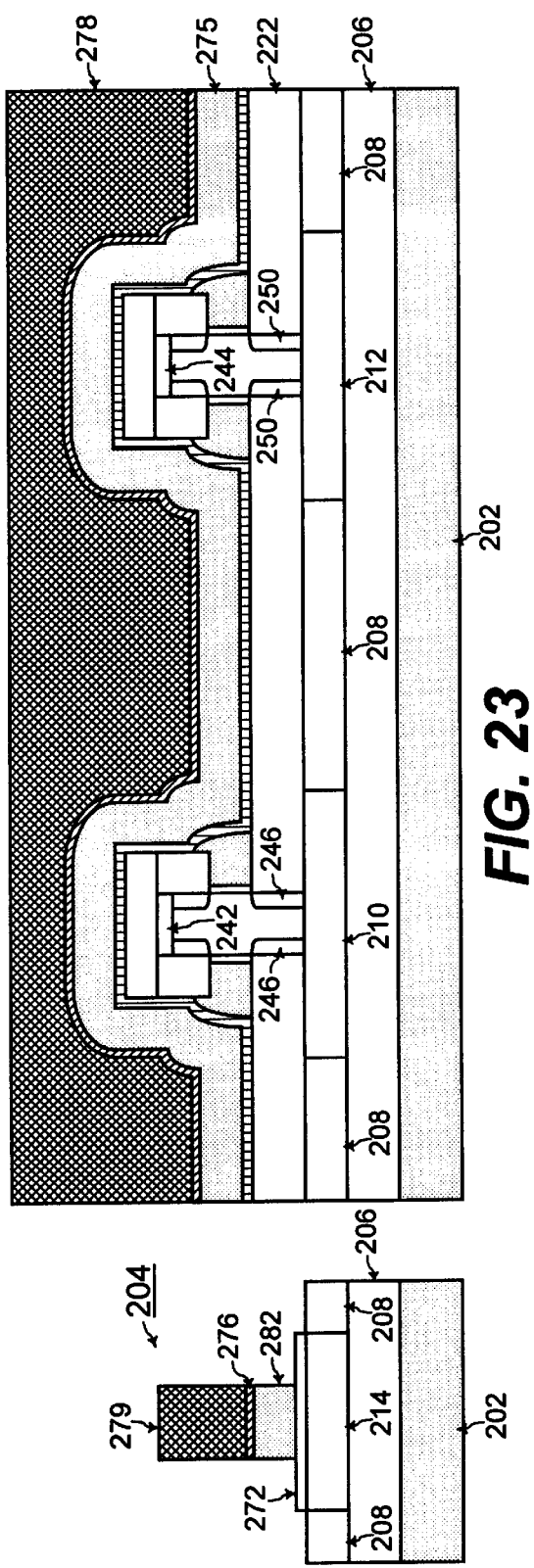

Referring to FIGS. 21, 22, and 23, the control gate electrode material 274 and the hardmask material 276 not under the word line masking structures 278 are etched away. Referring to the top view of FIG. 24, the control gate dielectric material 268 is exposed after the control gate electrode material 274 and the hardmask material 276 not under the word line masking structures 278 are etched away. The cross sectional view of FIG. 23 is through dashed line C—C of the top view of FIG. 24. In FIG. 23, the control gate electrode material 274 and the hardmask material 276 remain under the word line masking structure 278. The remaining control gate electrode material 274 on the control gate dielectric material 268 forms a control gate electrode 275 of the first and second vertical MOSFETs of FIG. 23. The control gate electrode material 274 under the word line masking structure 278 is continuous for the first and second vertical MOSFETs such that the control gate electrode 275 for a row of vertical MOSFETs in the array of flash memory cells are coupled together to form a word line of the non-volatile memory device.

Figure 24:
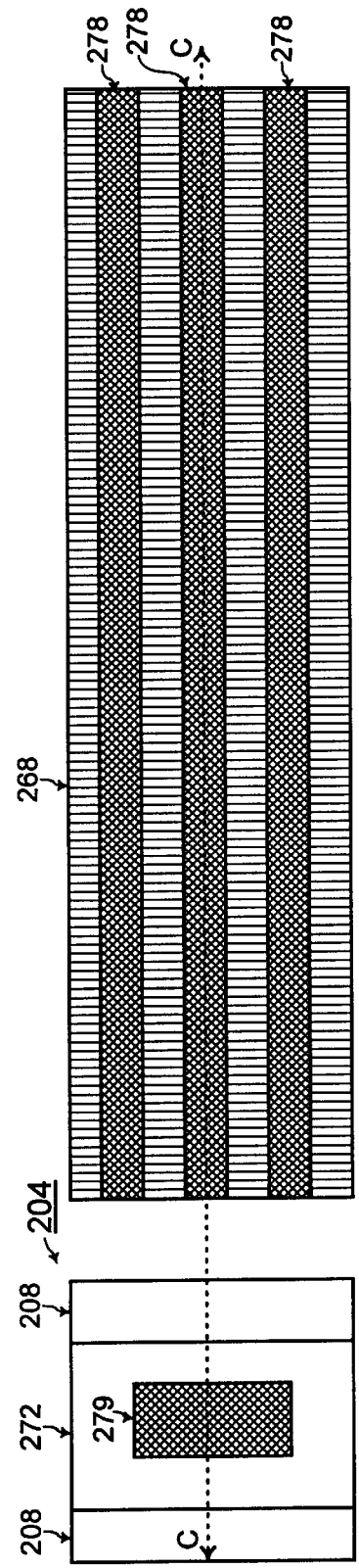

Further referring to FIGS. 23 and 24, the control gate electrode material 274 and the hardmask material 276 not under the logic gate mask 279 are etched away. Referring to the top view of FIG. 24, the logic gate dielectric material 272 is exposed after the control gate electrode material 274 and the hardmask material 276 not under the logic gate mask 279 are etched away. The control gate electrode material 274 remaining under the logic gate mask 279 forms a logic gate electrode 282 of the logic MOSFET 204. In one embodiment of the present invention, the control gate electrode material 274 and the hardmask material 276 not under the word line masking structures 278 and not under the logic gate mask 279 are etched away together to simultaneously form the control gate electrode for each word line for the rows of the flash memory cells and the logic gate electrode 282 of the logic MOSFET 204.

Figure 25:
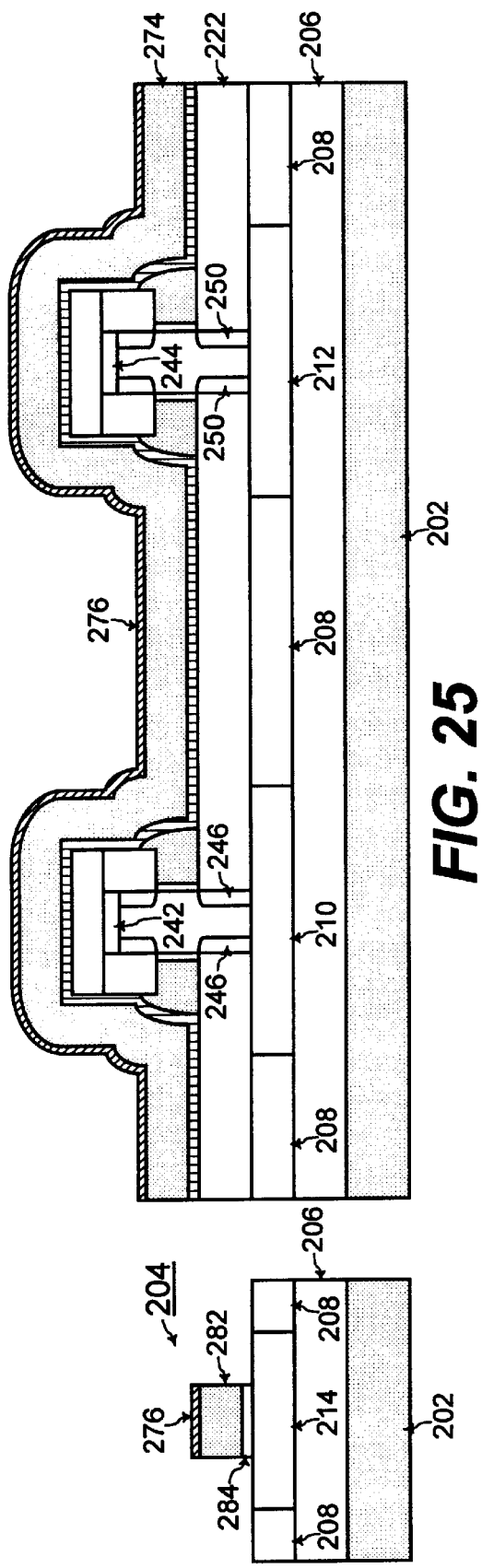
Figure 26:
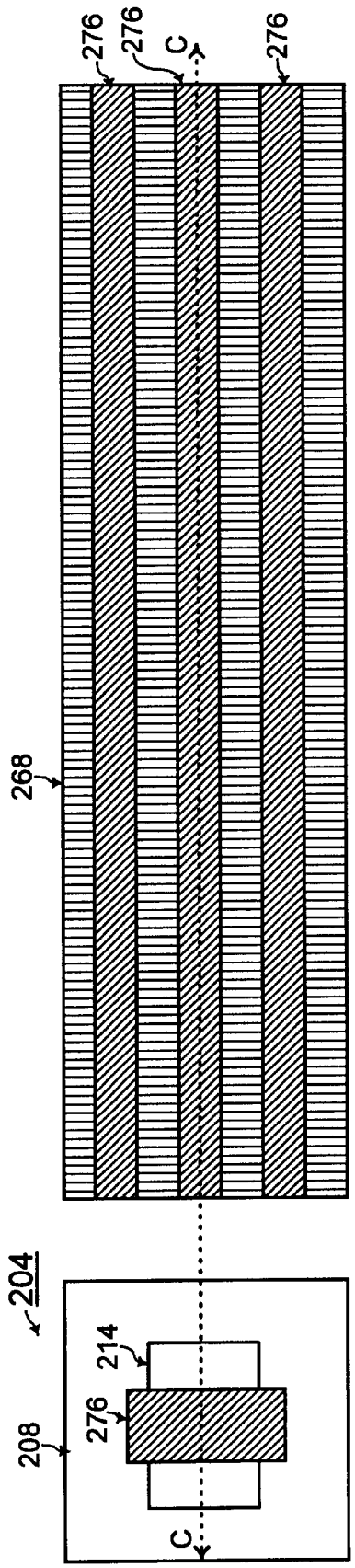

Referring to FIGS. 23 and 25, the word line masking structures 278 and the logic gate mask 279 are etched away after formation of the control gate electrode for each word line for the rows of the flash memory cells and after formation of the logic gate electrode 282 of the logic MOSFET 204. The top view of FIG. 26 shows the hardmask material 276 remaining on top of the control gate electrode for each word line for the rows of the flash memory cells and on top of the logic gate electrode 282 of the logic MOSFET 204. Processes for etching away the word line masking structure 278 and the logic gate mask 279 which are comprised of photoresist material for example are known to one of ordinary skill in the art of integrated circuit fabrication. The cross sectional view of FIG. 25 through dashed line C—C of the top view of FIG. 26.

Further referring to FIGS. 23 and 25, the logic gate dielectric material 272 not under the logic gate electrode 282 is etched away to form a logic gate dielectric 284 comprised of the logic; gate dielectric material 272 disposed below the logic gate electrode 282. Portions of the third active device area 214 of the semiconductor film formed on the buried insulating layer 206 are exposed to the sides of the logic gate electrode 282. Processes for etching away the exposed regions of the logic gate dielectric material 272 which is comprised of silicon dioxide (SiO$_2$) for example to form the logic gate dielectric 284 are known to one of ordinary skill in the art of integrated circuit fabrication.

Figure 27:
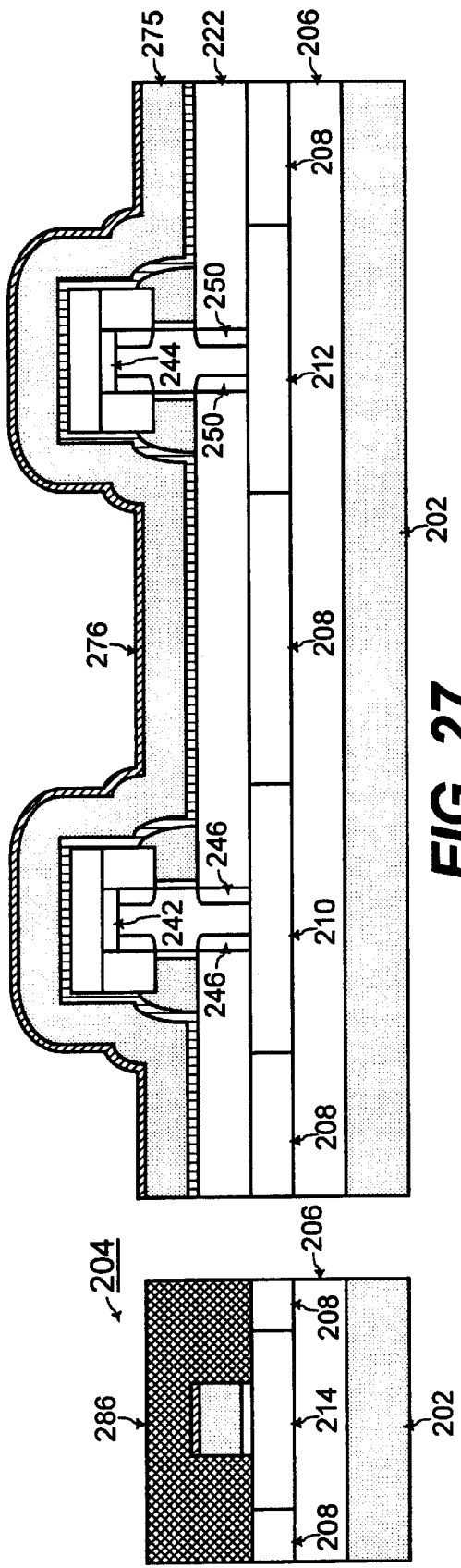

Referring to FIG. 27, after formation of the logic gate electrode 282 and the logic gate dielectric 284, a peripheral region mask 286 is patterned to cover the logic gate electrode 282 and the logic gate dielectric 284 of the peripheral region. The peripheral region mask 286 is comprised of photoresist material according to one embodiment of the present invention, and processes for patterning such a peripheral region mask 286 are known to one of ordinary skill in the art of integrated circuit fabrication.

Figure 28:
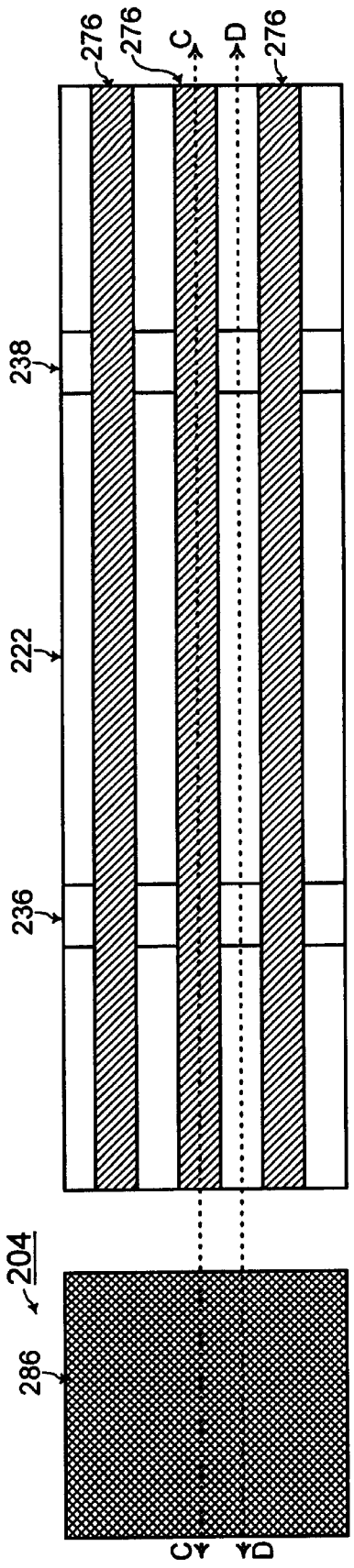

Referring to the top view of FIG. 28, while the peripheral region mask 286 covers the peripheral region, the hardmask material 276 remains on top of the control gate electrode for each word line for the rows of the flash memory cells. The cross sectional view of FIG. 27 is through dashed line C—C of the top view of FIG. 28. Referring to FIGS. 16, 27, 28, and 29, with the remaining hardmask material 276 being used as a hardmask for each word line for the rows of the flash memory cells, any portion of the control gate dielectric 268, the capping layer of insulating material 254, the top layer of doped insulating material 226, the floating gate electrode material 262, and the tunnel gate dielectrics 258 and 260 surrounding the first and second semiconductor fills 236 and 238 are etched away for the portion of the first and second semiconductor fills 236 and 238 not under the hardmask material 276. Processes for etching away the portions of the control gate dielectric 268 which is comprised of nitrided oxide for example, the capping layer of insulating material 254 which is comprised of silicon dioxide for example, the top layer of doped insulating material 226 which is comprised of doped silicon dioxide for example, the floating gate electrode material 262 which is comprised of polysilicon for example, and the tunnel gate dielectrics 258 and 260 which is comprised of silicon dioxide for example, not under the hardmask material 276, are known to one of ordinary skill in the art of integrated circuit fabrication.

The cross sectional view of FIG. 29 is through dashed line D—D of the top view of FIG. 28 for the portion of the first and second semiconductor fills 236 and 238 not under the hardmask material 276. The control gate electrode 275 remains under the hardmask material 276 to form a word line of the non-volatile memory device as illustrated in FIG. 27 through dashed line C—C of the top view of FIG. 28. Referring to FIG. 29, the top and middle portions of the sidewalls of the first and second semiconductor fills 236 and 238 are exposed for the portion of the first and second semiconductor fills 236 and 238 not under the hardmask material 276.

Referring to FIGS. 29 and 30, the peripheral region mask 286 is etched away after exposing the top and middle portions of the sidewalls of the first and second semiconductor fills 236 and 238 not under the hardmask material 276. A drain and source dopant is implanted into exposed regions of the third active device area 214 of the silicon film of the peripheral region to form a drain junction 288 and a source junction 290 of the logic MOSFET 204. Processes for implanting the drain and source dopant for formation of the drain junction 288 and the source junction 290 of the logic MOSFET 204 are known to one of ordinary skill in the art of integrated circuit fabrication.

In addition, spacer structures 292 are formed on the sidewalls of the logic gate dielectric 284 and the logic gate electrode 282 for the logic MOSFET 204. The spacer structures 294 are also formed on the exposed top and middle portions of the sidewalls of the first and second semiconductor fills 236 and 238 not under the hardmask material 276. The cross sectional view of FIG. 30 is through dashed line D—D of the top view of FIG. 28 for the portion of the first and second semiconductor fills 236 and 238 not under the hardmask material 276. The spacer structures 292 are comprised of silicon dioxide (SiO$_2$) for example according to one embodiment of the present invention, and processes for formation of such spacer structures 292 are known to one of ordinary skill in the art of integrated circuit fabrication.

Referring to FIGS. 10 and 27, in one embodiment of the present invention, the first drain or source contact structures 210 and 212 are drain contact structures for providing contact to the drain of the first and second vertical MOSFETs. In that case, the first drain or source extension junctions 246 and 250 are drain extension junctions of the first and second vertical MOSFETs. In addition, the second drain or source extension junctions 248 and 252 are source extension junctions of the first and second vertical MOSFETs. Furthermore, the second drain or source contact junctions 242 and 244 are source contact junctions for providing contact to the source of the first and second vertical MOSFETs.

Alternatively, the first drain or source contact structures 210 and 212 are source contact structures for providing contact to the source of the first and second vertical MOSFETs. In that case, the first drain or source extension junctions 246 and 250 are source extension junctions of the first and second vertical MOSFETs. In addition, the second drain or source extension junctions 248 and 252 are drain extension junctions of the first and second vertical MOSFETs. Furthermore, the second drain or source contact junctions 242 and 244 are drain contact junctions for providing contact to the drain of the first and second vertical MOSFETs.

Referring to FIGS. 5 and 6, the first drain or source contact structures 210 and 212 are formed as a line through the shallow trench isolation structures 208 (as illustrated in FIG. 5) or as electrically isolated islands surrounded by the shallow trench isolation structures 208 (as illustrated in FIG. 6). Referring to FIG. 31, the top view of the core region having the array of flash memory cells of FIG. 28 is shown with the outline of the first drain or source contact structures 210 and 212 having dashed lines when the first drain or source contact structures 210 and 212 are electrically isolated islands. Thus, the first drain or source contact structure of each of the vertical MOSFETs in a column of flash memory cells is electrically isolated. In that case, each of the semiconductor fills 236 or 238 is formed to be continuous for a column of the vertical MOSFETs in the column of flash memory cells such that the second drain or source contact junction for each of the vertical MOSFETs in the column of flash memory cells is coupled together to form a bit line of the non-volatile memory device. Referring to FIG. 31, the first semiconductor fill 236 forms a first bit line of the non-volatile memory device, and the second semiconductor fill 238 forms a second bit line of the non-volatile memory device.

Referring to FIG. 32, the top view of the core region having the array of flash memory cells of FIG. 28 is shown with the outline of the first drain or source contact structures 210 and 212 having dashed lines when the first drain or source contact structures 210 and 212 are formed as lines with each line running through a column of flash memory cells. In that case, the first drain or source contact structure of each of the vertical MOSFETs in a column of flash memory cells is coupled together to form a bit line of the non-volatile memory device. Referring to FIG. 32, the first drain or source contact structure 210 of the first vertical MOSFET forms a first bit line of the non-volatile memory device, and the first drain or source contact structure 212 of the second vertical MOSFET forms a second bit line of the non-volatile memory device.

Figure 33:
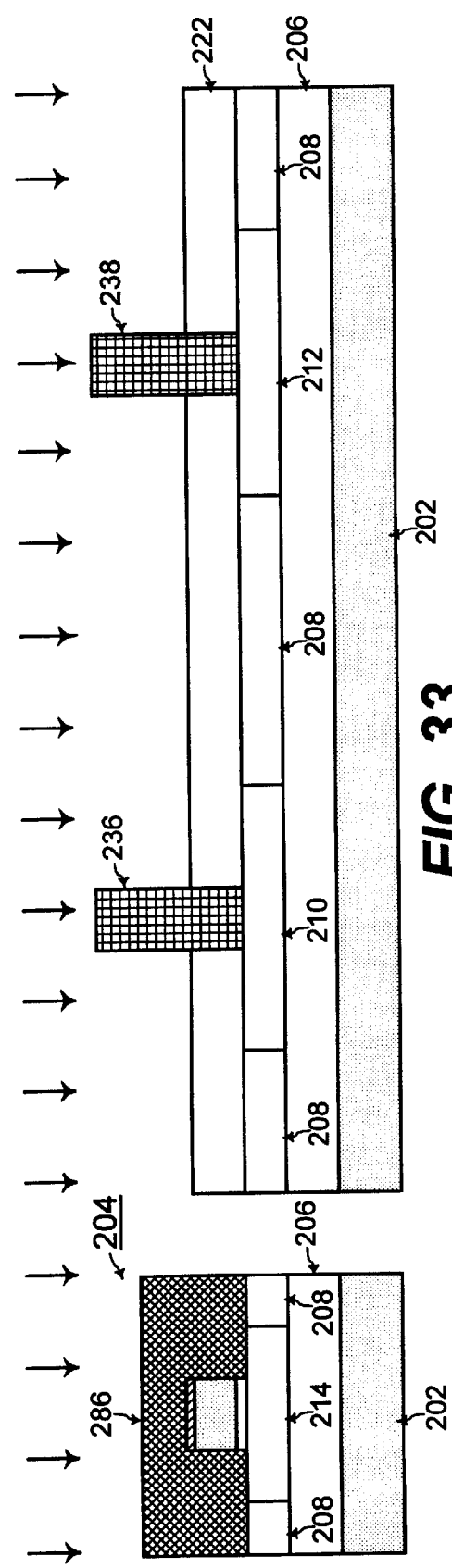
FIGS. 33 and 34 show a cross sectional view and a top view of the array of flash memory cells for the step of implanting an inactivating dopant into exposed portions of the semiconductor fill to electrically isolate each semiconductor fill forming a vertical field effect transistor in a column of the array of flash memory cells, according to an embodiment of the present invention.
Figure 34:
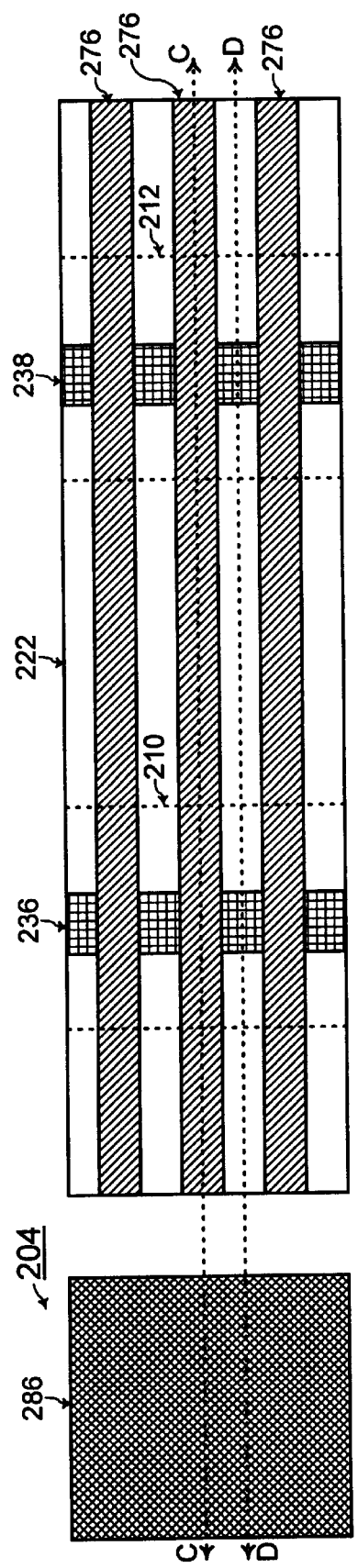
Figure 39:
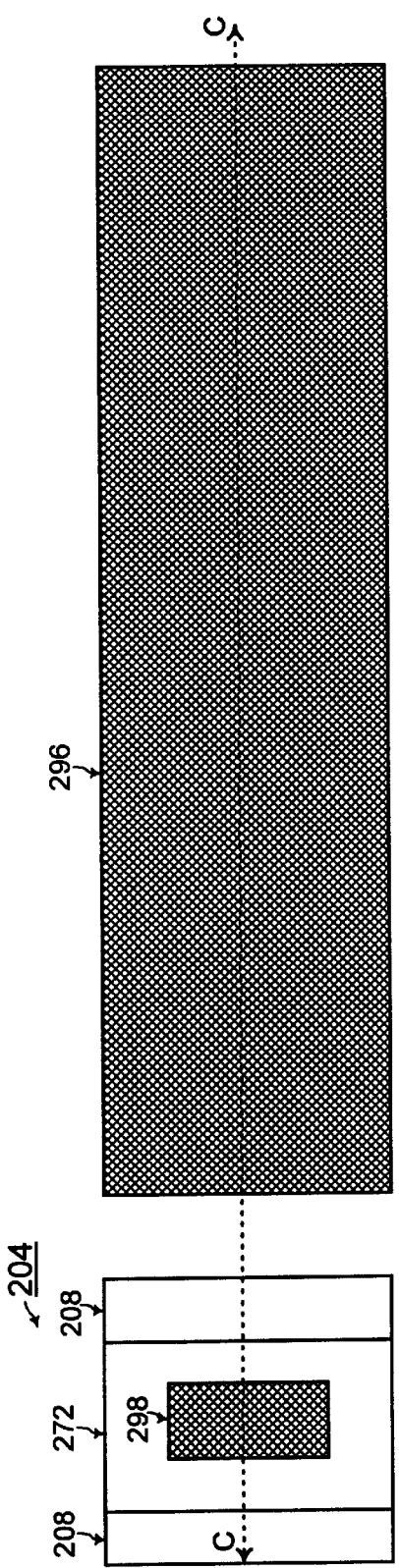

In the case of FIG. 32, the second drain or source contact structure formed in a semiconductor fill of a column of flash memory cells is electrically isolated by implanting an inactivating dopant into exposed portions of the semiconductor fill between the word lines of the non-volatile memory device. Referring to FIGS. 29, 33, and 34, after the top and middle portions of the sidewalls of the first and second semiconductor fills 236 and 238 are exposed for the portion of the first and second semiconductor fills 236 and 238 not under a word line of the non-volatile memory device, an inactivating dopant is implanted into such portions of the first and second semiconductor fills 236 and 238 not under a word line of the non-volatile memory device. The cross sectional view of FIG. 33 is through dashed line D—D of the top view of FIG. 34 for the portion of the first and second semiconductor fills 236 and 238 not under the hardmask material 276.

In one embodiment of the present invention, the inactivating dopant is implanted vertically down through the top surfaces and at an angle through the sidewalls of the portions of the first and second semiconductor fills 236 and 238 not under a word line of the non-volatile memory device. Such vertical and angled implantation of the inactivating dopant ensure more uniform distribution of the inactivating dopant in the portions of the first and second semiconductor fills 236 and 238 not under a word line of the non-volatile memory device. Processes for such implantation of the inactivating dopant are known to one of ordinary skill in the art of integrated circuit fabrication.

The inactivating dopant renders such portions of the first and second semiconductor fills 236 and 238 not under a word line to be electrically non-conductive. For example, when the second drain or source contact junctions are doped with an N-type dopant for vertical NMOSFETs for the flash memory cells, the inactivating dopant is comprised of a P-type dopant. On the other hand, when the second drain or source contact junctions are doped with an P-type dopant for vertical PMOSFETs for the flash memory cells, the inactivating dopant is comprised of an N-type dopant. The hardmask material 276 blocks the inactivating dopant from being implanted into the second drain or source contact junction formed within the semiconductor fill under a word line of the non-volatile memory device. In this manner, the second drain or source contact junction for each vertical MOSFET in an array of flash memory cells is electrically isolated when the first drain or source contact structure of each of the vertical MOSFETs in the column of flash memory cells is coupled together to form a bit line of the non-volatile memory device.

In FIGS. 21, 22, 23, and 24, the control gate electrodes for the word lines for the rows of the flash memory cells are patterned simultaneously with the logic gate electrode 282 of the logic MOSFET 204. Referring to FIG. 35, in another embodiment of the present invention, a peripheral region mask 294 is formed to cover the control gate electrode material 274 and the hardmask material 276 on the peripheral region while patterning the control gate electrodes for the word lines for the rows of the flash memory cells with the word line masking structures 278. The peripheral region mask 294 and the word line masking structures 278 are comprised of photoresist material, and processes for formation of such a peripheral region mask 294 and such word line masking structures 278 are known to one of ordinary skill in the art of integrated circuit fabrication.

In the top view of FIG. 36, the control gate electrode material 274 and the hardmask material 276 are patterned with the word line masking structures 278 to form the word lines for the rows of the flash memory cells. In addition, with the word line masking structures 278, any portion of the control gate dielectric 268, the capping layer of insulating material 254, the top layer of doped insulating material 226, the floating gate electrode material 262, and the tunnel gate dielectrics 258 and 260 surrounding the first and second semiconductor fills 236 and 238 are etched away for the portion of the first and second semiconductor fills 236 and 238 not under the word line masking structures 278.

In this manner, the cross sectional view of FIG. 35 is through dashed line C—C of the top view of FIG. 36 for the portion of the first and second semiconductor fills 236 and 238 under a word line masking structure 278. On the other hand, the cross sectional view of FIG. 37 is through dashed line D—D of the top view of FIG. 36 for the portion of the first and second semiconductor fills 236 and 238 not under a word line masking structure 278.

During such patterning of the word lines for the rows of the flash memory cells with the word line masking structures 278, the logic gate electrode and the logic gate dielectric for the logic MOSFET 204 are not patterned. After patterning of the word lines for the rows of the flash memory cells with the word line masking structures 278, the peripheral region mask 294 and the word line masking structures 278 are etched away. Processes for etching away the peripheral region mask 294 and the word line masking structures 278 which are comprised of photoresist material for example are known to one of ordinary skill in the art of integrated circuit fabrication.

Referring to FIG. 38, a core region mask 296 is then deposited over the core region of the array of flash memory cells, and a logic gate mask 298 is deposited on the hardmask material 276 and the control gate electrode material 274. Referring to the top view of FIG. 39, the core region mask 296 is deposited to cover the whole core region of the array of flash memory cells. The logic gate mask 298 is patterned to etch away exposed regions of the hardmask material 276 and the control gate electrode material 274 to form the logic gate electrode 282 of the logic MOSFET 204.

The core region mask 296 and the logic gate mask 298 are comprised of photoresist material for example in one embodiment of the present invention, and processes for formation of such a core region mask 296 and such a logic gate mask 298 are known to one of ordinary skill in the art of integrated circuit fabrication. The cross sectional view of FIG. 38 is through dashed line C—C of the top view of FIG. 39.

After formation of the logic gate electrode 282 of the logic MOSFET 204, the core region mask 296 and the logic gate mask 298 are etched away. Processes for etching away the core region mask 296 and the logic gate mask 298 which are comprised of photoresist material for example are known to one of ordinary skill in the art of integrated circuit fabrication. Exposed regions of the logic gate dielectric material 272 are etched away to form the logic gate dielectric of the logic MOSFET 204 in a similar manner as described herein with reference to FIG. 25. In addition, a drain and source dopant is implanted into exposed regions of the third active device area 214 of the silicon film of the peripheral region to form a drain junction and a source junction of the logic MOSFET 204 in a similar manner as described herein with reference to FIG. 30.

In the embodiment of FIGS. 21, 22, 23, and 24, the control gate electrodes for the word lines for the rows of the flash memory cells within the core region are patterned simultaneously with the logic gate electrode 282 of the logic MOSFET 204 within the peripheral region. In contrast, in the embodiment of FIGS. 35, 36, 37, 38, and 39, the control gate electrodes of the word lines for the row of flash memory cells within the core region are patterned separately from the logic gate electrode 282 of the logic MOSFET 204 within the peripheral region. In the embodiment of FIGS. 35, 36, 37, 38, and 39, parameters for patterning of the logic gate electrode 282 of the logic MOSFET 204 within the peripheral region may be controlled separately and independently from patterning of the word lines for the row of flash memory cells within the core region.

In either embodiments, referring to FIGS. 14, 16, 27, 30, and 38, a vertical field effect transistor structure is formed for each flash memory cell of the non-volatile memory device to have a tunnel gate dielectric and a floating gate electrode on each of a plurality of planes of the channel region formed within a semiconductor fill for better control of charge accumulation within the channel region such that undesired short channel effects are minimized. For example, referring to FIGS. 1, 14, 16, 27, and 30, the tunnel gate dielectric 258 for the first vertical MOSFET is equivalent to the tunnel gate dielectric 102 of the planar flash memory cell 100 of FIG. 1. The floating gate electrode 264 for the first vertical MOSFET is equivalent to the floating gate electrode 104 of the planar flash memory cell 100 of FIG. 1. The control gate dielectric 268 for the first vertical MOSFET is equivalent to the control gate dielectric 106 of the planar flash memory cell 100 of FIG. 1. The control gate electrode 275 for the first vertical MOSFET is equivalent to the control gate electrode 108 of the planar flash memory cell 100 of FIG. 1. The tunnel gate dielectric 258 and the floating gate electrode 264 are disposed on a plurality of planes of the channel region formed by the middle portion of the first semiconductor fill 236 for the first vertical MOSFET.

In addition, with application of bias voltage on the control gate electrode 275 at each of a plurality of planes of the channel region, higher drive current is achieved for enhanced speed performance of the vertical field effect transistor. Furthermore, the length of the channel region is determined by the thickness of the layer of dummy material 224 deposited between the top and bottom layers of doped insulating material 226 and 222. Thus, the length of the channel region of the vertical field effect transistor may be scaled down beyond those possible from photolithography limitations. Additionally, because the drain, source, and the channel region extends upward from the semiconductor substrate 202 for the vertical field effect transistor, such a vertical field effect transistor may occupy a smaller area of the semiconductor substrate 202 such that a compact array of flash memory cells is formed for the non-volatile memory device.

The foregoing is by way of example only and is not intended to be limiting. For example, any materials or dimensions specified herein are by way of example only. As will be understood by those skilled in the art, the integrated circuit structures described herein may be made or used in the same way regardless of their position and orientation. Accordingly, it is to be understood that terms and phrases such as "sidewall," "top," "bottom," "row," "column," and "on," as used herein refer to the relative location and orientation of various portions of the structures with respect to one another, and are not intended to suggest that any particular absolute orientation with respect to external objects is necessary or required.

In addition, example embodiments of the present invention are illustrated and described for forming a vertical MOSFET for each flash memory cell of the non-volatile memory device on an active device area of a semiconductor film formed on an insulating layer in SOI (semiconductor on insulator) technology. However, the present invention may also be applied for forming a vertical MOSFET for each flash memory cell of the non-volatile memory device within an active device area of a bulk semiconductor substrate, as would be apparent to one of ordinary skill in the art of integrated circuit fabrication from the description herein.

Furthermore, the embodiments of the present invention as described herein may be practiced with further modifications. For example, referring to FIG. 40, in another embodiment of the present invention, a top intermediary layer of highly doped insulating material 302 is deposited between the top layer of doped insulating material 226 and the layer of dummy material 224, and a bottom intermediary layer of highly doped insulating material 304 is deposited between the bottom layer of doped insulating material 222 and the layer of dummy material 224. The concentration of the third dopant within the top layer of doped insulating material 226 is lower than the concentration of the third dopant within the top intermediary layer of highly doped insulating material 302. Similarly, the concentration of the second dopant within the bottom layer of doped insulating material 222 is lower than the concentration of the second dopant within the bottom intermediary layer of highly doped insulating material 304.

For example, the top layer of doped insulating material 226, the top intermediary layer of highly doped insulating material 302, the bottom layer of doped insulating material 222, and the bottom intermediary layer of highly doped insulating material 304 are comprised of PSG (phosphosilicate glass) such that the second and third dopants are comprised of phosphorous for formation of a vertical NMOSFET (N-channel Metal Oxide Semiconductor Field Effect Transistor) for each flash memory cell. In that case, the concentration of phosphorous within the top intermediary layer of highly doped insulating material 302 and the bottom intermediary layer of highly doped insulating material 304 is greater than within the top layer of doped insulating material 226 and the bottom layer of doped insulating material 222, respectively.

Alternatively, the top layer of doped insulating material 226, the top intermediary layer of highly doped insulating material 302, the bottom layer of doped insulating material 222, and the bottom intermediary layer of highly doped insulating material 304 are comprised of BSG (boro-silicate glass) such that the second and third dopants are comprised of boron for formation of a vertical PMOSFET (P-channel Metal Oxide Semiconductor Field Effect Transistor) for each flash memory cell. In that case, the concentration of boron within the top intermediary layer of highly doped insulating material 302 and the bottom intermediary layer of highly doped insulating material 304 is greater than within th e top layer of doped insulating material 226 and the bottom layer of doped insulating material 222, respectively. Processes for depositing such top and bottom intermediary layers of highly doped insulating material 302 and 304 are known to one of ordinary skill in the art of integrated circuit fabrication.

Figure 40:
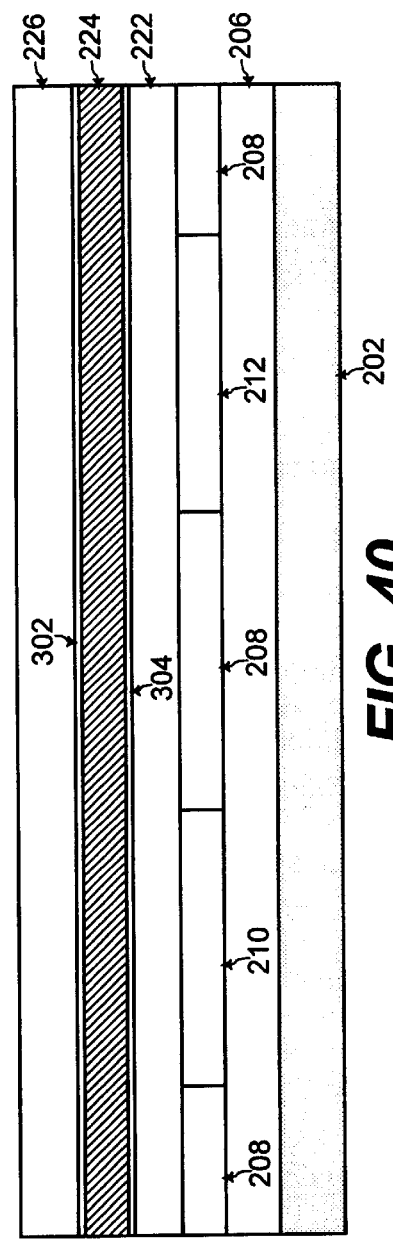
FIGS. 40 and 41 show cross sectional views for depositing intermediary layers of highly doped insulating material near the layer of dummy material to increase the concentration of charge carriers in the drain and source extension junctions near the channel region, according to a further embodiment of the present invention.
Figure 41:
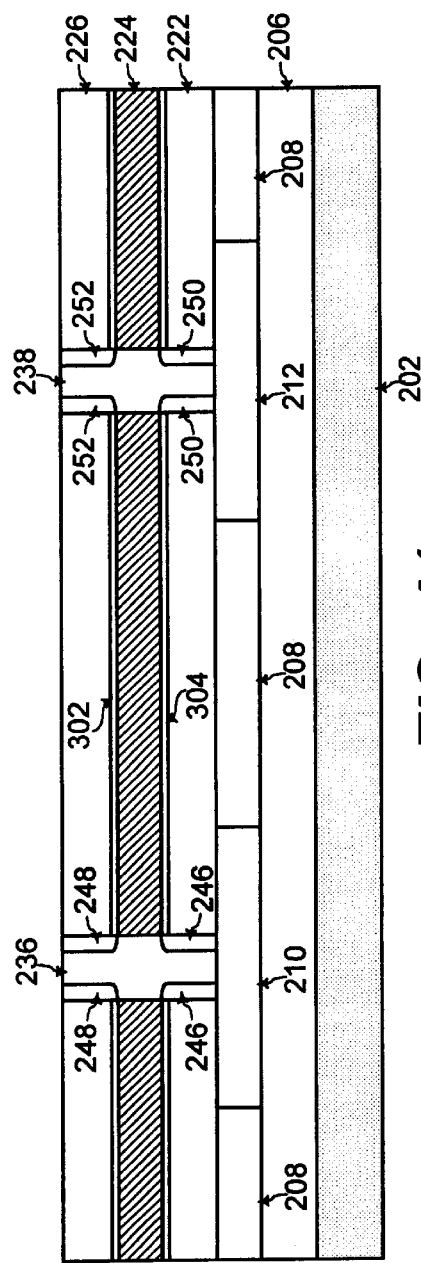

Referring to FIGS. 40, and 41, the first and second semiconductor fills 236 and 238 of the first and second vertical MOSFETs are formed within openings formed through the top layer of doped insulating material 226, the top intermediary layer of highly doped insulating material 302, the layer of dummy material 224, the bottom intermediary layer of highly doped insulating material 304, and the bottom layer of doped insulating material 222, in a similar manner as described in reference to FIGS. 9 and 10. The first and second vertical MOSFETs are formed by etching away the layer of dummy material 224 in FIG. 41, in a similar manner as described in reference to FIGS. 11–30.

With the top and bottom intermediary layers of highly doped insulating material 302 and 304, the first drain or source extension junctions 246 and 250, formed from the second dopant diffused into the bottom portion of the first and second semiconductor fills 236 and 238 from the bottom layer of doped insulating material 222 and from the bottom intermediary layer of highly doped insulating material 304, has a greater concentration of the second dopant near the channel region. Similarly, the second drain or source extension junctions 248 and 252, formed from the third dopant diffused into the top portion of the first and second semiconductor fills 236 and 238 from the top layer of doped insulating material 226 and from the top intermediary layer of highly doped insulating material 302, has a greater concentration of the third dopant near the channel region. Such greater concentration of dopant near the channel region for the first and second extension junctions 246, 248, 250, and 252 is amenable for a higher concentration of charge carriers tunneling through the tunnel gate dielectric of a vertical MOSFET for more efficient operation of the flash memory cell.

Figure 3:
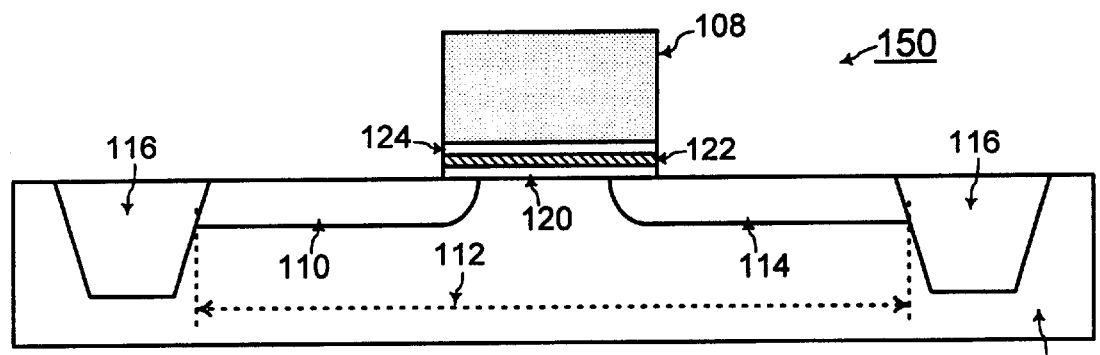
FIG. 3 shows a cross-sectional view of a flash memory cell comprising a conventional planar MOSFET (metal oxide semiconductor field effect transistor) structure with a charge storing gate dielectric stack without the floating gate electrode, according to the prior art.
Figure 42:
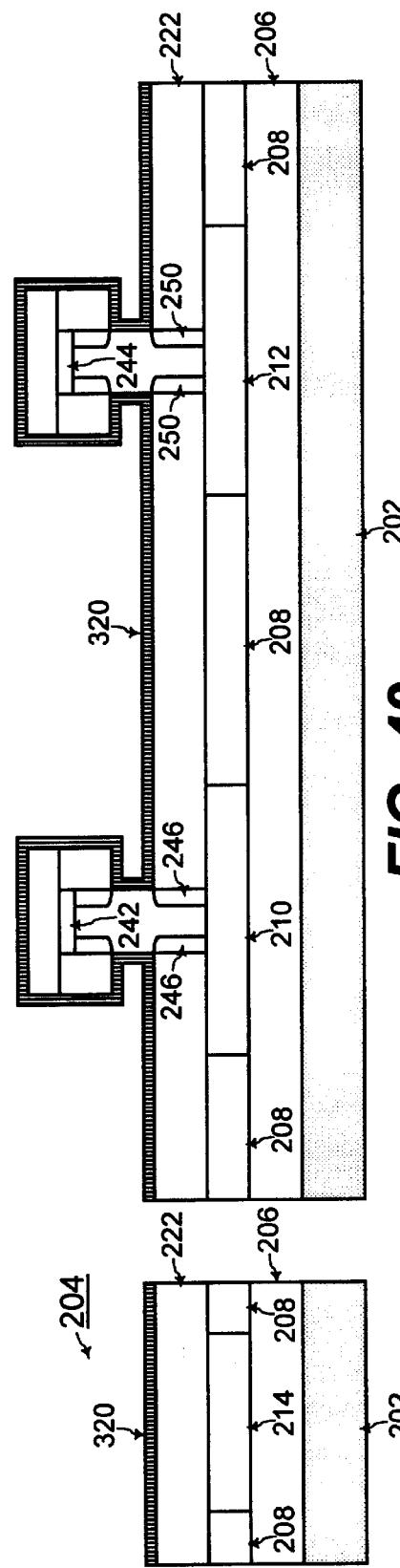

Referring to FIGS. 13 and 42, after the layer of dummy material 224 is etched away, the floating gate electrodes 264 and 266 are not formed in the alternative embodiment of FIG. 42. Instead, referring to FIG. 42, a charge storing gate dielectric stack 320 is conformally deposited on any exposed surfaces after the layer of dummy material 224 is etched away in. FIG. 13. Referring to FIGS. 3 and 42, the charge storing gate dielectric stack 320 is similar to the charge storing gate dielectric stack 120, 122, and 124 of FIG. 3 and is amenable for storing charge carriers. In an example embodiment of the present invention, the charge storing gate dielectric stack 320 is comprised of a tunnel gate dielectric 120 of silicon dioxide ($SiO_2$) having a thickness of about 100, a charge storing dielectric of silicon nitride ($Si_3N_4$) having a thickness of about 85 angstroms, and a control gate dielectric 124 of silicon dioxide ($SiO_2$) having a thickness of about 100 angstroms, similar to the charge storing gate dielectric stack 120, 122, and 124 of FIG. 3. Such a charge storing gate dielectric stack 320 is formed in an ONO (oxide-nitride-oxide) deposition process as known to one of ordinary skill in the art of integrated circuit fabrication.

The middle portion of the first semiconductor fill 236 abutting the charge storing gate dielectric stack 320 and disposed between the drain or source extensions junctions 246 and 248 forms the channel region of the first vertical MOSFET. The middle portion of the second semiconductor fill 238 abutting the charge storing gate dielectric stack 320 and disposed between the drain or source extensions junctions 250 and 252 forms the channel region of the second vertical MOSFET.

Referring to FIGS. 42 and 43, a core region mask 322 is deposited over the core region having the vertical MOSFETs for the array of flash memory cells. The core region mask 322 is comprised of photoresist material according to one embodiment of the present invention, and processes for deposition of such a core region mask 322 over the core region are known to one of ordinary skill in the art of integrated circuit fabrication. The core region mask 322 is not deposited over the peripheral region having the logic MOSFET 204, and any materials deposited on the peripheral region over the third active device area 214 of the silicon film on the buried insulating layer 206 are etched away. Referring to FIGS. 42 and 43, the charge storing gate dielectric stack 320 and the bottom layer of doped insulating material 222 on the peripheral region are etched away. Processes for etching away the charge storing gate dielectric stack 320 which is comprised of a stack of oxide, nitride, and oxide for example and the bottom layer of doped insulating material 222 which is comprised of doped silicon dioxide for example are known to one of ordinary skill in the art of integrated circuit fabrication.

Referring to FIGS. 43 and 44, the core region mask 322 is etched away from the core region having the vertical MOSFETs for the array of flash memory cells. Processes for etching away the core region mask 322 which is comprised of photoresist material for example are known to one of ordinary skill in the art of integrated circuit fabrication. Further referring to FIG. 44, a logic gate dielectric material 272 is formed on the third active device area 214 of the silicon film on the buried insulating layer 206 of the peripheral region. The logic gate dielectric material 272 is comprised of silicon dioxide ($SiO_2$) thermally grown from the third active device area 214 of the silicon film, according to one embodiment of the present invention. Processes for thermally growing silicon dioxide ($SiO_2$) from an exposed silicon surface are known to one of ordinary skill in the art of integrated circuit fabrication. The charge storing gate dielectric stack 320 prevents formation of the logic gate dielectric material 272 in the core region having the vertical MOSFETs for the array of flash memory cells.

Figure 45:
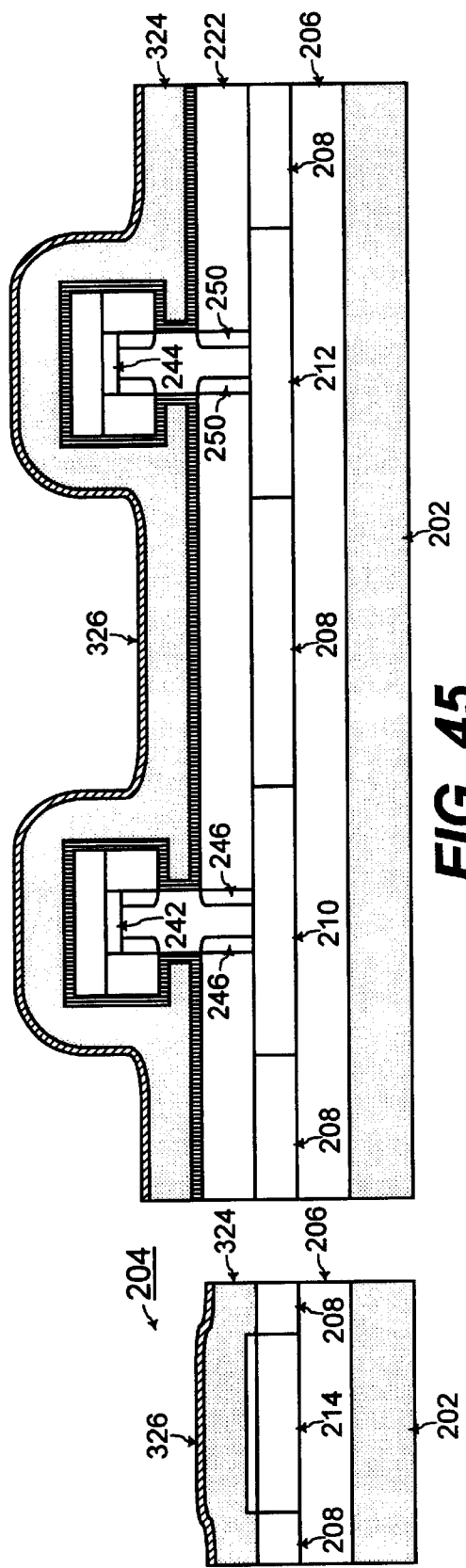

Referring to FIGS. 44 and 45, a control gate electrode material 324 is conformally deposited on any exposed surfaces including the exposed surfaces of the charge storing gate dielectric stack 320 and the logic gate dielectric material 272. The control gate electrode material 324 is comprised of polysilicon in one embodiment of the present invention, and processes for conformally depositing such a control gate electrode material 324 are known to one of ordinary skill in the art of integrated circuit fabrication.

In addition, a hardmask material 326 may also be deposited on the control gate electrode material 324 according to one embodiment of the present invention. The hardmask material 326 is comprised of at least one of silicon nitride ($Si_3N_4$), silicon oxynitride (SiON), and silicide, and processes for deposition of such hardmask material 326 are known to one of ordinary skill in the art of integrated circuit fabrication. Examples of silicide material include nickel silicide (NiSi), cobalt silicide (CoSi), palladium silicide (PdSi), platinum silicide (PtSi), or any other silicide materials as known to one of ordinary skill in the art of integrated circuit fabrication. Processes for formation of such silicide materials are known to one of ordinary skill in the art of integrated circuit fabrication.

Figure 46:
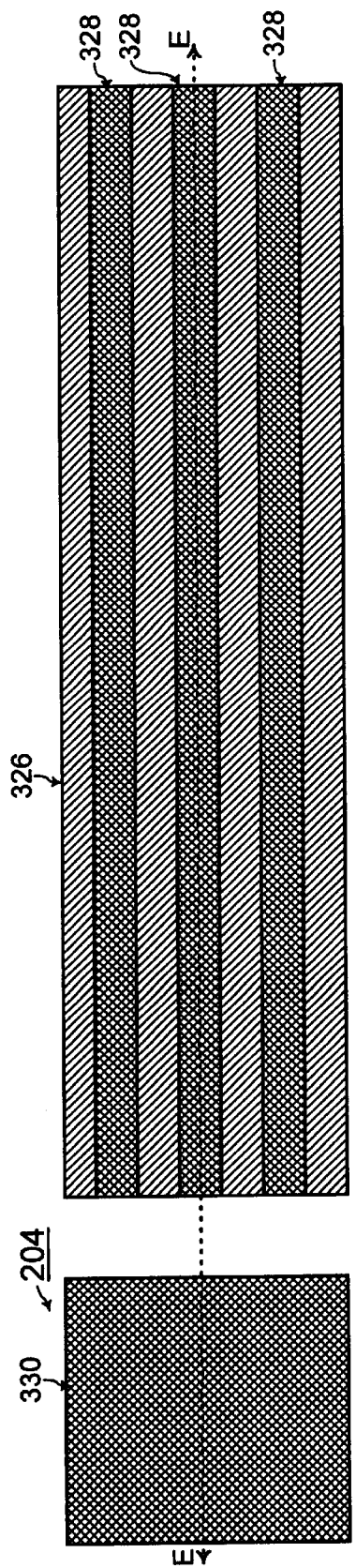
Figure 55:
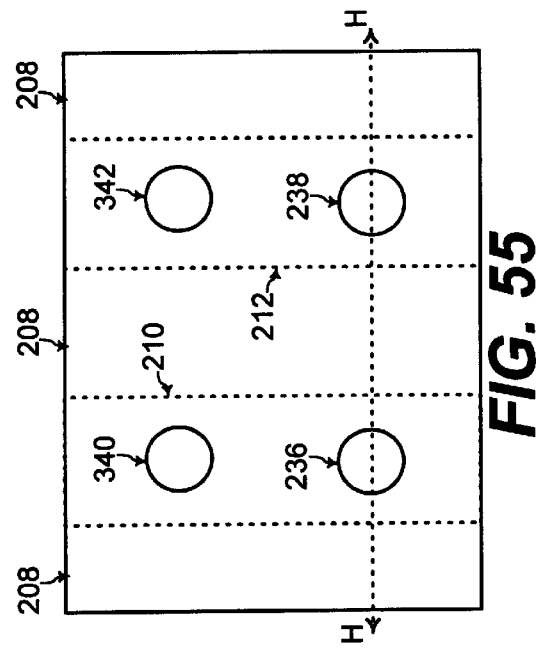
FIG. 55 shows a top view of the array of flash memory cells of the non-volatile memory device with the first drain or source contact structure of a column of the array of flash memory cells being continuous and with the semiconductor fill for a column of the array of flash memory cells being electrically isolated by having the shape of a circular peg, according to an embodiment of the present invention.

Referring to FIGS. 45 and 46, after deposition of the control gate electrode material 324, word line masking structures 328 are formed on the core region having the vertical MOSFETs for the array of flash memory cells. Referring to the top view of FIG. 46, the word line masking structures 328 are patterned as horizontal lines to form rows of vertical MOSFETs in the array of flash memory cells of the non-volatile memory device. In addition, a peripheral region mask 330 is formed on the peripheral region to cover the hardmask material 326 and the control gate electrode material 324 over the peripheral region. The word line masking structures 328 and the peripheral region mask 330 are comprised of photoresist material according to one embodiment of the present invention. The cross sectional view of FIG. 47 with the word line masking structures 328 and the peripheral region mask 330 is through dashed line E—E of the top view of FIG. 46.

Referring to FIGS. 46 and 47, and the top view of FIG. 48, the control gate electrode material 324, and the hardmask material 326 are patterned with the word line masking structures 328 to form the word lines for the rows of the flash memory cells. In addition, with the word line masking structures 328, any portion of the capping layer of insulating material 254, the top layer of doped insulating material 226, and the charge storing gate dielectric stack 320 surrounding the first and second semiconductor fills 236 and 238 are etched away for the portion of the first and second semiconductor fills 236 and 238 not under the word line masking structures 328. In this manner, the cross sectional view through dashed line E—E of the top view of FIG. 48 for the portion of the first and second semiconductor fills 236 and 238 under a word line masking structure 328 is shown in FIG. 47. On the other hand, the cross sectional view through dashed line F—F of the top view of FIG. 48 for the portion of the first and second semiconductor fills 236 and 238 not under a word line masking structure 328 is similar to FIG. 37.

During such patterning of the word lines for the rows of the flash memory cells with the word line masking structures 328, the logic gate electrode and the logic gate dielectric for the logic MOSFET 204 are not patterned. After patterning of the word lines for the rows of the flash memory cells with the word line masking structures 328, the peripheral region mask 330 and the word line masking structures 328 are etched away. Processes for etching away the peripheral region mask 330 and the word line masking structures 328 which are comprised of photoresist material for example are known to one of ordinary skill in the art of integrated circuit fabrication.

Referring to FIG. 49, a core region mask 332 is then deposited over the core region of the array of flash memory cells, and a logic gate mask 334 is patterned on the hardmask material 326 and the control gate electrode material 324. Referring to the top view of FIG. 50, the core region mask 332 is deposited to cover the whole core region of the array of flash memory cells. The logic gate mask 334 is patterned to etch away exposed regions of the hardmask material 326 and the control gate electrode material 324 to form the logic gate electrode 336 of the logic MOSFET 204. The core region mask 332 and the logic gate mask 334 are comprised of photoresist material in one embodiment of the present invention,, and processes for formation of such a core region mask 332 and such a logic gate mask 334 are known to one of ordinary skill in the art of integrated circuit fabrication. The cross sectional view of FIG. 49 is through dashed line E—E of the top view of FIG. 50.

Referring to FIGS. 50 and 51, after formation of the logic gate electrode 336 of the logic MOSFET 204, the core region mask 332 and the logic gate mask 334 are etched away. Processes for etching away the core region mask 332 and the logic gate mask 334 which are comprised of photoresist material for example are known to one of ordinary skill in the art of integrated circuit fabrication. Exposed regions of the logic gate dielectric material 272 are etched away to form the logic gate dielectric of the logic MOSFET 204 in a similar manner as described herein with reference to FIG. 25. In addition, a drain and source dopant is implanted into exposed regions of the third active device area 214 of the silicon film of the peripheral region to form the drain junction 288 and the source junction 290 of the logic MOSFET 204 in a similar manner as described herein with reference to FIG. 30.

In the embodiment of FIGS. 45, 46, 47, 48, 49, 50, and 51, the control gate electrodes of the word lines for the rows of flash memory cells within the core region are patterned separately from the logic gate electrode 326 of the logic MOSFET 204 within the peripheral region. In the embodiment of FIGS. 45, 46, 47, 48, 49, 50, and 51, parameters for patterning of the logic gate electrode 326 of the logic MOSFET 204 within the peripheral region may be controlled separately and independently from patterning of the word lines for the rows of flash memory cells within the core region. Alternatively, the control gate electrodes for the word lines for the rows of the flash memory cells within the core region may be patterned simultaneously with the logic gate electrode 326 of the logic MOSFET 204 within the peripheral region, in a similar manner as described in reference to the embodiment of FIGS. 21, 22, 23, and 24, as would be apparent to one of ordinary skill in the art of integrated circuit fabrication from the description herein.

In either embodiments, referring to FIGS. 44 and 51, a vertical field effect transistor structure is formed for each flash memory cell of the non-volatile memory device to have the charge storing gate dielectric stack 320 on each of a plurality of planes of the channel region formed within a semiconductor fill for better control of charge accumulation within the channel region such that undesired short channel effects are minimized. For example, referring to FIGS. 3, 44, and 51, the charge storing gate dielectric stack 320 of the first vertical MOSFET is equivalent to the charge storing gate dielectric stack 120, 122, and 124 of the planar flash memory cell 150 of FIG. 3. The control gate electrode 324 for the first vertical MOSFET is equivalent to the control gate electrode 108 of the planar flash memory cell 150 of FIG. 3. The charge storing gate dielectric stack 320 is disposed on a plurality of planes of the channel region formed by the middle portion of the first semiconductor fill 236 for the first vertical MOSFET.

The present invention may be practiced when the first drain or source contact structures or the second drain or source contact junctions of the semiconductor fills have various shapes. For example, referring to the top view of the first and second semiconductor fills 236 and 238 in FIG. 52, the semiconductor fills 236 and 238 are formed as lines through trench openings. In a similar manner as described in reference to FIG. 32, the top view of the core region having the array of flash memory cells is shown with the outline of the first drain or source contact structures 210 and 212 having dashed lines when the first drain or source contact structures 210 and 212 are formed as lines with each line running through a column of flash memory cells.

In that case, the first drain or source contact structure of each of the vertical MOSFETs in a column of flash memory cells is coupled together to form a bit line of the non-volatile memory device. Referring to FIG. 52, the first drain or source contact structure 210 of the first vertical MOSFET forms a first bit line of the non-volatile memory device, and the first drain or source contact structure 212 of the second vertical MOSFET forms a second bit line of the non-volatile memory device. In the case of FIG. 52, the second drain or source contact structure formed in a semiconductor fill of a column of flash memory cells is electrically isolated by implanting an inactivating dopant into exposed portions of the semiconductor fill between the word lines of the non-volatile memory device in a similar manner as described with reference to FIGS. 33, and 34.

Referring to the top view of the first and second semiconductor fills 236 and 238 in FIG. 53, the semiconductor fills 236 and 238 are formed as lines through trench openings. In a similar manner as described in reference to FIG. 31, the top view of the core region having the array of flash memory cells is shown with the outline of the first drain or source contact structures 210 and 212 having dashed lines when the first drain or source contact structures 210 and 212 are electrically isolated islands. Thus, the first drain or source contact structure of each of the vertical MOSFETs in a column of flash memory cells is electrically isolated. In that case, the semiconductor fill 236 or 238 is formed to be continuous for a column of the vertical MOSFETs in the column of flash memory cells such that the second drain or source contact junction for each of the vertical MOSFETs in the column of flash memory cells is coupled together to form a bit line of the non-volatile memory device. Referring to FIG. 53, the first semiconductor fill 236 forms a first bit line of the non-volatile memory device, and the second semiconductor fill 238 forms a second bit line of the non-volatile memory device.

Figure 54:
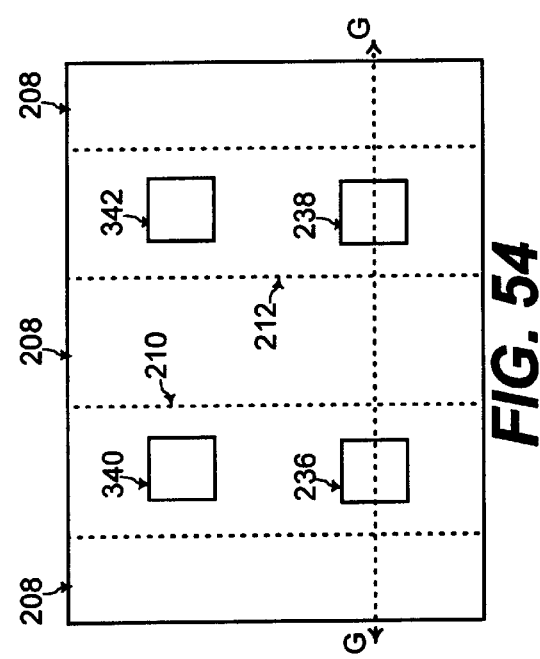
FIG. 54 shows a top view of the array of flash memory cells of the non-volatile memory device with the first drain or source contact structure of a column of the array of flash memory cells being continuous and with the semiconductor fill for a column of the array of flash memory cells being electrically isolated by having the shape of a square peg, according to an embodiment of the present invention.

Referring to FIG. 54, in a further embodiment of the present invention, the top view of the core region having the array of flash memory cells is shown with the outline of the first drain or source contact structures 210 and 212 having dashed lines when the first drain or source contact structures 210 and 212 are formed as lines with each line running through a column of flash memory cells. In that case, the first drain or source contact structure of each of the vertical MOSFETs in a column of flash memory cells is coupled together to form a bit line of the non-volatile memory device. Referring to FIG. 54, the first drain or source contact structure 210 of the first vertical MOSFET forms a first bit line of the non-volatile memory device, and the first drain or source contact structure 212 of the second vertical MOSFET forms a second bit line of the non-volatile memory device.

Further referring to a top view of FIG. 54, the semiconductor fills in a column of vertical MOSFETs are electrically isolated by forming the semiconductor fills 236, 238, 340, and 342 to be square pegs formed through square holes as the openings (such as the openings 232 and 234 of FIG. 9 for example). In that case, the cross sectional views of FIGS. 10–51 are through dashed line G—G of FIG. 54. Alternatively, referring to a top view of FIG. 55, the semiconductor fills in a column of vertical MOSFETs are electrically isolated by forming the semiconductor fills 236, 238, 340, and 342 to be circular pegs formed through circular holes as the openings (such as the openings 232 and 234 of FIG. 9 for example). In that case, the cross sectional views of FIGS. 10–51 are through dashed line H—H of FIG. 55. The present invention may be practiced with other shapes of the first drain or source contact structures and the second drain or source contact junctions of the semiconductor fills, as would be apparent to one of ordinary skill in the art of integrated circuit fabrication from the description herein.

Figure 56:
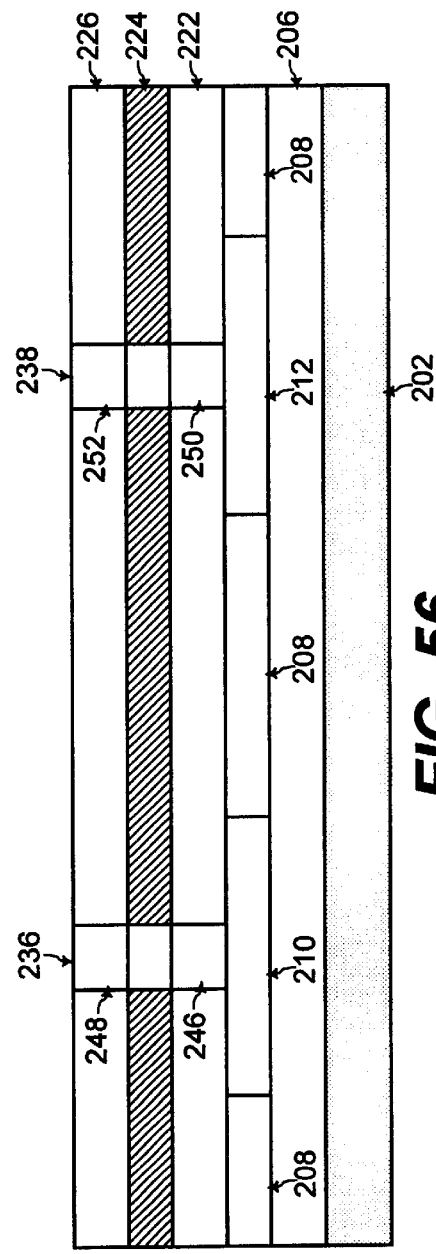
FIG. 56 shows a cross sectional view of the vertical field effect transistors for the array of flash memory cells with the drain or source extension junctions extending inward through a portion of a semiconductor fill, according to another embodiment of the present invention.

In another embodiment of the present invention, referring to FIG. 56, the dopant within the source or drain extension junctions 246, 248, 250, and 252 diffuses inwards toward the center of the semiconductor fills 236 and 238 to join together. Thus, referring to FIG. 56, the first drain or source extension junction 246 of the first vertical MOSFET is formed from the second dopant being diffused from the bottom layer of doped insulating material 222 into the whole bottom portion of the first semiconductor fill 236. In addition, the second drain or source extension junction 248 of the first vertical MOSFET is formed from the third dopant being diffused from the top layer of doped insulating material 226 into the whole top portion of the first semiconductor fill 236. The middle portion of the first semiconductor fill 236 disposed between the drain or source extensions junctions 246 and 248 forms the channel region of the first vertical MOSFET.

Similarly, further referring to FIG. 56, the first drain or source extension junction 250 of the second vertical MOSFET is formed from the second dopant being diffused from the bottom layer of doped insulating material 222 into the whole bottom portion of the second semiconductor fill 238. Similarly, the second drain or source extension junction 252 of the second vertical MOSFET is formed from the third dopant being diffused from the top layer of doped insulating material 226 into the whole top portion of the second semiconductor fill 238. The middle portion of the second semiconductor fill 238 disposed between the drain or source extensions junctions 250 and 252 forms the channel region of the second vertical MOSFET.

Figure 57:
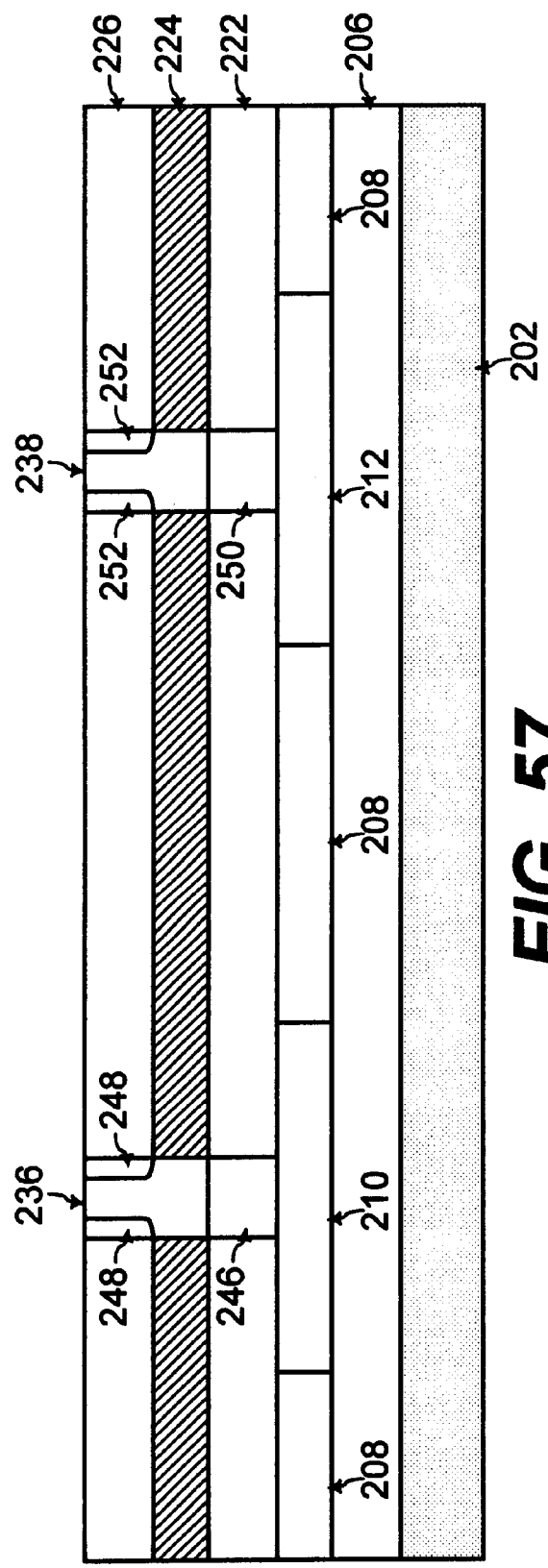
FIG. 57 shows a cross sectional view of the vertical field effect transistors for the array of flash memory cells fabricated with doping of the bottom drain or source extension junction from diffusion of dopant from the first drain or source contact structure below the semiconductor fill, according to another embodiment of the present invention.

Referring to FIG. 57, in another embodiment of the present invention, the bottom layer of insulating material 222 is not doped with the second dopant. In that case, the first drain or source extension junctions 246 and 250 for the first and second vertical MOSFETs are doped with the first dopant diffusing into the first drain or source extension junctions 246 and 250 from the first drain or source contact structures 210 and 212, respectively. The temperature used for epitaxial growth of silicon from tetrachloride ($SiCl_4$), trichlorosilane ($SiHCl_3$), dichlorosilane ($SiH_2Cl_2$), or silane ($SiH_4$) as a reactant decreases with a lower number of chlorine atoms and a higher number of hydrogen atoms for such reactants. For example, the temperature for epitaxial growth of silicon from tetrachloride ($SiCl_4$) is in a range of from about 1150° Celsius to about 1250° Celsius. The temperature for epitaxial growth of silicon from trichlorosilane ($SiHCl_3$) is in a range of from about 1100° Celsius to about 1200° Celsius. The temperature for epitaxial growth of silicon from dichlorosilane ($SiH_2Cl_2$) is in a range of from about 1050° Celsius to about 1150° Celsius. The temperature for epitaxial growth of silicon from silane ($SiH_4$) is in a range of from about 950° Celsius to about 1050° Celsius.

Referring to FIG. 57, the bottom portion of the first and second semiconductor fills 236 and 238 are epitaxially grown using one of tetrachloride ($SiCl_4$), trichlorosilane ($SiHCl_3$), or dichlorosilane ($SiH_2Cl_2$) at the temperature range of 1050° Celsius to 1250° Celsius. At such relatively high temperatures, the first dopant within the first drain or source contact structures 210 and 212 diffuses into the bottom portion of the first and second semiconductor fills 236 and 238 during the epitaxial growth of the bottom portion of the first and second semiconductor fills 236 and 238 to form the first drain or source extension junctions 246 and 250. When the bottom layer of insulating material 222 is not doped with the second dopant, the first drain or source extension junctions 246 and 250 in this manner are doped with the first dopant diffused from the first drain or source contact structures 210 and 212, respectively.

Once the bottom portion of the first and second semiconductor fills 236 and 238 reaches the layer of dummy material 224, the middle and top portions of the first and second semiconductor fills 236 and 238 are epitaxially grown using silane ($SiH_4$) at the lower temperature of about 950° Celsius to about 1050° Celsius. Referring to FIG. 57, the second drain or source extension junctions 248 and 252 for the first and second vertical MOSFETs are formed from diffusion of the third dopant from the top layer of doped insulating material 226. The vertical MOSFETs of FIG. 57 may be used to particular advantage for formation of asymmetric vertical MOSFETs for the flash memory cells since the first drain or source extension junctions 246 and 250 are doped differently from the second drain or source extension junctions 248 and 252.

The invention is limited only as defined in the following claims and equivalents thereof.

I claim:

1. A method for fabricating an array of flash memory cells for a non-volatile memory device, wherein each flash memory cell of said array is comprised of a vertical field effect transistor formed by performing the steps of:

A. forming a first drain or source contact structure comprised of a semiconductor material surrounded by shallow trench isolation structures;

B. doping said first drain or source contact structure with a first dopant;

C. depositing a bottom layer of doped insulating material on said first drain or source contact structure, said bottom layer of doped insulating material being doped with a second dopant;

D. depositing a layer of dummy material on said bottom layer of doped insulating material;

E. depositing a top layer of doped insulating material on said layer of dummy material, said top layer of doped insulating material being doped with a third dopant;

F. etching an opening through said top layer of doped insulating material, said layer of dummy material, and said bottom layer of doped insulating material;

wherein said opening is disposed over said first drain or source contact structure such that said opening has a bottom wall of said semiconductor material of said first drain or source contact structure;

G. filling said opening with a semiconductor material to form a semiconductor fill contained within said opening;

wherein said semiconductor fill has at least one side wall with a top portion of said at least one sidewall abutting said top layer of doped insulating material, and with a middle portion of said at least one sidewall abutting said layer of dummy material, and with a bottom portion of said at least one sidewall abutting said bottom layer of doped insulating material;

H. implanting a fourth dopant into a top surface of said semiconductor fill to form a second drain or source contact junction of said vertical field effect transistor;

I. etching away said layer of dummy material such that said middle portion of said at least one sidewall of said semiconductor fill is exposed;

wherein a gate electrode opening disposed between said top and bottom layers of doped insulating material is formed when said layer of dummy material is etched away;

J. forming a tunnel gate dielectric of said vertical field effect transistor on said exposed middle portion of said at least one side wall of said semiconductor fill;

wherein said middle portion of said semiconductor fill abutting said tunnel gate dielectric forms a channel region of said vertical field effect transistor;

K. filling said gate electrode opening between said top and bottom layers of doped insulating material with a floating gate electrode material, wherein said floating gate electrode material abuts said tunnel gate dielectric to form a floating gate electrode of said vertical field effect transistor;

wherein said tunnel gate dielectric and said floating gate electrode formed at said at least one side wall of said semiconductor fill are disposed on a plurality of planes of said channel region of said vertical field effect transistor;

L. performing a thermal anneal such that said second dopant diffuses from sail bottom layer of doped insulating material into said bottom portion of said semiconductor fill to form a first drain or source extension junction of said vertical field effect transistor, and such that said third dopant diffuses from said top layer of doped insulating material into said top portion of said semiconductor fill to form a second drain or source extension junction of said vertical field effect transistor;

M. depositing a control gate dielectric material on any exposed surfaces of said floating gate electrode of said vertical field effect transistor to form a control gate dielectric on said floating gate electrode;

N. depositing a control gate electrode material on said control gate dielectric material to form a control gate electrode on said control gate dielectric;

O. patterning said control gate electrode material to be continuous for a row of said array of flash memory cells such that the control gate electrode of each vertical field effect transistor of said row of flash memory cells is coupled together to form a word line of said non-volatile memory device;

P. patterning said semiconductor fill to be continuous for a column of said array of flash memory cells such that the second drain or source contact junction of each vertical field effect transistor of said column of flash memory cells is coupled together to form a bit line of said non-volatile memory device when said first drain or source contact structure of each vertical field effect transistor of said column of flash memory cells is electrically isolated; and Q. patterning said first drain or source contact structure to be continuous for a column of flash memory cells such that the first drain or source contact structure of each vertical field effect transistor of said column of flash memory cells is coupled together to form a bit line of said non-volatile memory device when the second drain or source contact junction of the semiconductor fill of each vertical field effect transistor of said column of flash memory cells is electrically isolated.

2. The method of claim 1, wherein said first, second, third, and fourth dopants are the same dopant that is an N-type dopant for fabrication of a vertical NMOSFET (N-channel Metal Oxide Semiconductor Field Effect Transistor) for each flash memory cell and that is a P-type dopant for fabrication of a vertical PMOSFET (P-channel Metal Oxide Semiconductor Field Effect Transistor) for each flash memory cell.

3. The method of claim 2, wherein said bottom and top layers of said doped insulating material are comprised of PSG (phospho-silicate glass) such that said second and third dopants are comprised of phosphorous for formation of a vertical NMOSFET (N-channel Metal Oxide Semiconductor Field Effect Transistor) for each flash memory cell.

4. The method of claim 2, wherein said bottom and top layers of said doped insulating material are comprised of BSG (boro-silicate glass) such that said second and third dopants are comprised of boron for formation of a vertical PMOSFET (P-channel Metal Oxide Semiconductor Field Effect Transistor) for each flash memory cell.

5. The method of claim 1, wherein said first dopant implanted into said first drain or source contact structure forms a drain contact structure of said vertical field effect transistor, wherein said second dopant diffused into said bottom portion of said semiconductor fill from said bottom layer of doped insulating material forms a drain extension junction of said vertical field effect transistor, wherein said third dopant diffused into said top portion of said semiconductor fill from said top layer of doped insulating material forms a source extension junction of said vertical field effect transistor, and wherein said fourth dopant implanted through said top surface of said semiconductor fill forms a source contact junction of said vertical field effect transistor.

6. The method of claim 1, further including the steps of:
depositing a capping layer of insulating material on top of said semiconductor fill and on said top layer of doped insulating material;
etching away an outside portion of said capping layer and an outside portion of said top layer of doped insulating material such that an inside portion of said capping layer remains to enclose the top of said semiconductor fill and such that an inside portion of said top layer of doped insulating material remains to surround said top portion of said semiconductor fill, before said step G; and
anisotropically etching any exposed regions of said floating gate electrode material such that said floating gate electrode material remains substantially between said inside portion of said top layer of doped insulating material and said bottom layer of doped insulating material to form said floating gate electrode.

7. The method of claim 1, wherein said first drain or source contact structure is comprised of a silicon film on a buried insulating layer formed in SOI (semiconductor on insulator) technology.

8. The method of claim 7, wherein said semiconductor material of said semiconductor fill is comprised of silicon epitaxially grown from said silicon film at said bottom wall of said opening.

9. The method of claim 8, wherein said top and bottom layers of doped insulating material are comprised of doped silicon dioxide ($SiO_2$), and wherein said layer of dummy material is comprised of silicon nitride ($Si_3N_4$) or silicon oxynitride (SiON).

10. The method of claim 8, wherein said tunnel gate dielectric is comprised of silicon dioxide ($SiO_2$) thermally grown from said exposed middle portion of said at least one sidewall of said semiconductor fill in said step J.

11. The method of claim 8, wherein said floating gate electrode material is comprised of polysilicon.

12. The method of claim 8, wherein said control gate dielectric material is comprised of nitrided oxide formed in an ONO (oxide-nitride-oxide) deposition process.

13. The method of claim 8, wherein said control gate electrode material is comprised of polysilicon.

14. The method of claim 1, further including the steps of:
forming an active device area, comprised of said semiconductor material of said first drain or source contact structure, in a peripheral region outside of a core region having said non-volatile memory device, for fabrication of a logic field effect transistor;
forming a core region mask to cover said control gate dielectric material within said core region, after said step M and before said step N;
exposing said semiconductor material of said active device area in said peripheral region by etching away any material deposited on said semiconductor material of said active device area, after said step M and before said step N;
etching away said core region mask to expose said control gate dielectric material within said core region;
forming a logic gate dielectric material over said semiconductor material of said active device area in said peripheral region, while said control gate dielectric material prevents formation of said logic gate dielectric material on said core region;
depositing said control gate electrode material on said logic gate dielectric material within said peripheral region, during said step N;
patterning said logic gate dielectric material to form a logic gate dielectric of said logic field effect transistor and patterning said control gate electrode material to form a logic gate electrode of said logic field effect transistor, during said step O;
depositing a peripheral region mask on said peripheral region to cover said logic gate electrode and said logic gate dielectric; and
etching any material surrounding said top and middle portion of said semiconductor fill to expose said top and middle portion of said semiconductor fill and said bottom layer of doped insulating material for any portion of said semiconductor fill not under said control gate electrode material forming a word line of said non-volatile memory device.

15. The method of claim 14, further including the steps of:
etching away said peripheral region mask on said peripheral region;
implanting a drain and source dopant into exposed regions of said semiconductor material of said active device area in said peripheral region to form a drain and a source of said logic field effect transistor; and
forming spacers on sidewalls of said gate dielectric and said gate electrode of said logic field effect transistor and on exposed sidewalls of said semiconductor fill.

16. The method of claim 1, further including the steps of:
forming an active device area, comprised of said semiconductor material of said first drain or source contact structure, in a peripheral region outside of a core region having said non-volatile memory device, for fabrication of a logic field effect transistor;
forming a core region mask to cover said control gate dielectric material within said core region, after said step M and before said step N;

exposing said semiconductor material of said active device area in said peripheral region by etching away any material deposited on said semiconductor material of said active device area, after said step M and before said step N;

etching away said core region mask to expose said control gate dielectric material within said core region;

forming a logic gate dielectric material over said semiconductor material of said active device area in said peripheral region, while said control gate dielectric material prevents formation of said logic gate dielectric material on said core region;

depositing said control gate electrode material on said logic gate dielectric material within said peripheral region, during said step N;

depositing a peripheral region mask on said control gate electrode material of said peripheral region before said step O such that said control gate electrode material and said logic gate dielectric material are not patterned, during said step O;

etching any material surrounding said top and middle portion of said semiconductor fill to expose said top and middle portion of said semiconductor fill and said bottom layer of doped insulating material for any portion of said semiconductor fill not under said control gate electrode material forming a word line of said non-volatile memory device while said peripheral region mask is on said control gate electrode material of said peripheral region, during said step O; and patterning said logic gate dielectric material to form a logic gate dielectric of said logic field effect transistor and patterning said control gate material to form a logic gate electrode of said logic field effect transistor, after said step O.

17. The method of claim 16, further including the steps of:

implanting a drain and source dopant into exposed regions of said semiconductor material of said active device area in said peripheral region to form a drain and a source of said logic field effect transistor; and forming spacers on sidewalls of said gate dielectric and said gate electrode of said logic field effect transistor and on exposed sidewalls of said semiconductor fill.

18. The method of claim 1, further including the steps of:

depositing a bottom intermediary layer of highly doped insulating material between said bottom layer of doped insulating material and said layer of dummy material, before said step F of etching said opening, wherein said bottom intermediary layer of highly doped insulating material is doped with said second dopant having a concentration that is greater than a concentration of said second dopant in said bottom layer of doped insulating material such that said first drain or source extension junction, formed from said second dopant diffused into said bottom portion of said semiconductor fill from said bottom layer of doped insulating material and from said bottom intermediary layer of highly doped insulating material, has a greater concentration of said second dopant near said channel region; and depositing a top intermediary layer of highly doped insulating material between said top layer of doped insulating material and said layer of dummy material, before said step F of etching said opening, wherein said top intermediary layer of highly doped insulating material is doped with said third dopant having a concentration that is greater than a concentration of said third dopant in said top layer of doped insulating material such that said second drain or source extension junction, formed from said third dopant diffused into said top portion of said semiconductor fill from said top layer of doped insulating material and from said top intermediary layer of highly doped insulating material, has a greater concentration of said third dopant near said channel region.

19. The method of claim 1, wherein said bottom layer of insulating material is not doped with said second dopant, and wherein said bottom portion of said semiconductor fill is doped with said first dopant diffusing from said first drain or source contact structure into said bottom portion of said semiconductor fill to form said first drain or source extension junction.

20. A non-volatile memory device comprised of:

are array of flash memory cells with each flash memory cell comprising a vertical field effect transistor including:

a first drain or source contact structure comprised of a semiconductor material doped with a first dopant;

a semiconductor fill comprised of a semiconductor material formed through a bottom layer of doped insulating material that is doped with a second dopant and that is deposited on said first drain or source contact structure, through a floating gate electrode material formed on said bottom layer of doped insulating material, and through a top layer of doped insulating material that is doped with a third dopant and that is formed on said floating gate electrode material;

wherein said semiconductor fill is disposed over said first drain or source contact structure;

and wherein said semiconductor fill has at least one side wall with a top portion of said at least one sidewall being surrounded by said top layer of doped insulating material, and with a middle portion of said at least one sidewall being surrounded by said floating gate electrode material, and with a bottom portion of said at least one sidewall being surrounded by said bottom layer of doped insulating material;

a tunnel gate dielectric of said vertical field effect transistor formed between said floating gate electrode material and said middle portion of said at least one sidewall of said semiconductor fill;

wherein said middle portion of said semiconductor fill abutting said tunnel gate dielectric forms a channel region of said vertical field effect transistor;

and wherein said tunnel gate dielectric and said floating gate electrode formed at said at least one side wall of said semiconductor fill are disposed on a plurality of planes of said channel region of said vertical field effect transistor;

a first drain or source extension junction formed from said second dopant diffused from said bottom layer of doped insulating material into said bottom portion of said semiconductor fill;

a second drain or source extension junction formed from said third dopant diffused from said top layer of doped insulating material into said top portion of said semiconductor fill;

a control gate dielectric material deposited on said floating gate electrode to form a control gate dielectric of said flash memory cell; and control gate electrode material deposited on said control gate dielectric material to form a control gate electrode of said flash memory cell;

a word line of said non-volatile memory device formed by patterning said control gate electrode material to be continuous for a row of said array of flash memory cells such that the control gate electrode of each vertical field effect transistor of said row of flash memory cells is coupled together to form said word line;

a bit line of said non-volatile memory device formed by patterning said semiconductor fill to be continuous for a column of said array of flash memory cells such that the second drain or source contact junction of each vertical field effect transistor of said column of flash memory cells is coupled together to form said bit line when said first drain or source contact structure of each vertical field effect transistor of said column of flash memory cells is electrically isolated; and a bit line of said non-volatile memory device formed by patterning said first drain or source contact structure to be continuous for a column of said array of flash memory cells such that the first drain or source contact structure of each vertical field effect transistor of said column of flash memory cells is coupled together to form said bit line when said second drain or source contact junction formed in the semiconductor fill for each vertical field effect transistor of said column of flash memory cells is electrically isolated.

21. The non-volatile memory device of claim 20, wherein said first, second, third, and fourth dopants are the same dopant that is an N-type dopant for fabrication of a vertical NMOSFET (N-channel Metal Oxide Semiconductor Field Effect Transistor) for each flash memory cell and that is a P-type dopant for fabrication of a vertical PMOSFET (P-channel Metal Oxide Semiconductor Field Effect Transistor) for each flash memory cell.

22. The non-volatile memory device of claim 21, wherein said bottom and top layers of said doped insulating material are comprised of PSG (phospho-silicate glass) such that said second and third dopants are comprised of phosphorous for formation of a vertical NMOSFET (N-channel Metal Oxide Semiconductor Field Effect Transistor) for each flash memory cell.

23. The non-volatile memory device of claim 21, wherein said bottom and top layers of said doped insulating material are comprised of BSG (boro-silicate glass) such that said second and third dopants are comprised of boron for formation of a vertical PMOSFET (P-channel Metal Oxide Semiconductor Field Effect Transistor) for each flash memory cell.

24. The non-volatile memory device of claim 21, wherein said first dopant implanted into said first drain or source contact structure forms a drain contact structure of said vertical field effect transistor, wherein said second dopant diffused into said bottom portion of said semiconductor fill from said bottom layer of doped insulating material forms a drain extension junction of said vertical field effect transistor, wherein said third dopant diffused into said top portion of said semiconductor fill from said top layer of doped insulating material forms a source extension junction of said vertical field effect transistor, and wherein said fourth dopant implanted through said top surface of said semiconductor fill forms a source contact junction of said vertical field effect transistor.

25. The non-volatile memory device of claim 20, wherein said first drain or source contact structure is comprised of a silicon film on a buried insulating layer formed in SOI (semiconductor on insulator) technology.

26. The non-volatile memory device of claim 25, wherein said semiconductor material of said semiconductor fill is comprised of silicon epitaxially grown from said silicon film at said bottom wall of said opening.

27. The non-volatile memory device of claim 26, wherein said top and bottom layers of doped insulating material are comprised of doped silicon dioxide ($SiO_2$), and wherein said layer of dummy material is comprised of silicon nitride ($Si_3N_4$) or silicon oxynitride (SiON).

28. The non-volatile memory device of claim 27, wherein said tunnel gate dielectric is comprised of silicon dioxide ($SiO_2$) thermally grown from said exposed middle portion of said at least one sidewall of said semiconductor fill.

29. The non-volatile memory device of claim 26, wherein said floating gate electrode material is comprised of polysilicon.

30. The non-volatile memory device of claim 26, wherein said control gate dielectric material is comprised of nitrided oxide formed in an ONO (oxide-nitride-oxide) deposition process.

31. The non-volatile memory device of claim 26, wherein said control gate electrode material is comprised of polysilicon.

32. The non-volatile memory device of claim 20, further comprising:

a bottom intermediary layer of highly doped insulating material deposited between said bottom layer of doped insulating material and said layer of dummy material, with said semiconductor fill being formed also through said bottom intermediary layer of highly doped insulating material;

wherein said bottom intermediary layer of highly doped insulating material is doped with said second dopant having a concentration that is greater than a concentration of said second dopant in said bottom layer of doped insulating material such that said first drain or source extension junction, formed from said second dopant diffused into said bottom portion of said semiconductor fill from said bottom layer of doped insulating material and from said bottom intermediary layer of highly doped insulating material, has a greater concentration of said second dopant near said channel region; and a top intermediary layer of highly doped insulating material deposited between said top layer of doped insulating material and said layer of dummy material, with said semiconductor fill being formed also through said top intermediary layer of highly doped insulating material;

wherein said top intermediary layer of highly doped insulating material is doped with said third dopant having a concentration that is greater than a concentration of said third dopant in said top layer of doped insulating material such that said second drain or source extension junction, formed from said third dopant diffused into said top portion of said semiconductor fill from said top layer of doped insulating material and from said top intermediary layer of highly doped insulating material, has a greater concentration of said third dopant near said channel region.

33. The non-volatile memory device of claim 20, wherein said bottom layer of insulating material is not doped with said second dopant, and wherein said bottom portion of said semiconductor fill is doped with said first dopant diffusing from said first drain or source contact structure into said bottom portion of said semiconductor fill to form said first drain or source extension junction.

34. A method for fabricating an array of flash memory cells for a non-volatile memory device, wherein each flash memory cell of said array is comprised of a vertical field effect transistor formed by performing the steps of:

A. forming a first drain or source contact structure comprised of a semiconductor material surrounded by shallow trench isolation structures;

B. doping said first drain or source contact structure with a first dopant;

C. depositing a bottom layer of doped insulating material on said first drain or source contact structure, said bottom layer of doped insulating material being doped with a second dopant;

D. depositing a layer of dummy material on said bottom layer of doped insulating material;

E. depositing a top layer of doped insulating material on said layer of dummy material, said top layer of doped insulating material being doped with a third dopant;

F. etching an opening through said top layer of doped insulating material, said layer of dummy material, and said bottom layer of doped insulating material;

wherein said opening is disposed over said first drain or source contact structure such that said opening has a bottom wall of said semiconductor material of said first drain or source contact structure;

G. filling said opening with a semiconductor material to form a semiconductor fill contained within said opening;

wherein said semiconductor fill has at least one sidewall with a top portion of said at least one sidewall abutting said top layer of doped insulating material, and with a middle portion of said at least one sidewall abutting said layer of dummy material, and with a bottom portion of said at least one sidewall abutting said bottom layer of doped insulating material;

H. implanting a fourth dopant into a top surface of said semiconductor fill to form a second drain or source contact junction of said vertical field effect transistor;

I. etching away said layer of dummy material such that said middle portion of said at least one sidewall of said semiconductor fill is exposed;

wherein a gate electrode opening disposed between said top and bottom layers of doped insulating material is formed when said layer of dummy material is etched away;

J. depositing a charge storing gate dielectric stack of said vertical field effect transistor on said exposed middle portion of said at least one sidewall of said semiconductor fill;

wherein said middle portion of said semiconductor fill abutting said charge storing gate dielectric stack forms a channel region of said vertical field effect transistor;

K. filling said gate electrode opening between said top and bottom layers of doped insulating material with a control gate electrode material, wherein said control gate electrode material abuts said charge storing gate dielectric stack to form a control gate electrode of said vertical field effect transistor;

wherein said charge storing gate dielectric stack and said control gate electrode formed at said at least one side wall of said semiconductor fill are disposed on a plurality of planes of said channel region of said vertical field effect transistor;

L. performing a thermal anneal such that said second dopant diffuses from said bottom layer of doped insulating material into said bottom portion of said semiconductor fill to form a first drain or source extension junction of said vertical field effect transistor, and such that said third dopant diffuses from said top layer of doped insulating material into said top portion of said semiconductor fill to form a second drain or source extension junction of said vertical field effect transistor;

M. patterning said control gate electrode material to be continuous for a row of said array of flash memory cells such that the control gate electrode of each vertical field effect transistor of said row of flash memory cells is coupled together to form a word line of said non-volatile memory device;

N. patterning said semiconductor fill to be continuous for a column of said array of flash memory cells such that the second drain or source contact junction of each vertical field effect transistor of said column of flash memory cells is coupled together to form a bit line of said non-volatile memory device when said first drain or source contact structure of each vertical field effect transistor of said column of flash memory cells is electrically isolated; and O. patterning said first drain or source contact structure to be continuous for a column of flash memory cells such that the first drain or source contact structure of each vertical field effect transistor of said column of flash memory cells is coupled together to form a bit line of said non-volatile memory device when the second drain or source contact junction of the semiconductor fill of each vertical field effect transistor of said column of flash memory cells is electrically isolated.

35. The method of claim 34, wherein said first, second, third, and fourth dopants are the same dopant that is an N-type dopant for fabrication of a vertical NMOSFET (N-channel Metal Oxide Semiconductor Field Effect Transistor) for each flash memory cell and that is a P-type dopant for fabrication of a vertical PMOSFET (P-channel Metal Oxide Semiconductor Field Effect Transistor) for each flash memory cell.

36. The method of claim 35, wherein said bottom and top layers of said doped insulating material are comprised of PSG (phospho-silicate glass) such that said second and third dopants are comprised of phosphorous for formation of a vertical NMOSFET (N-channel Metal Oxide Semiconductor Field Effect Transistor) for each flash memory cell.

37. The method of claim 35, wherein said bottom and top layers of said doped insulating material are comprised of BSG (boro-silicate glass) such that said second and third dopants are comprised of boron for formation of a vertical PMOSFET (P-channel Metal Oxide Semiconductor Field Effect Transistor) for each flash memory cell.

38. The method of claim 34, wherein said first dopant implanted into said first drain or source contact structure forms a drain contact structure of said vertical field effect transistor, wherein said second dopant diffused into said bottom portion of said semiconductor fill from said bottom layer of doped insulating material forms a drain extension junction of said vertical field effect transistor, wherein said third dopant diffused into said top portion of said semiconductor fill from said top layer of doped insulating material forms a source extension junction of said vertical field effect transistor, and wherein said fourth dopant implanted through said top surface of said semiconductor fill forms a source contact junction of said vertical field effect transistor.

39. The method of claim 34, further including the steps of:

depositing a capping layer of insulating material on top of said semiconductor fill and on said top layer of doped insulating material;

etching away an outside portion of said capping layer and an outside portion of said top layer of doped insulating material such that an inside portion of said capping layer remains to enclose the top of said semiconductor fill and such that an inside portion of said top layer of doped insulating material remains to surround said top portion of said semiconductor fill, before said step G; and depositing said control gate electrode material to surround any exposed surfaces of said remaining inside portion of said capping layer and said remaining inside portion of said top layer of doped insulating material and to fill said gate electrode opening between said inside portion of said top layer of doped insulating material and said bottom layer of doped insulating material.

40. The method of claim 34, wherein said first drain or source contact structure is comprised of a silicon film on a buried insulating layer formed in SOI (semiconductor on insulator) technology.

41. The method of claim 40, wherein said semiconductor material of said semiconductor fill is comprised of silicon epitaxially grown from said silicon film at said bottom wall of said opening.

42. The method of claim 41, wherein said top and bottom layers of doped insulating material are comprised of doped silicon dioxide ($SiO_2$), and wherein said layer of dummy material is comprised of silicon nitride ($Si_3N_4$) or silicon oxynitride (SiON).

43. The method of claim 41, wherein said charge storing gate dielectric stack is comprised of a stack of oxide, nitride, and oxide formed in an ONO (oxide-nitride-oxide) deposition process.

44. The method of claim 41, wherein said control gate electrode material is comprised of polysilicon.

45. The method of claim 34, further including the steps of:
forming an active device area, comprised of said semiconductor material of said first drain or source contact structure, in a peripheral region outside of a core region having said non-volatile memory device, for fabrication of a logic field effect transistor;

forming a core region mask to cover said charge storing gate dielectric stack within said core region, after said step J and before said step K;

exposing said semiconductor material of said active device area in said peripheral region by etching away any material deposited on said semiconductor material of said active device area, after said step J and before said step K;

etching away said core region mask to expose said charge storing gate dielectric stack within said core region;

forming a logic gate dielectric material over said semiconductor material of said active device area in said peripheral region, while said charge storing gate dielectric stack prevents formation of said logic gate dielectric material an said core region;

depositing said control gate electrode material on said logic gate dielectric material within said peripheral region, during said step K;

patterning said logic gate dielectric material to form a logic gate dielectric of said logic field effect transistor and patterning said control gate electrode material to form a logic gate electrode of said logic field effect transistor, during said step M;

depositing a peripheral region mask on said peripheral region to cover said logic gate electrode and said logic gate dielectric; and etching any material surrounding said top and middle portion of said semiconductor fill to expose said top and middle portion of said semiconductor fill and said bottom layer of doped insulating material for any portion of said semiconductor fill not under said control gate electrode material forming a word line of said non-volatile memory device.

46. The method of claim 45, further including the steps of:
etching away said peripheral region mask on said peripheral region;

implanting a drain and source dopant into exposed regions of said semiconductor material of said active device area in said peripheral region to form a drain and a source of said logic field effect transistor; and forming spacers on sidewalls of said gate dielectric and said gate electrode of said logic field effect transistor and on exposed sidewalls of said semiconductor fill.

47. The method of claim 34, further including the steps of:
forming an active device area, comprised of said semiconductor material of said first drain or source contact structure, in a peripheral region outside of a core region having said non-volatile memory device, for fabrication of a logic field effect transistor;

forming a core region mask to cover said charge storing gate dielectric stack within said core region, after said step J and before said step K;

exposing said semiconductor material of said active device area in said peripheral region by etching away any material deposited on said semiconductor material of said active device area, after said step J and before said step K;

etching away said core region mask to expose said charge storing gate dielectric stack within said core region;

forming a logic gate dielectric material over said semiconductor material of said active device area in said peripheral region, while said charge storing gate dielectric stack prevents formation of said logic gate dielectric material on said core region;

depositing said control gate electrode material on said logic gate dielectric material within said peripheral region, during said step K;

depositing a peripheral region mask on said control gate electrode material of said peripheral region before said step M such that said control gate electrode material of said peripheral region and said logic gate dielectric material are not patterned, during said step M;

etching any material surrounding said top and middle portion of said semiconductor fill to expose said top and middle portion of said semiconductor fill and said bottom layer of doped insulating material for any portion of said semiconductor fill not under said control gate electrode material forming a word line of said non-volatile memory device while said peripheral region mask is on said control gate electrode material of said peripheral region, during said step M; and patterning said logic gate dielectric material to form a logic gate dielectric of said logic field effect transistor and patterning said control gate material to form a logic gate electrode of said logic field effect transistor, after said step M.

48. The method of claim 47, further including the steps of:
implanting a drain and source dopant into exposed regions of said semiconductor material of said active device area in said peripheral region to form a drain and a source of said logic field effect transistor; and forming spacers on sidewalls of said gate dielectric and said gate electrode of said logic field effect transistor and on exposed sidewalls of said semiconductor fill.

49. The method of claim 34, further including the steps of:
depositing a bottom intermediary layer of highly doped insulating material between said bottom layer of doped insulating material and said layer of dummy material, before said step F of etching said opening,
wherein said bottom intermediary layer of highly doped insulating material is doped with said second dopant having a concentration that is greater than a concentration of said second dopant in said bottom layer of doped insulating material such that said first drain or source extension junction, formed from said second dopant diffused into said bottom portion of said semiconductor fill from said bottom layer of doped insulating material and from said bottom intermediary layer of highly doped insulating material, has a greater concentration of said second dopant near said channel region; and
depositing a top intermediary layer of highly doped insulating material between said top layer of doped insulating material and said layer of dummy material, before said step F of etching said opening,
wherein said top intermediary layer of highly doped insulating material is doped with said third dopant having a concentration that is greater than a concentration of said third dopant in said top layer of doped insulating material such that said second drain or source extension junction, formed from said third dopant diffused into said top portion of said semiconductor fill from said top layer of doped insulating material and from said top intermediary layer of highly doped insulating material, has a greater concentration of said third dopant near said channel region.

50. The method of claim 34, wherein said bottom layer of insulating material is not doped with said second dopant, and wherein said bottom portion of said semiconductor fill is doped with said first dopant diffusing from said first drain or source contact structure into said bottom portion of said semiconductor fill to form said first drain or source extension junction.

51. A non-volatile memory device comprised of:
an array of flash memory cells with each flash memory cell comprising a vertical field effect transistor including:
a first drain or source contact structure comprising a semiconductor material doped with a first dopant;
a semiconductor fill comprised of a semiconductor material formed through a bottom layer of doped insulating material that is doped with a second dopant and that is deposited on said semiconductor substrate, through a control gate electrode material formed on said bottom layer of doped insulating material, and through a top layer of doped insulating material that is doped with a third dopant and that is formed on said control gate electrode material;
wherein said semiconductor fill is disposed over said first drain or source contact structure;
and wherein said semiconductor fill has at least one sidewall with a top portion of said at least one sidewall being surrounded by said top layer of doped insulating material, and with a middle portion of said at least one sidewall being surrounded by said control gate electrode material, and with a bottom portion of said at least one sidewall being surrounded by said bottom layer of doped insulating material;
a charge storing gate dielectric stack of said vertical field effect transistor formed between said control gate electrode material and said middle portion of said at least one sidewall of said semiconductor fill;
wherein said middle portion of said semiconductor fill abutting said charge storing gate dielectric stack forms a channel region of said vertical field effect transistor;
and wherein said charge storing gate dielectric stack and said control gate electrode formed at said at least one side wall of said semiconductor fill are disposed on a plurality of planes of said channel region of said vertical field effect transistor;
a first drain or source extension junction formed from said second dopant diffused from said bottom layer of doped insulating material into said bottom portion of said semiconductor fill; and
a second drain or source extension junction formed from said third dopant diffused from said top layer of doped insulating material into said top portion of said semiconductor fill;
a word line of said non-volatile memory device formed by patterning said control gate electrode material to be continuous for a row of said array of flash memory cells such that the control gate electrode of each vertical field effect transistor of said row of flash memory cells is coupled together to form said word line;
a bit line of said non-volatile memory device formed by patterning said semiconductor fill to be continuous for a column of said array of flash memory cells such that the second drain or source contact junction of each vertical field effect transistor of said column of flash memory cells is coupled together to form said bit line when said first drain or source contact structure of each vertical field effect transistor of said column of flash memory cells is electrically isolated; and
a bit line of said non-volatile memory device formed by patterning said first drain or source contact structure to be continuous for a column of said array of flash memory cells such that the first drain or source contact structure of each vertical field effect transistor of said column of flash memory cells is coupled together to form said bit line when said second drain or source contact junction formed in the semiconductor fill for each vertical field effect transistor of said column of flash memory cells is electrically isolated.

52. The non-volatile memory device of claim 51, wherein said first, second, third, and fourth dopants are the same dopant that is an N-type dopant for fabrication of a vertical NMOSFET (N-channel Metal Oxide Semiconductor Field Effect Transistor) for each flash memory cell and that is a P-type dopant for fabrication of a vertical PMOSFET (P-channel Metal Oxide Semiconductor Field Effect Transistor) for each flash memory cell.

53. The non-volatile memory device of claim 52, wherein said bottom and top layers of said doped insulating material are comprised of PSG (phospho-silicate glass) such that said second and third dopants are comprised of phosphorous for formation of a vertical NMOSFET (N-channel Metal Oxide Semiconductor Field Effect Transistor) for each flash memory cell.

54. The non-volatile memory device of claim 52, wherein said bottom and top layers of said doped insulating material are comprised of BSG (boro-silicate glass) such that said second and third dopants are comprised of boron for formation of a vertical PMOSFET (P-channel Metal Oxide Semiconductor Field Effect Transistor) for each flash memory cell.

55. The non-volatile memory device of claim 52, wherein said first dopant implanted into said first drain or source contact structure forms a drain contact structure of said vertical field effect transistor, wherein said second dopant diffused into said bottom portion of said semiconductor fill from said bottom layer of doped insulating material forms a drain extension junction of said vertical field effect transistor, wherein said third dopant diffused into said top portion of said semiconductor fill from said top layer of doped insulating material forms a source extension junction of said vertical field effect transistor, and wherein said fourth dopant implanted through said top surface of said semiconductor fill forms a source contact junction of said vertical field effect transistor.

56. The non-volatile memory device of claim 51, wherein said first drain or source contact structure is comprised of a silicon film on a buried insulating layer formed in SOI (semiconductor on insulator) technology.

57. The non-volatile memory device of claim 56, wherein said semiconductor material of said semiconductor fill is comprised of silicon epitaxially grown from said silicon film at said bottom wall of said opening.

58. The non-volatile memory device of claim 57, wherein said top and bottom layers of doped insulating material are comprised of doped silicon dioxide ($SiO_2$), and wherein said layer of dummy material is comprised of silicon nitride ($Si_3N_4$).

59. The non-volatile memory device of claim 57, wherein said charge storing gate dielectric stack is comprised of a stack of oxide, nitride, and oxide formed in an ONO (oxide-nitride-oxide) deposition process.

60. The non-volatile memory device of claim 57, wherein said control gate electrode material is comprised of polysilicon.

61. The non-volatile memory device of claim 51, further comprising:

a bottom intermediary layer of highly doped insulating material deposited between said bottom layer of doped insulating material and said layer of dummy material, with said semiconductor fill being formed also through said bottom intermediary layer of highly doped insulating material;

wherein said bottom intermediary layer of highly doped insulating material is doped with said second dopant having a concentration that is greater than a concentration of said second dopant in said bottom layer of doped insulating material such that said first drain or source extension junction, formed from said second dopant diffused into said bottom portion of said semiconductor fill from said bottom layer of doped insulating material and from said bottom intermediary layer of highly doped insulating material, has a greater concentration of said second dopant near said channel region; and a top intermediary layer of highly doped insulating material deposited between said top layer of doped insulating material and said layer of dummy material, with said semiconductor fill being formed also through said top intermediary layer of highly doped insulating material;

wherein said top intermediary layer of highly doped insulating material is doped with said third dopant having a concentration that is greater than a concentration of said third dopant in said top layer of doped insulating material such that said second drain or source extension junction, formed from said third dopant diffused into said top portion of said semiconductor fill from said top layer of doped insulating material and from said top intermediary layer of highly doped insulating material, has a greater concentration of said third dopant near said channel region.

62. The non-volatile memory device of claim 51, wherein said bottom layer of insulating material is not doped with said second dopant, and wherein said bottom portion of said semiconductor fill is doped with said first dopant diffusing from said first drain or source contact structure into said bottom portion of said semiconductor fill to form said first drain or source extension junction.

* * * * *